(12) United States Patent
Teranishi

(10) Patent No.: US 11,112,916 B2
(45) Date of Patent: *Sep. 7, 2021

(54) DISPLAY DEVICE INCLUDING DETECTION DEVICE

(71) Applicant: Japan Display Inc., Tokyo (JP)

(72) Inventor: Yasuyuki Teranishi, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/938,489

(22) Filed: Jul. 24, 2020

(65) Prior Publication Data

US 2020/0356197 A1 Nov. 12, 2020

Related U.S. Application Data

(63) Continuation of application No. 16/184,441, filed on Nov. 8, 2018, now Pat. No. 10,754,481.

(30) Foreign Application Priority Data

Nov. 13, 2017 (JP) .............................. JP2017-218551
Jun. 7, 2018 (JP) .............................. JP2018-109813

(51) Int. Cl.
*G06F 3/041* (2006.01)
*G06F 3/044* (2006.01)
(Continued)

(52) U.S. Cl.
CPC .......... *G06F 3/044* (2013.01); *G02F 1/13338* (2013.01); *G02F 1/134336* (2013.01);
(Continued)

(58) Field of Classification Search
CPC .......... G06F 3/041; G06F 3/045; G06F 3/044; G06F 3/04166; G06F 3/04164;
(Continued)

(56) References Cited

U.S. PATENT DOCUMENTS 9,619,083 B1 * 4/2017 Kang ..................... G09G 5/006
2010/0182273 A1 7/2010 Noguchi et al.
(Continued)

FOREIGN PATENT DOCUMENTS

JP 2009-244958 A 10/2009
JP 2017-059262 A 3/2017

*Primary Examiner* — Pegeman Karimi
(74) *Attorney, Agent, or Firm* — K&L Gates LLP

(57) ABSTRACT

A display device is provided and includes display panel including display region; and detection device, wherein detection device includes: detection electrodes arrayed in sensor region of substrate and provided in region overlapping display region; drive circuit wires coupled to detection electrodes, extending in second direction, and disposed side by side in first direction; analog front ends each configured to receive at least one detection signal corresponding to capacitance change in at least one of detection electrodes caused when drive signals are supplied; multiplexer capable of changing number of wires simultaneously coupled to one of analog front ends; and control circuit configured to control multiplexer, and control circuit changes number of detection electrodes simultaneously coupled to one of analog front ends depending on distance between target object and detection electrodes in third direction intersecting first and second directions.

15 Claims, 41 Drawing Sheets

(51) Int. Cl.
*G06F 3/0488* (2013.01)
*G02F 1/1343* (2006.01)
*H01L 27/12* (2006.01)
*G09G 3/36* (2006.01)
*G02F 1/1333* (2006.01)

(52) U.S. Cl.
CPC .......... *G06F 3/0412* (2013.01); *G06F 3/0416* (2013.01); *G06F 3/0443* (2019.05); *G06F 3/04164* (2019.05); *G06F 3/04166* (2019.05); *G06F 3/04883* (2013.01); *G06F 3/041661* (2019.05); *G09G 3/3648* (2013.01); *H01L 27/124* (2013.01); *G02F 2201/121* (2013.01); *G02F 2201/123* (2013.01); *G06F 2203/04104* (2013.01); *G06F 2203/04107* (2013.01); *G06F 2203/04108* (2013.01)

(58) Field of Classification Search
CPC ............. G06F 3/041661; G06F 3/0443; G06F 3/0416; G06F 3/04883; G06F 3/3648; G01R 27/26; G06K 11/06; G08C 21/00; G02F 1/13338; G02F 1/134336; H01L 27/124

See application file for complete search history.

(56) References Cited

U.S. PATENT DOCUMENTS

| | | |
|---|---|---|
| 2012/0188200 A1 | 7/2012 | Roziere |
| 2017/0242523 A1* | 8/2017 | Hoch .................... G06F 3/0446 |
| 2017/0242524 A1* | 8/2017 | Kim ..................... G06F 3/0412 |
| 2017/0285814 A1 | 10/2017 | Katsuta et al. |
| 2018/0314356 A1 | 11/2018 | Chen et al. |
| 2019/0050075 A1* | 2/2019 | Reynolds ............ G06F 3/04166 |
| 2019/0064956 A1* | 2/2019 | Tanemura ........... G06F 3/04166 |
| 2019/0385551 A1 | 12/2019 | Kim et al. |

\* cited by examiner

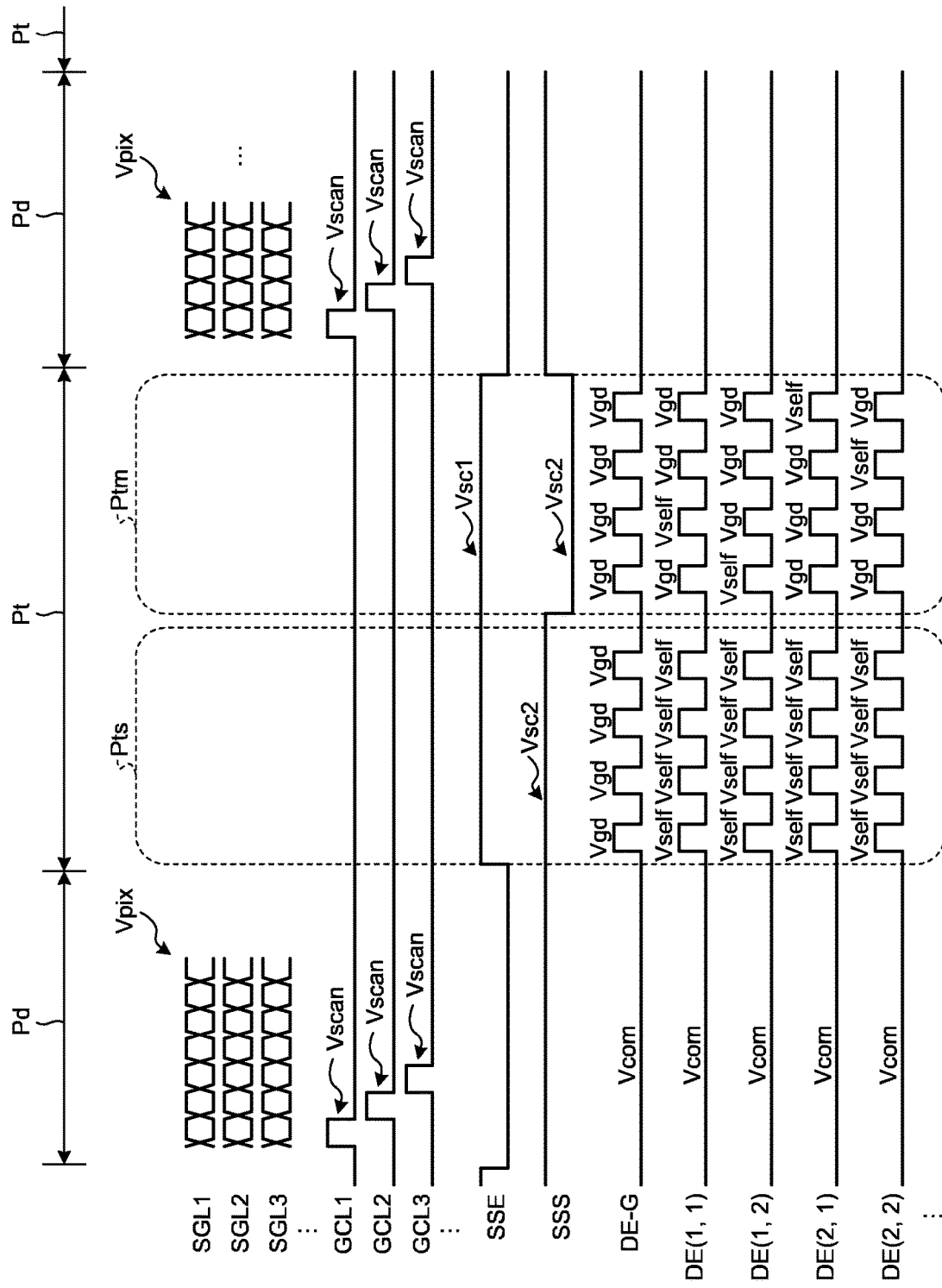

DISPLAY DEVICE INCLUDING DETECTION DEVICE

CROSS-REFERENCE TO RELATED APPLICATIONS

This application is a continuation of U.S. patent application Ser. No. 16/184,441 filed on Nov. 8, 2018, which claims priority from Japanese Application No. 2017-218551, filed on Nov. 13, 2017 and Japanese Application No. 2018-109813, filed on Jun. 7, 2018, the contents of which are incorporated by reference herein in its entirety.

BACKGROUND

1. Technical Field

The present disclosure relates to a detection device and a display device.

2. Description of the Related Art

Touch detection devices capable of detecting an external proximity object, or so-called touch panels, have recently been attracting attention. Japanese Patent Application Laid-open Publication No. 2009-244958 discloses that a touch panel is mounted on or integrated with a display device, such as a liquid crystal display device, and used as a display device with a touch detection function. Japanese Patent Application Laid-open Publication No. 2017-059262 discloses a touch detection function of detecting contact of an operator's finger with a screen and a hover detection (proximity detection) function of detecting a proximity state, a gesture, or the like of the finger not in contact with the screen.

Touch detection and hover detection are significantly different in a distance between detection electrodes and a detected target object serving as a detection target, such as a finger, and in the sensitivity required for the detection. If electrodes and a drive configuration for touch detection are used for hover detection without any change, desirable hover detection may be difficult.

SUMMARY

According to an aspect, a detection device includes: a substrate; a plurality of detection electrodes arrayed in a row-column configuration in a first direction and a second direction intersecting the first direction in a sensor region of the substrate; a drive circuit configured to supply a plurality of drive signals to the detection electrodes; a plurality of wires electrically coupled to the respective detection electrodes; a plurality of analog front ends each configured to receive, from at least one of the detection electrodes, at least one detection signal corresponding to a capacitance change in the at least one of the detection electrodes caused when the drive signals are supplied; and a multiplexer coupled to one of the detection electrodes via one of the wires and capable of changing the number of the wires simultaneously electrically coupled to one of the analog front ends. The wires extend in the second direction, and the wires are disposed side by side in the first direction.

According to another aspect, a display device includes: a detection device; and a display panel including a display region. The detection electrodes are provided in a region overlapping the display region. The detection device includes: a substrate; a plurality of detection electrodes arrayed in a row-column configuration in a first direction and a second direction intersecting the first direction in a sensor region of the substrate; a drive circuit configured to supply a plurality of drive signals to the detection electrodes; a plurality of wires electrically coupled to the respective detection electrodes; a plurality of analog front ends each configured to receive, from at least one of the detection electrodes, at least one detection signal corresponding to a capacitance change in the at least one of the detection electrodes caused when the drive signals are supplied; and a multiplexer coupled to one of the detection electrodes via one of the wires and capable of changing the number of the wires simultaneously electrically coupled to one of the analog front ends. The wires extend in the second direction, and the wires are disposed side by side in the first direction.

BRIEF DESCRIPTION OF THE DRAWINGS

FIG. 17 is a timing waveform chart for an exemplary operation performed by the display device according to the first embodiment;

DETAILED DESCRIPTION

Figure 1:
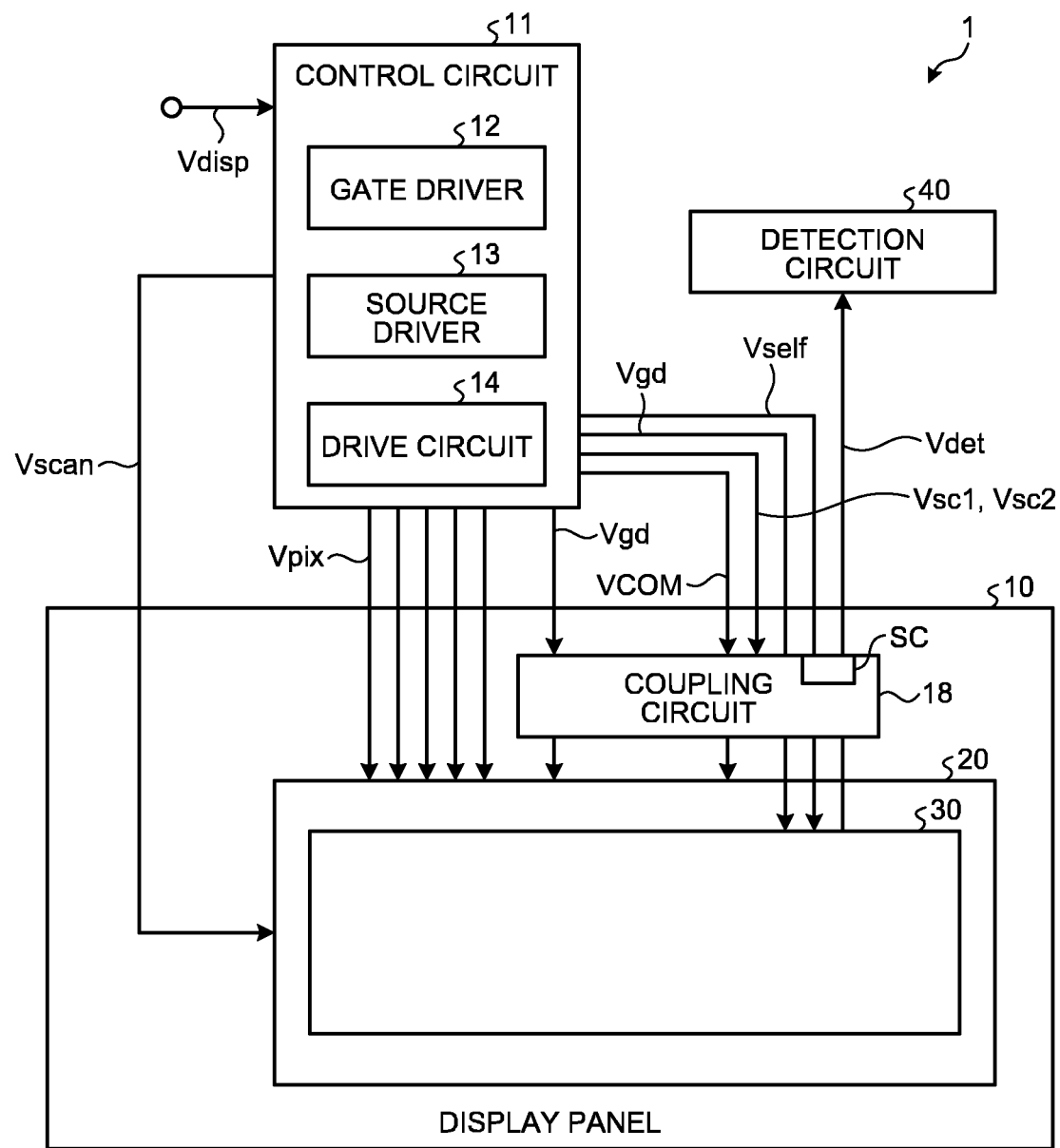
FIG. 1 is a block diagram illustrating an exemplary configuration of a detection device and a display device according to a first embodiment of the present disclosure.

Exemplary aspects (embodiments) to embody the present disclosure are described below in greater detail with reference to the accompanying drawings. The contents described in the embodiments are not intended to limit the present disclosure. Components described below include components easily conceivable by those skilled in the art and components substantially identical therewith. Furthermore, the components described below may be appropriately combined. What is disclosed herein is given by way of example only, and appropriate changes made without departing from the spirit of the present disclosure and easily conceivable by those skilled in the art naturally fall within the scope of the disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present disclosure and the figures, components similar to those previously described with reference to previous figures are denoted by like reference numerals, and detailed explanation thereof may be appropriately omitted. In this disclosure, when an element A is described as being "on" another element B, the element A can be directly on the other element B, or there can be one or more elements between the element A and the other element B.

First Embodiment

Figure 2:
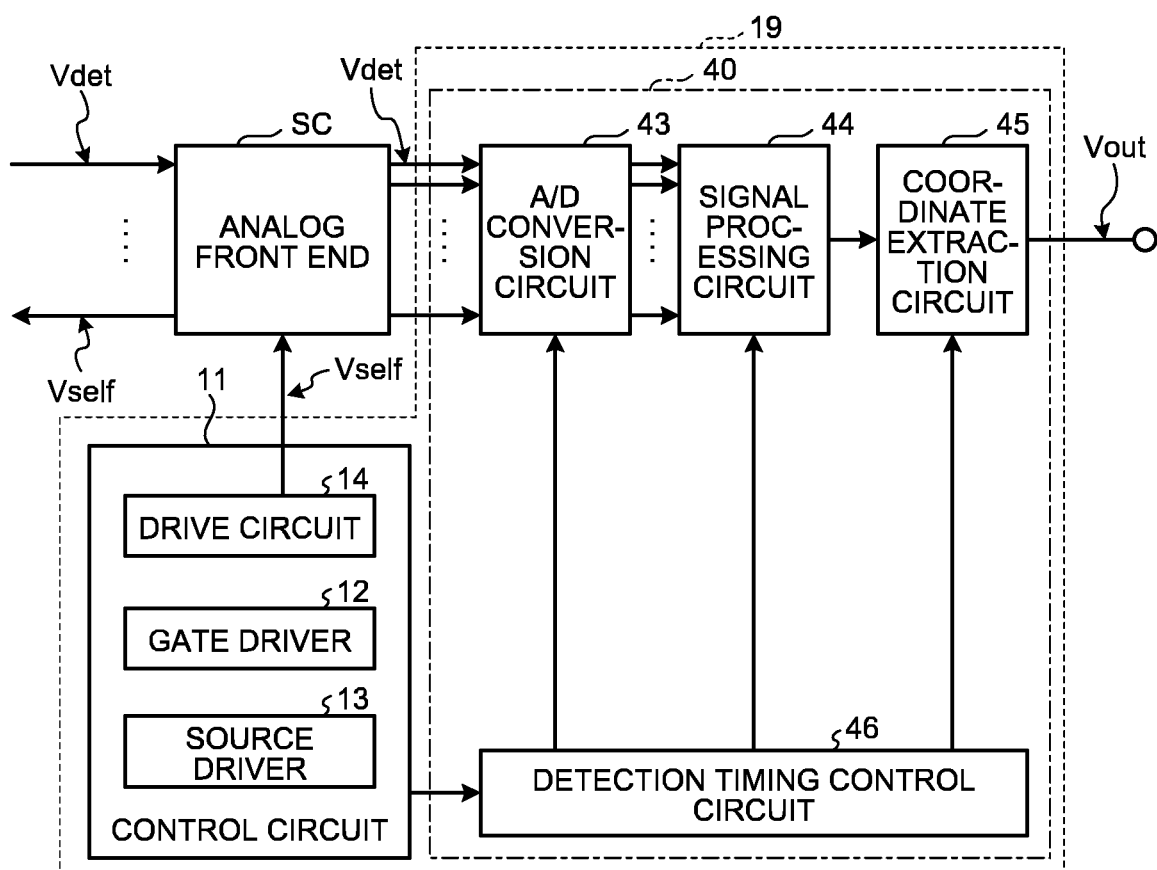
FIG. 2 is a block diagram illustrating an exemplary configuration of a detection circuit.

FIG. 1 is a block diagram illustrating an exemplary configuration of a detection device and a display device according to a first embodiment of the present disclosure. FIG. 2 is a block diagram illustrating an exemplary configuration of a detection circuit. As illustrated in FIG. 1, a display device 1 includes a display panel 10, a control circuit 11, and a detection circuit 40. The display panel 10 includes a display region 20 and a sensor region 30. The display region 20 displays an image. The sensor region 30 is included in the detection device that detects touch input. The block diagrams in FIGS. 1 and 2 conceptually explain the configuration, and the detection device and the display device may have another configuration.

The display panel 10 is a display device in which the display region 20 and the sensor region 30 are integrated with each other. Specifically, in the display panel 10, part of elements, such as electrodes and substrates, of the display region 20 are also used as electrodes and substrates of the sensor region 30.

The display region 20 includes a liquid crystal display element serving as a display element. The display region 20 includes a plurality of pixels each having the display element and has a display surface facing the pixels. The display region 20 receives video signals to display an image composed of the pixels on the display surface. The display region 20 may be an organic electroluminescence (EL) display panel, for example.

The display panel 10 further includes a coupling circuit 18. The coupling circuit 18 is provided between the sensor region 30 and the detection circuit 40. The coupling circuit 18 switches between coupling and decoupling of detection electrodes DE to be a target of detection drive to and from the detection circuit 40, in accordance with control signals Vsc1 and Vsc2 supplied from the control circuit 11. The coupling circuit 18 includes analog front ends (AFE) SC, which will be described later.

The control circuit 11 includes a gate driver 12, a source driver 13, and a drive circuit 14. The control circuit 11 supplies control signals to the gate driver 12, the source driver 13, the drive circuit 14, the coupling circuit 18, and the detection circuit 40, in accordance with video signals Vdisp supplied from the outside, thereby controlling a display operation and a detection operation.

The gate driver 12 supplies scanning signals Vscan to one horizontal line to be a target of display drive in the display panel 10, in accordance with the control signals supplied from the control circuit 11. Accordingly, one horizontal line to be a target of display drive is sequentially or simultaneously selected.

The source driver 13 is a circuit that supplies pixel signals Vpix to respective sub-pixels SPix (refer to FIG. 7) in the display region 20. Part of the functions of the source driver 13 may be provided to the display panel 10. In this case, the control circuit 11 may generate the pixel signals Vpix and supply them to the source driver 13.

The drive circuit 14 supplies drive signals Vcomdc for display to the detection electrodes DE of the display panel 10. The drive circuit 14 supplies drive signals Vself to the detection electrodes DE serving as common electrodes of the display panel 10 via the coupling circuit 18.

The control circuit 11 according to the present embodiment time-divisionally performs a display mode for performing display in the display region 20 and a detection mode for detecting a target object in the sensor region 30. The control circuit 11 has two detection modes, that is, a touch detection mode (first detection mode) and a hover detection mode (second detection mode). Alternatively, the first detection mode and the second detection mode are self-capacitance detection modes. In the present disclosure, touch detection is referred to as detection of the position of the target object in a state where the target object is in contact with a detection surface or the display surface or proximate enough to the detection surface or the display surface so as to be equated with being in contact therewith (hereinafter, referred to as a "contact state"). Hover detection is referred to as detection of the position and a movement of the target object in a state where the target object is not in contact with the detection surface or the display surface or not proximate enough to the detection surface or the display surface so as be equated with being in contact therewith (hereinafter, referred to as a "non-contact state"). A "non-present state" denotes a state where no object to be detected is present at a position facing the detection surface or the display surface or a state where a target object is too far away from the display surface to be detected in hover detection. A "present state" denotes a state where a target object is present at a position facing the detection surface or the display surface or a state where a target object is away from the display surface but proximate enough to be detected in hover detection.

A touch sensor in the sensor region 30 has a function of detecting the position of a target object in contact with or in proximity to the detection surface or the display surface of the display panel 10 based on the basic principle for detection of a target object by a self-capacitance method. If the display panel 10 detects contact or proximity of a target object, the display panel 10 outputs detection signals Vdet to the detection circuit 40.

The coupling circuit 18 switches between coupling and decoupling of the detection circuit 40 to and from the detection electrodes DE. In touch detection, each detection electrode DE is individually coupled to the detection circuit 40. In hover detection, a plurality of detection electrodes DE are combined as a detection electrode block DEB (refer to FIG. 6) and collectively coupled to the detection circuit 40. The detection signals Vdet output from the detection electrodes DE are supplied to the detection circuit 40 via the coupling circuit 18.

In self-capacitance touch detection, the detection circuit 40 uses the display surface of the display panel 10 as the detection surface to detect a target object approaching the detection surface, in accordance with the drive signals Vself supplied from the drive circuit 14 and the detection signals Vdet output from the display panel 10. If a touch is detected, the detection circuit 40 calculates the coordinates at which the touch input is performed, for example.

As illustrated in FIG. 2, the detection circuit 40 includes an analog/digital (A/D) conversion circuit 43, a signal processing circuit 44, a coordinate extraction circuit 45, and a detection timing control circuit 46. The detection timing control circuit 46 controls the A/D conversion circuit 43, the signal processing circuit 44, and the coordinate extraction circuit 45 to operate in synchronization with one another, in accordance with the control signals supplied from the drive circuit 14.

The drive circuit 14 supplies the drive signals Vself to the detection electrodes DE, which will be described later, via the analog front ends SC of the coupling circuit 18 (refer to FIG. 1). The detection circuit 40 is supplied with the detection signals Vdet from the detection electrodes DE, which will be described later, via the analog front ends SC. The analog front ends SC reduce noise in the supplied detection signals Vdet and perform signal conditioning such as amplification of signal components. The A/D conversion circuit 43 samples analog signals output from the analog front ends SC at a timing synchronized with the drive signals Vself, thereby converting the analog signals into digital signals.

The signal processing circuit 44 is a logic circuit that determines whether a touch is made on the display panel 10 in accordance with the output signals from the A/D conversion circuit 43. The signal processing circuit 44 performs processing of extracting a signal (absolute value $|\Delta V|$) of a difference between the detection signals caused by a finger. The signal processing circuit 44 compares the absolute value $|\Delta V|$ with a predetermined threshold voltage. If the absolute value $|\Delta V|$ is lower than the threshold voltage, the signal processing circuit 44 determines that a target object is in the non-present state. By contrast, if the absolute value $|\Delta V|$ is equal to or higher than the threshold voltage, the signal processing circuit 44 determines that a target object is in the present state. The detection circuit 40 thus can perform touch detection or hover detection.

The coordinate extraction circuit 45 is a logic circuit that calculates, if the signal processing circuit 44 detects a target object, the coordinates of the target object. The coordinate extraction circuit 45 outputs the coordinates of the target object as output signals Vout. The coordinate extraction circuit 45 may output the output signals Vout to the control circuit 11. The control circuit 11 can perform a predetermined display operation or detection operation in accordance with the output signals Vout.

The A/D conversion circuit 43, the signal processing circuit 44, the coordinate extraction circuit 45, and the detection timing control circuit 46 of the detection circuit 40 are provided to the display device 1. The configuration is not limited thereto, and all or part of the functions of the detection circuit 40 may be provided to an external processor, for example. The coordinate extraction circuit 45, for example, may be provided to an external processor different from the display device 1. In this case, the detection circuit 40 may output the signals processed by the signal processing circuit 44 as the output signals Vout.

Figure 3:
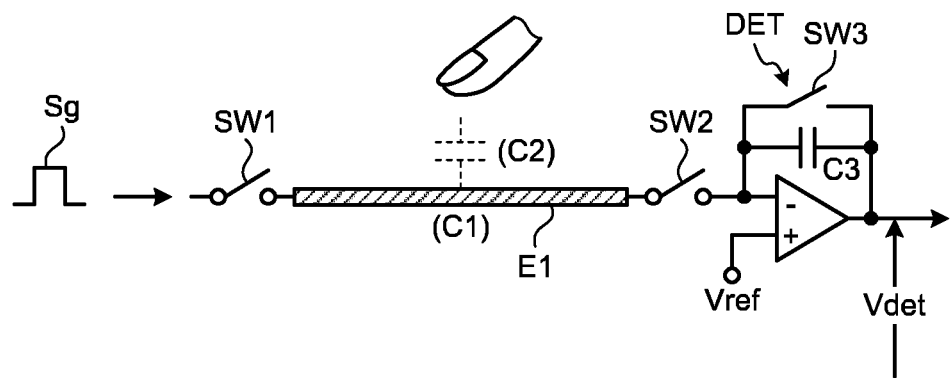
FIG. 3 is a diagram illustrating a present state for explaining the basic principle of self-capacitance detection.
Figure 4:
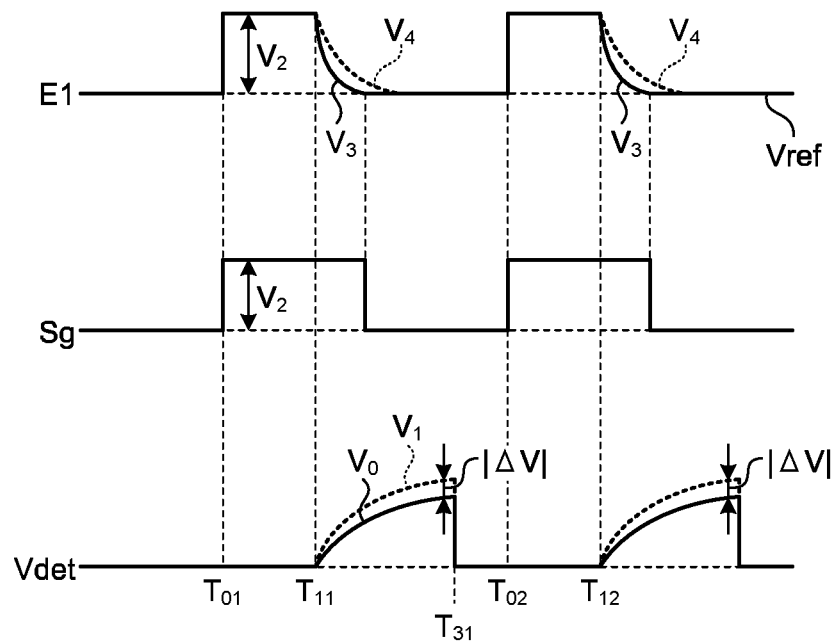
FIG. 4 is a diagram illustrating an example of waveforms of a drive signal and a detection signal in self-capacitance detection.

The display panel 10 performs touch control based on the basic principle of capacitance touch detection. The following describes the basic principle for detection of a target object by the self-capacitance method performed by the display panel 10 according to the present embodiment with reference to FIGS. 3 and 4. FIG. 3 is a diagram illustrating the present state for explaining the basic principle of self-capacitance detection. FIG. 4 is a diagram illustrating an example of waveforms of a drive signal and a detection signal in self-capacitance detection. FIG. 3 also illustrates a detection circuit. While the following describes a case where a target object is a finger, it is not limited to a finger and may be an object including a conductor, such as a stylus.

In the non-present state, an AC rectangular wave Sg at a predetermined frequency (e.g., a frequency of several kilohertz to several hundred kilohertz) is applied to a detection electrode E1. The detection electrode E1 has capacitance C1, and an electric current corresponding to the capacitance C1 flows therethrough. A voltage detector DET converts fluctuations in electric current depending on the AC rectangular wave Sg into fluctuations in voltage (waveform V0 indicated by the solid line (refer to FIG. 4)).

As illustrated in FIG. 3, in the present state of a target object, capacitance C2 formed between the finger and the detection electrode E1 is added to the capacitance C1 of the detection electrode E1. When the AC rectangular wave Sg is applied to the detection electrode E1, an electric current corresponding to the capacitance C1 and the capacitance C2 flows therethrough. As illustrated in FIG. 4, the voltage detector DET converts fluctuations in electric current depending on the AC rectangular wave Sg into fluctuations in voltage (waveform V1 indicated by the dotted line). The presence of the target object is measured based on an absolute value $|\Delta V|$ of a difference between the waveform V0 and the waveform V1.

Specifically, as illustrated in FIG. 4, the voltage level of the AC rectangular wave Sg rises to a voltage V2 at time T01. At this time, a switch SW1 is turned on, and a switch SW2 is turned off. As a result, the electric potential of the detection electrode E1 also rises to the voltage V2. Subsequently, the switch SW1 is turned off before time T11. While the detection electrode E1 is in a floating state at this time, the electric potential of the detection electrode E1 is maintained at V2 due to the capacitance C1 (or C1+C2, refer to FIG. 3) of the detection electrode E1. The voltage detector DET performs a reset operation before time T11.

Subsequently, when the switch SW2 is turned on at time T11, the electric charge accumulated in the capacitance C1 (or C1+C2) of the detection electrode E1 moves to capacitance C3 in the voltage detector DET. As a result, output from the voltage detector DET increases (refer to the detection signal Vdet in FIG. 4). In the non-present state, the output (detection signal Vdet) from the voltage detector DET corresponds to the waveform V0 indicated by the solid line, and Vdet=C1×V2/C3 is satisfied. In the present state, the output corresponds to the waveform V1 indicated by the dotted line, and Vdet=(C1+C2)×V2/C3 is satisfied.

Subsequently, at time T31, the switch SW2 is turned off, and the switch SW1 and a switch SW3 are turned on. As a result, the electric potential of the detection electrode E1 is reduced to a low level equal to the electric potential of the AC rectangular wave Sg, and the voltage detector DET is reset. The operation described above is repeated at a predetermined frequency (e.g., a frequency of several kilohertz to several hundred kilohertz). The detection circuit 40 thus can detect the present state of a target object based on the basic principle for detection of a target object by the self-capacitance method.

Figure 5:
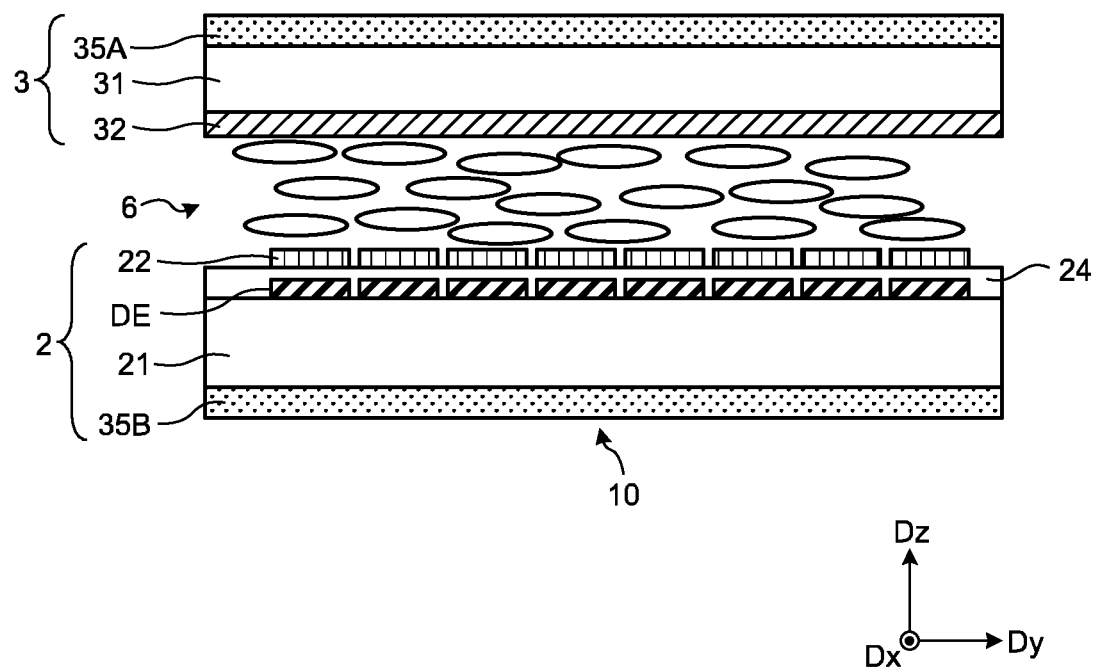
FIG. 5 is a sectional view illustrating a schematic sectional structure of the detection device and the display device according to the first embodiment.

The following describes an exemplary configuration of the display device 1 according to the present embodiment in greater detail. FIG. 5 is a sectional view illustrating a schematic sectional structure of the detection device and the display device according to the first embodiment. As illustrated in FIG. 5, the display panel 10 includes an array substrate 2, a counter substrate 3, and a liquid crystal layer 6 serving as a display functional layer. The counter substrate 3 faces the array substrate 2 in a direction perpendicular to the surface of the array substrate 2. The liquid crystal layer 6 is interposed between the array substrate 2 and the counter substrate 3.

The array substrate 2 includes a first substrate 21, pixel electrodes 22, the detection electrodes DE, an insulating layer 24, and a polarizing plate 35B. The first substrate 21 is provided with circuits, such as a gate scanner included in the gate driver 12, switching elements, such as thin-film transistors (TFT), and various kinds of wiring (not illustrated in FIG. 7), such as gate lines GCL and signal lines SGL.

The detection electrodes DE are provided on the upper side of the first substrate 21. The pixel electrodes 22 are provided on the upper side of the detection electrodes DE with the insulating layer 24 interposed therebetween. The pixel electrodes 22 are disposed in a matrix (row-column configuration) in planar view. The pixel electrodes 22 correspond to the respective sub-pixels SPix constituting each pixel Pix (refer to FIG. 7) of the display panel 10. The pixel electrodes 22 are supplied with the pixel signals Vpix for performing a display operation. In the display operation, the detection electrodes DE are supplied with the drive signals Vcomdc for display to serve as common electrodes for a plurality of pixel electrodes 22. The polarizing plate 35B is provided on the lower side of the first substrate 21.

The pixel electrodes 22 and the detection electrodes DE according to the present embodiment are made of a translucent conductive material, such as indium tin oxide (ITO).

In the present specification, the "upper side" indicates a direction from the first substrate 21 toward a second substrate 31 in the direction perpendicular to the first substrate 21, and the "lower side" indicates a direction from the second substrate 31 toward the first substrate 21. The pixel electrodes 22 are not necessarily arrayed in a first direction and a second direction orthogonal to the first direction, that is, in a matrix (row-column configuration). Alternatively, a configuration may be employed in which the pixel electrodes 22 adjacent to each other are shifted in the first direction or the second direction. Still alternatively, a configuration may be employed in which the pixel electrodes 22 adjacent to each other have different sizes, and two or three pixel electrodes 22 are disposed on one side of one pixel electrode 22 included in a pixel column arrayed in the first direction.

The counter substrate 3 includes the second substrate 31, a color filter 32, and a polarizing plate 35A. The color filer 32 is provided on one surface of the second substrate 31. The polarizing plate 35A is provided on the other surface of the second substrate 31. The color filer 32 faces the liquid crystal layer 6 in the direction perpendicular to the first substrate 21. The color filter 32 may be disposed on the first substrate 21. The first substrate 21 and the second substrate 31 according to the present embodiment are glass substrates or resin substrates, for example.

The first substrate 21 and the second substrate 31 face each other with a predetermined space interposed therebetween. The liquid crystal layer 6 is interposed between the first substrate 21 and the second substrate 31. The liquid crystal layer 6 changes the orientation states of liquid crystal molecules depending on the state of an electric field formed in the layer, thereby modulating transmitted light. The electric-field mode is a horizontal electric field mode, such as the in-plane switching (IPS) mode including the fringe field switching (FFS) mode. Orientation films (not illustrated in FIG. 5) are provided on the outermost surface of the array substrate 2 and the outermost surface of the counter substrate 3 facing the liquid crystal layer 6 illustrated in FIG. 5. The orientation films determine the initial orientation states of the liquid crystal molecules.

An illuminator (backlight), which is not illustrated, is provided on the lower side of the first substrate 21. The illuminator includes a light source, such as a light emitting diode (LED), and outputs light from the light source to the first substrate 21. The light from the illuminator passes through the array substrate 2 and is modulated depending on the orientation states of the liquid crystal molecules at a corresponding position. The state of light transmission to the display surface varies depending on positions. With this mechanism, an image is displayed on the display surface.

Figure 6:
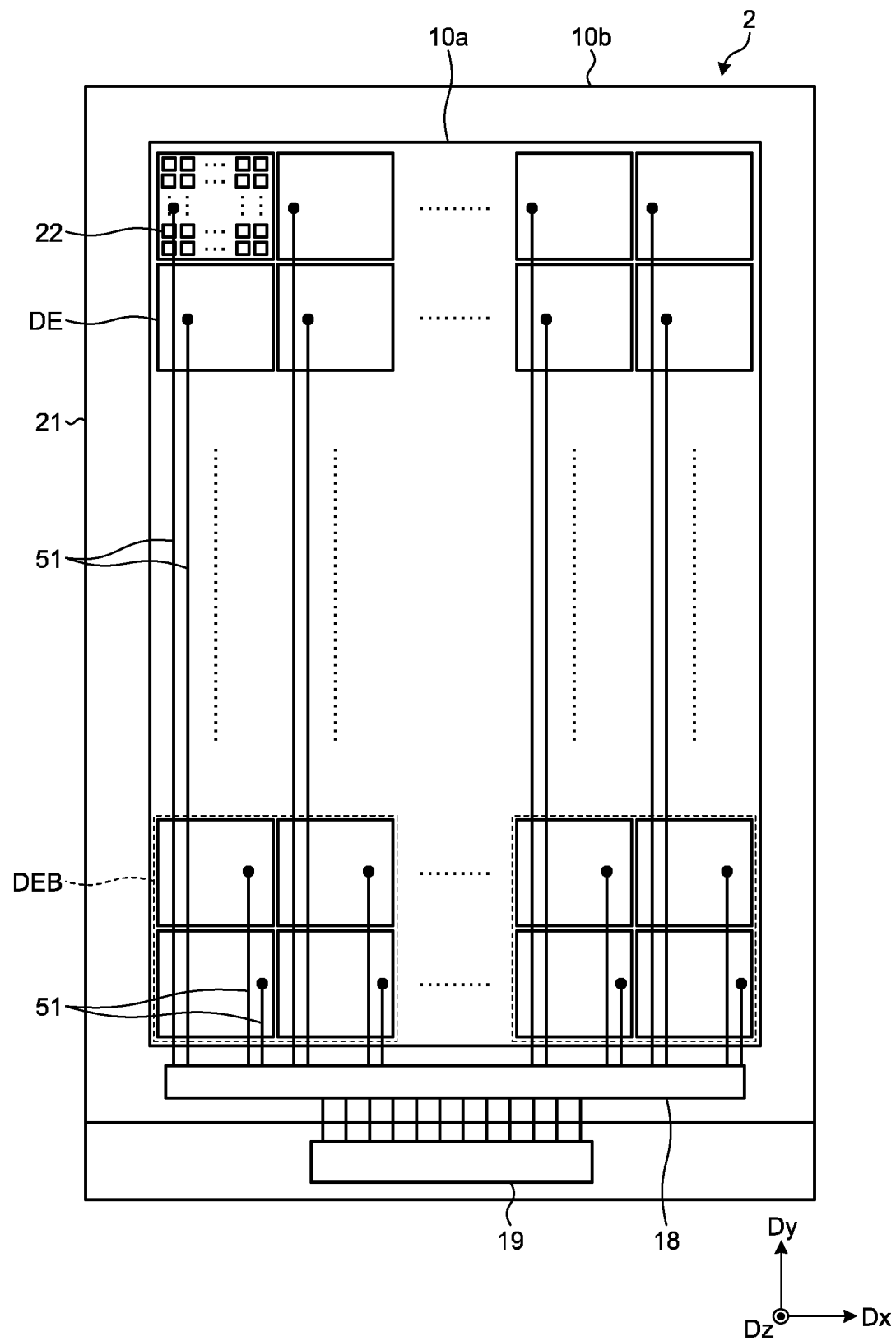
FIG. 6 is a plan view schematically illustrating an array substrate.

FIG. 6 is a plan view schematically illustrating the array substrate. As illustrated in FIG. 6, the display device 1 has a peripheral region 10b outside a display region 10a. In the present disclosure, the display region 10a is a region for displaying an image and overlaps a plurality of pixels Pix (sub-pixels SPix). The peripheral region 10b is a region inside the outer periphery of the first substrate 21, and outside the display region 10a. The peripheral region 10b may have a frame shape surrounding the display region 10a. In this case, the peripheral region 10b may also be referred to as a frame region.

A first direction Dx according to the present embodiment extends along the short side of the display region 10a. A second direction Dy is orthogonal to the first direction Dx. The directions Dx and Dy are not limited thereto, and the second direction Dy may intersect the first direction Dx at an angle other than 90 degrees. The plane defined by the first direction Dx and the second direction Dy is parallel to the surface of the first substrate 21. A third direction Dz intersecting the first direction Dx and the second direction Dy is a thickness direction of the first substrate 21.

As illustrated in FIG. 6, the detection electrodes DE are arrayed in a matrix (row-column configuration) in the first direction Dx and the second direction Dy in the display region 10a. The detection electrode DE has a rectangular or a square shape in planar view. The detection electrodes DE are made of a translucent conductive material, such as ITO.

A plurality of pixel electrodes 22 are disposed in a matrix (row-column configuration) at a position corresponding to one detection electrode DE. The area of the pixel electrode 22 is smaller than that of the detection electrode DE. While FIG. 6 illustrates part of the detection electrodes DE and the pixel electrodes 22, they are disposed over the whole display region 10a. As described above, the detection electrodes DE are provided in a region overlapping the display region 10a. In the present disclosure, the row direction is also referred to as the first direction Dx, and the column direction is also referred to as the second direction Dy.

The pixel electrodes 22 are not necessarily arrayed in the first direction Dx and the second direction Dy intersecting the first direction Dx, that is, in a matrix (row-column configuration). Alternatively, a configuration may be employed in which the pixel electrodes 22 adjacent to each other are shifted in the first direction Dx or the second direction Dy. Still alternatively, a configuration may be employed in which the pixel electrodes 22 adjacent to each other have different sizes, and two or three pixel electrodes 22 are disposed on one side of one pixel electrode 22 included in a pixel column arrayed in the first direction Dx.

The coupling circuit 18 and an integrated circuit 19 are provided on a short side of the peripheral region 10b. A flexible substrate 71, which is not illustrated, is coupled to the short side of the peripheral region 10b. The flexible substrate 71 is provided with an integrated circuit of the detection circuit. As illustrated in FIG. 2, the integrated circuit 19 includes the control circuit 11 and the detection circuit 40. Part of the functions of the detection circuit 40 may be included in another detection integrated circuit or provided as functions of an external micro-processing unit (MPU). The configuration of the integrated circuit 19 is not limited thereto, and the integrated circuit 19 may be provided to a control substrate outside the module, for example.

The detection electrodes DE are electrically coupled to the integrated circuit 19 via wires 51 and the coupling circuit 18. The wires 51 are electrically coupled to the respective detection electrodes DE disposed in the display region 10a and extend to the peripheral region 10b. The wires 51 extend in the second direction Dy and are disposed side by side in the first direction Dx. The drive circuit 14 (refer to FIG. 1) included in the integrated circuit 19, for example, is coupled to the detection electrodes DE via the coupling circuit 18 disposed in the peripheral region 10b and the wires 51.

Figure 7:
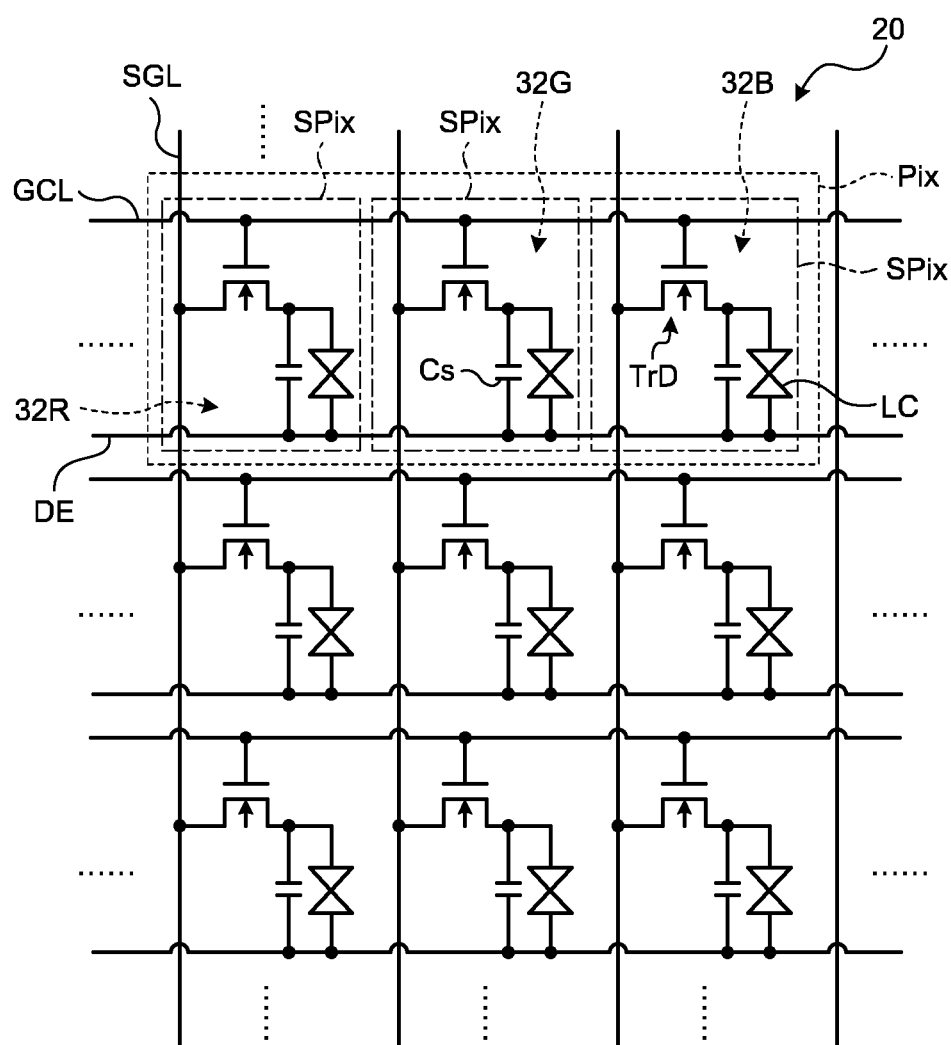
FIG. 7 is a circuit diagram illustrating a pixel array in a display region according to the first embodiment.

The following describes a display operation performed by the display panel 10. FIG. 7 is a circuit diagram illustrating a pixel array in the display region according to the first embodiment. The first substrate 21 (refer to FIG. 5) is provided with switching elements Tr of the respective sub-pixels SPix, the signal lines SGL, the gate lines GCL, and other components as illustrated in FIG. 7. The signal lines SGL are wiring that supplies the pixel signals Vpix to the pixel electrodes 22. The gate lines GCL are wiring that supplies drive signals for driving the switching elements Tr. The signal lines SGL and the gate lines GCL extend on a plane parallel to the surface of the first substrate 21.

The display region 20 illustrated in FIG. 7 includes a plurality of sub-pixels SPix arrayed in a matrix (row-column configuration). The sub-pixels SPix each include the switching element Tr and liquid crystal LC. The switching element Tr is a thin-film transistor and is an n-channel metal oxide semiconductor (MOS) TFT in this example. The insulating layer 24 is provided between the pixel electrodes 22 and the detection electrodes DE, thereby forming holding capacitance Cs illustrated in FIG. 7.

The gate driver 12 illustrated in FIG. 1 sequentially selects the gate line GCL. The gate driver 12 applies the scanning signals Vscan to the gates of the switching elements Tr of the respective sub-pixels SPix via the selected gate line GCL. As a result, one row (one horizontal line) of sub-pixels SPix out of the sub-pixels SPix is sequentially selected as a target of display drive. The source driver 13 supplies the pixel signals Vpix to the sub-pixels SPix included in the selected horizontal line via the signal lines SGL. The sub-pixels SPix perform display on a one horizontal line-by-one horizontal line basis in accordance with the supplied pixel signals Vpix.

To perform the display operation, the drive circuit 14 applies the drive signals Vcomdc for display to all the detection electrodes DE. The drive signal Vcomdc for display is a voltage signal serving as a common potential for the sub-pixels SPix. As a result, the detection electrodes DE serve as common electrodes for the pixel electrodes 22 in the display operation. To perform display, the drive circuit 14 applies the drive signals VCOM to all the detection electrodes DE in the display region 10a.

The color filter 32 illustrated in FIG. 5 may include periodically arrayed color areas in three colors of red (R), green (G), and blue (B), for example. The color areas 32R, 32G, and 32B in the three colors of R, G, and B, which serve as a set, correspond to the respective sub-pixels SPix illustrated in FIG. 7. A set of sub-pixels SPix corresponding to the respective color areas 32R, 32G, and 32B in the three colors constitutes one pixel Pix. The color filter 32 may include color areas in four or more colors.

Figure 8:
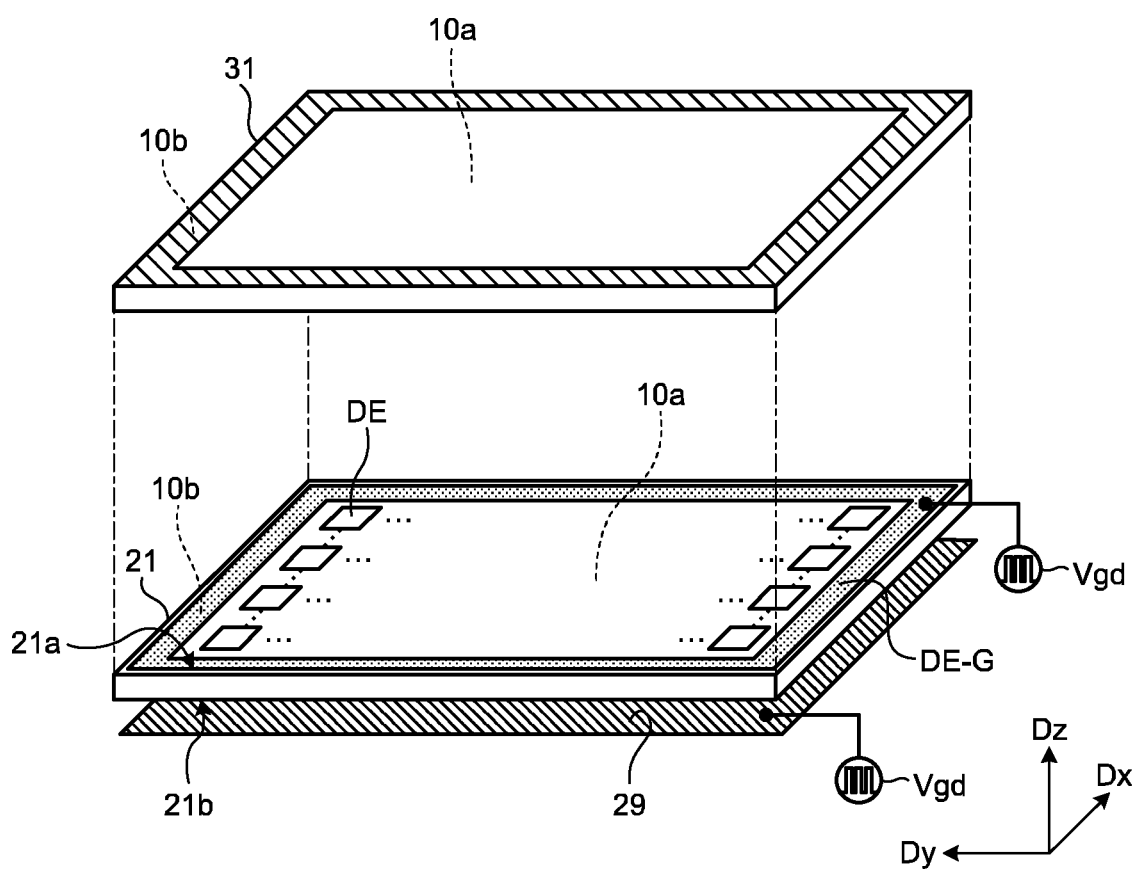
FIG. 8 is a perspective view illustrating exemplary arrangement of detection electrodes.

FIG. 8 is a perspective view illustrating exemplary arrangement of the detection electrodes. As illustrated in FIG. 8, outer edge wiring DE-G is provided in the peripheral region 10b on a first surface 21a of the first substrate 21. The outer edge wiring DE-G, for example, is provided continuously along the long sides and the short sides of the display region 10a and surrounds the display region 10a. When the display device 1 performs detection of the present state of a target object, the outer edge wiring DE-G may be supplied with guard signals Vgd having the same waveform as that of the detection drive signals Vself and synchronized with the drive signals Vself. Alternatively, the outer edge wiring DE-G may be brought into a state of not being electrically coupled to any component (high impedance state). This mechanism can prevent generation of capacitance between the outer edge wiring DE-G and the detection electrodes DE supplied with the drive signals Vself, thereby increasing detection sensitivity for the target object.

The present embodiment may include outer edge wiring 29 on a second surface 21b of the first substrate 21. The outer edge wiring 29 on the rear surface may cover part of the second surface 21b of the first substrate 21 or the entire second surface 21b. The outer edge wiring 29 on the rear surface may be made of a translucent conductive material, such as ITO, or may be a metal frame, which is not illustrated, for example. When the display device 1 performs detection of the present state of a target object, the outer edge wiring 29 on the rear surface may be supplied with the guard signals Vgd having the same waveform as that of the detection drive signals Vself and synchronized with the drive signals Vself. Alternatively, the outer edge wiring 29 on the rear surface may be brought into a state of not being electrically coupled to any component (high impedance state). This mechanism can prevent generation of capacitance between the outer edge wiring 29 on the rear surface and the detection electrodes DE supplied with the drive signals Vself, thereby increasing sensitivity in hover detection.

Figure 9:
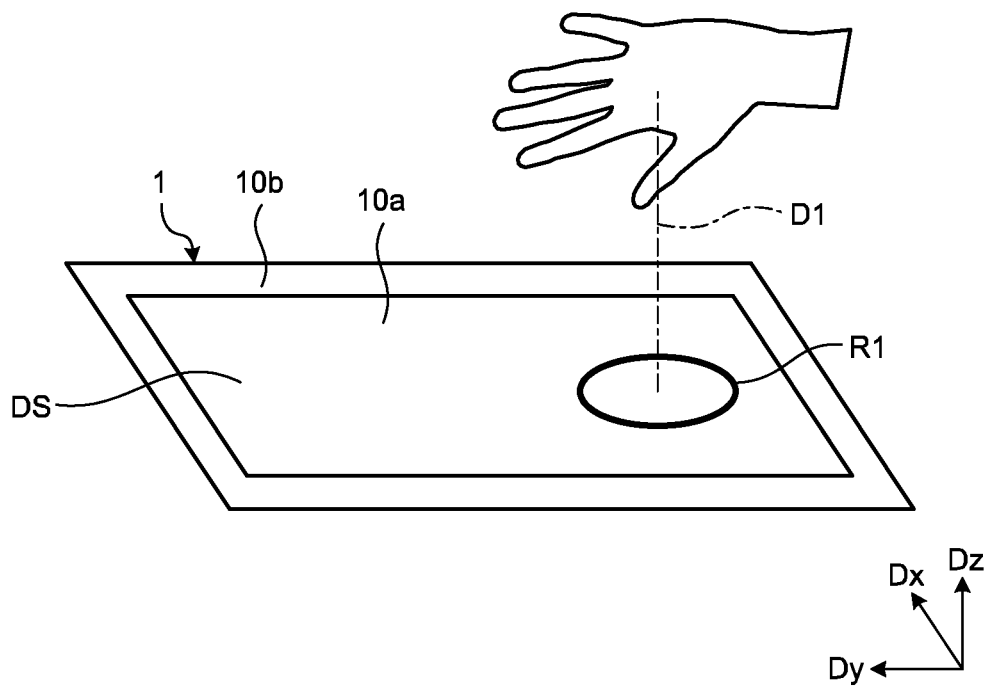
FIG. 9 is a diagram for explaining an example of hover detection according to the first embodiment.
Figure 10:
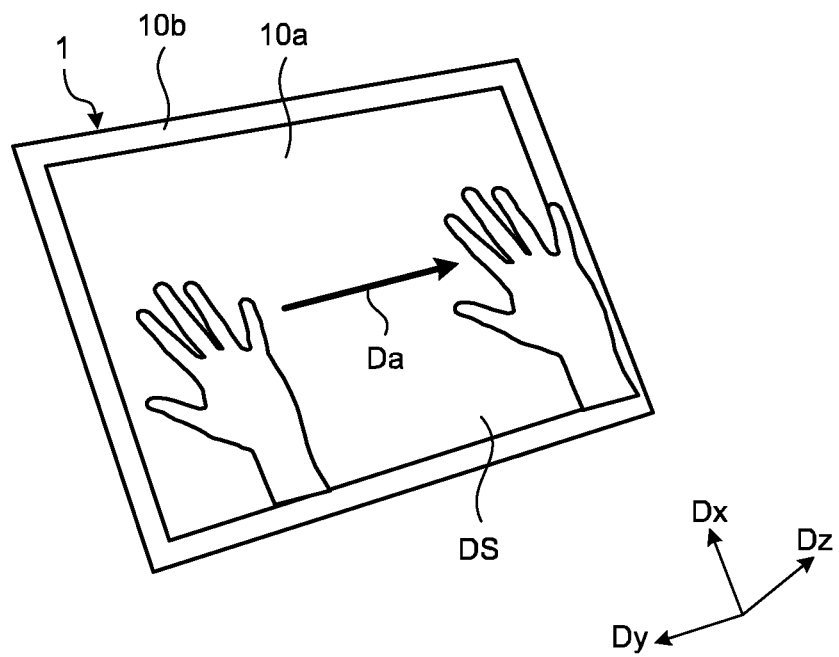
FIG. 10 is a diagram for explaining another example of hover detection according to the first embodiment.

FIG. 9 is a diagram for explaining an example of hover detection according to the embodiment. FIG. 10 is a diagram for explaining another example of hover detection according to the embodiment. As illustrated in FIG. 9, the display device 1 performs hover detection when a finger of an operator serving as a target object is in the non-contact state with respect to a detection surface DS. The detection circuit 40 can detect a distance D1 between the detection surface DS and the target object in a direction perpendicular to the detection surface DS in accordance with the detection signals Vdet. The detection circuit 40 can also detect a position R1 of the target object in accordance with the detection signals Vdet. The position R1 of the target object faces the target object in the direction perpendicular to the detection surface DS, for example, and corresponds to the detection electrode block DEB having the largest value out of the detection signals Vdet supplied from a plurality of detection electrode blocks DEB.

As illustrated in FIG. 10, the display device 1 can detect a movement, such as a gesture, of a target object. When a target object in the non-contact state with respect to the detection surface DS moves in the direction of the arrow Da, the detection circuit 40 calculates the change in position of the target object in accordance with the detection signals Vdet. The detection circuit 40 thus detects a movement, such as a gesture, of the target object. Based on the results of hover detection, the control circuit 11 (refer to FIG. 1) performs a predetermined display operation or detection operation.

Figure 11:
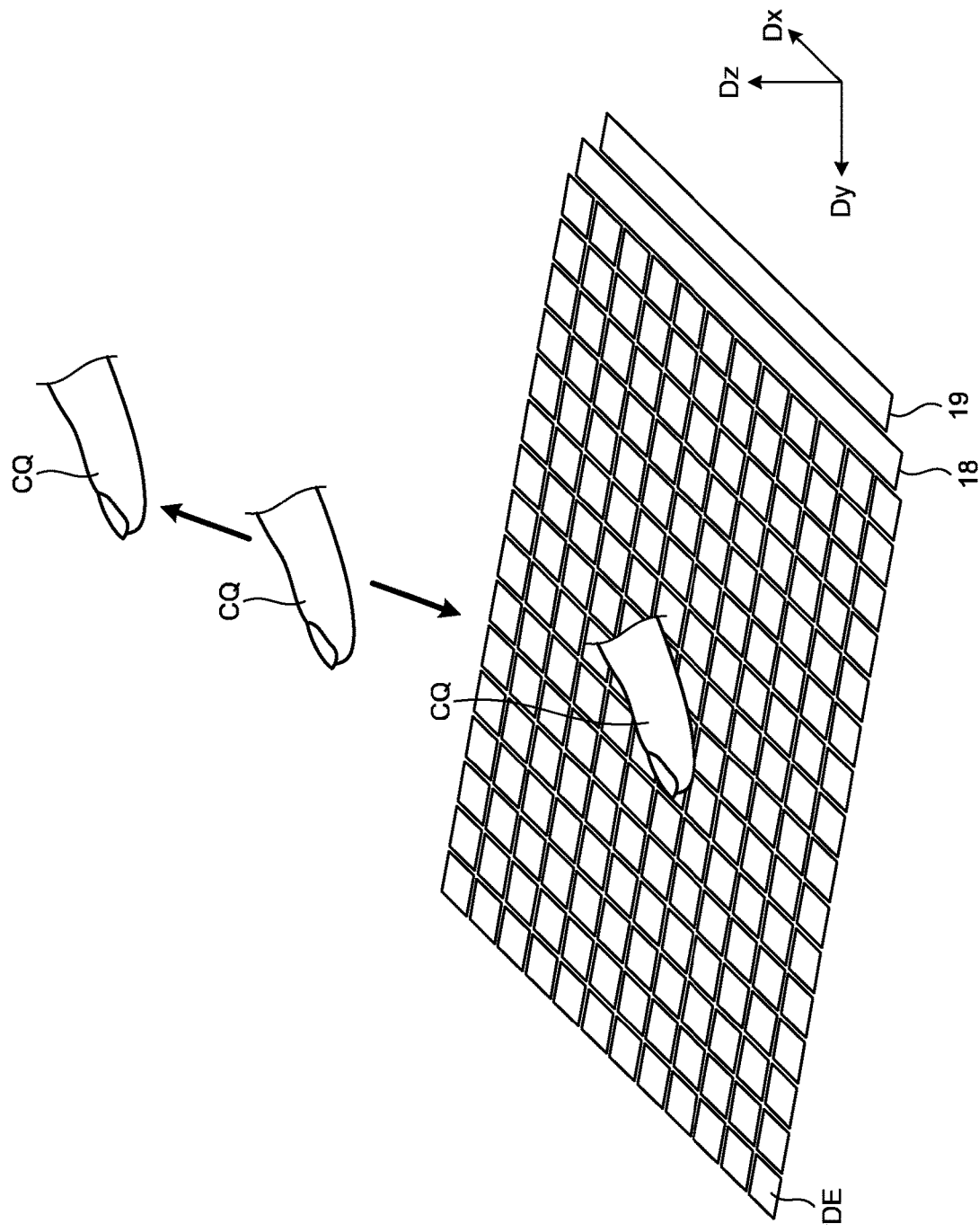
FIG. 11 is a diagram illustrating a positional relation between the detection electrodes and a target object.
Figure 12:
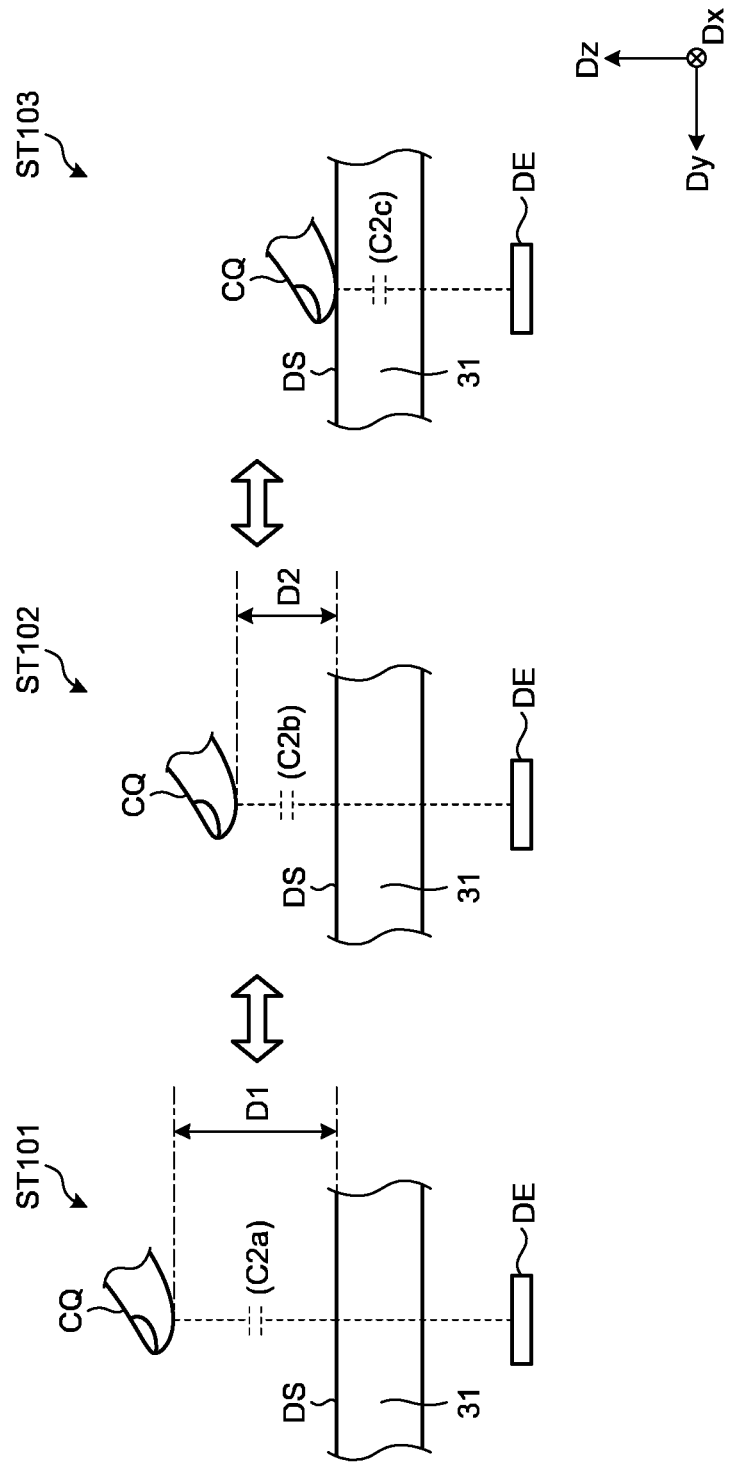
FIG. 12 is a diagram for explaining capacitance depending on the distance between the detection electrode and the target object.

FIG. 11 is a diagram illustrating a positional relation between the detection electrodes and a target object. FIG. 12 is a diagram for explaining capacitance depending on the distance between the detection electrode and the target object. As illustrated in FIG. 11, when a target object CQ moves closer to the detection electrodes DE, the detection signals become easier to be obtained. When the target object CQ moves farther from the detection electrodes DE, the signal-to-noise (S/N) ratio between the detection signals and noise decreases, whereby the detection signals become harder to be detected.

As illustrated in FIG. 12, when the distance between the detection surface DS and the target object CQ in the third direction Dz is a distance D1 (Step ST101), the target object CQ is in the non-contact state with respect to the detection surface DS of the display device 1. Capacitance C2a is formed between the target object CQ and the detection electrode DE.

Also when the distance between the detection surface DS and the target object CQ is a distance D2 (Step ST102), the target object CQ is in the non-contact state with respect to the detection surface DS of the display device 1. The distance D2 is shorter than the distance D1. Capacitance C2b is formed between the target object CQ and the detection electrode DE.

When the distance between the detection surface DS and the target object CQ is 0 (Step ST103), the target object CQ is in the contact state with respect to the detection surface DS of the display device 1. Capacitance C2c is formed between the target object CQ and the detection electrode DE.

If the detection electrodes DE are uniform in size, the capacitance C2b is larger than the capacitance C2a, and the capacitance C2c is larger than the capacitance C2b. Maintaining detection sensitivity for the target object CQ even if the distance between the detection electrode DE and the target object CQ increases only requires increasing the size of the detection electrode DE. An increase in the size of the detection electrode DE, however, increases the area of one detection electrode DE in the detection surface DS, thereby decreasing detection sensitivity. To address this problem, the display device 1 according to the present embodiment includes the detection electrodes DE and the coupling circuit described below.

Figure 13:
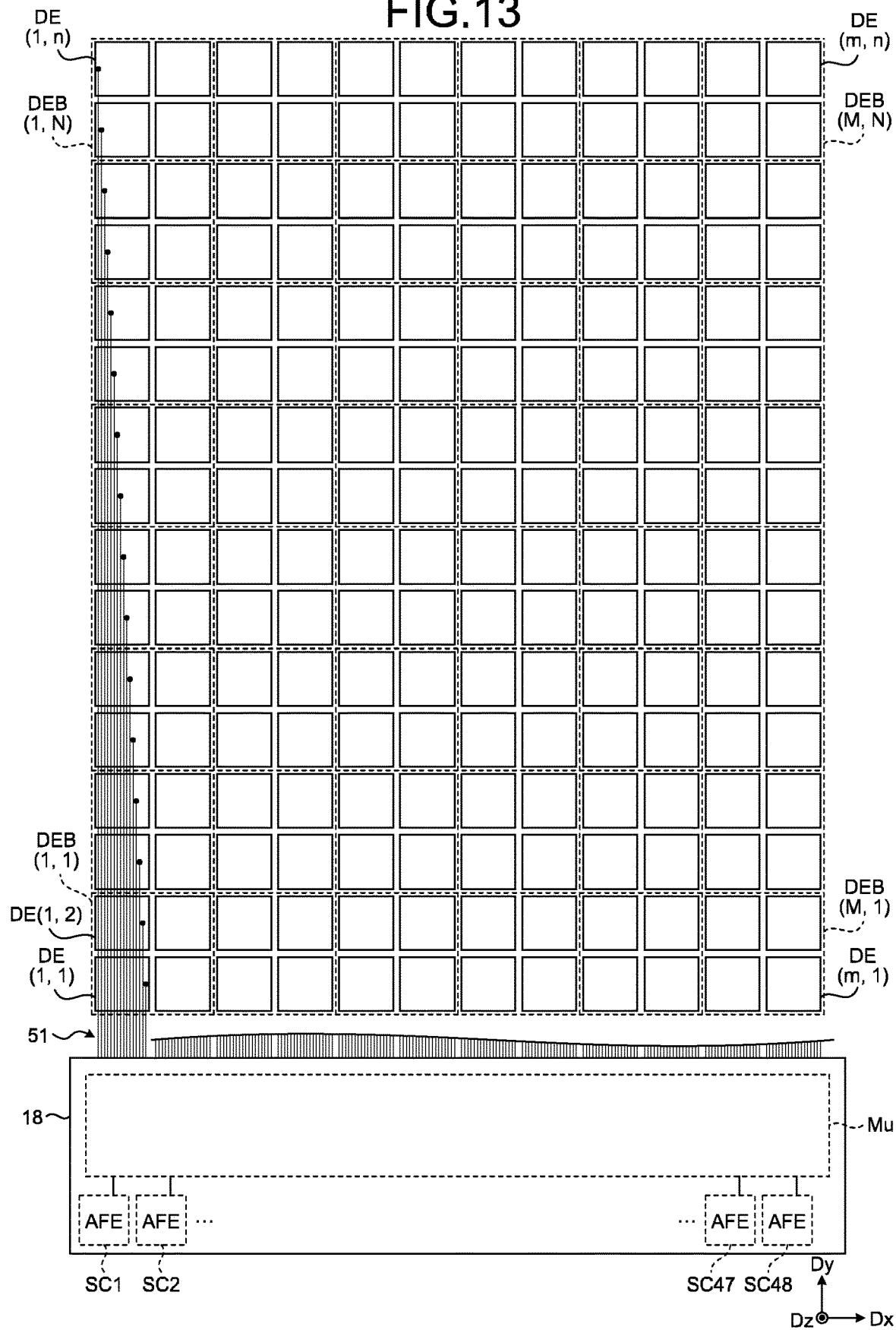
FIG. 13 is a plan view schematically illustrating a relation between the detection electrodes and a coupling circuit.

The following describes a relation between the detection electrodes DE and the coupling circuit 18. FIG. 13 is a plan view schematically illustrating the relation between the detection electrodes and the coupling circuit. As illustrated in FIG. 13, the detection electrodes DE are arrayed in a matrix (row-column configuration). Detection electrodes DE(1, 1), DE(1, 2), . . . , and DE(1, n), for example, are arrayed in the second direction Dy. Detection electrodes DE(1, 1), . . . , and DE(m, 1) are arrayed in the first direction Dx. Similarly, detection electrodes DE(m, 1), . . . , and DE(m, n) are arrayed in the second direction Dy. The detection electrodes DE(1, 1), . . . , and DE(m, n) are simply referred to as the detection electrodes DE when they need not be distinguished from one another. In the first embodiment, m is 12, and n is 16, for example. However, m and n are not limited thereto and may take any desired values.

The detection electrodes DE are made of a translucent conductive material, such as ITO. The material of the detection electrodes DE is not limited to ITO, and the detection electrodes DE may be made of tin oxide, for example.

The coupling circuit 18 switches the coupling state of the detection electrodes DE. The coupling circuit 18 according to the present embodiment includes a multiplexer Mu and analog front ends SC1, . . . , and SC48. The analog front ends SC1, . . . , and SC48 are simply referred to as the analog front ends SC when they need not be distinguished from one another.

The multiplexer Mu is disposed on the first substrate 21 provided with the detection electrodes DE and outside the sensor region 30. Similarly, the analog front ends SC are disposed on the first substrate provided with the detection electrodes DE and outside the sensor region 30. The multiplexer Mu and the analog front ends SC are made of low-temperature polycrystalline silicon, which is polycrystalline silicon produced at a low temperature, for example, and have small areas.

The detection electrodes DE are electrically coupled to the multiplexer Mu of the coupling circuit 18 via the respective wires 51. The wires 51 illustrated in FIG. 13 are coupled to the respective detection electrodes DE(1, 1), DE(1, 2), . . . , and DE(1, n), and the same applies to the wires 51 coupled to the other detection electrodes DE, which are not illustrated. The multiplexer Mu is also electrically coupled to the analog front ends SC.

Figure 14:
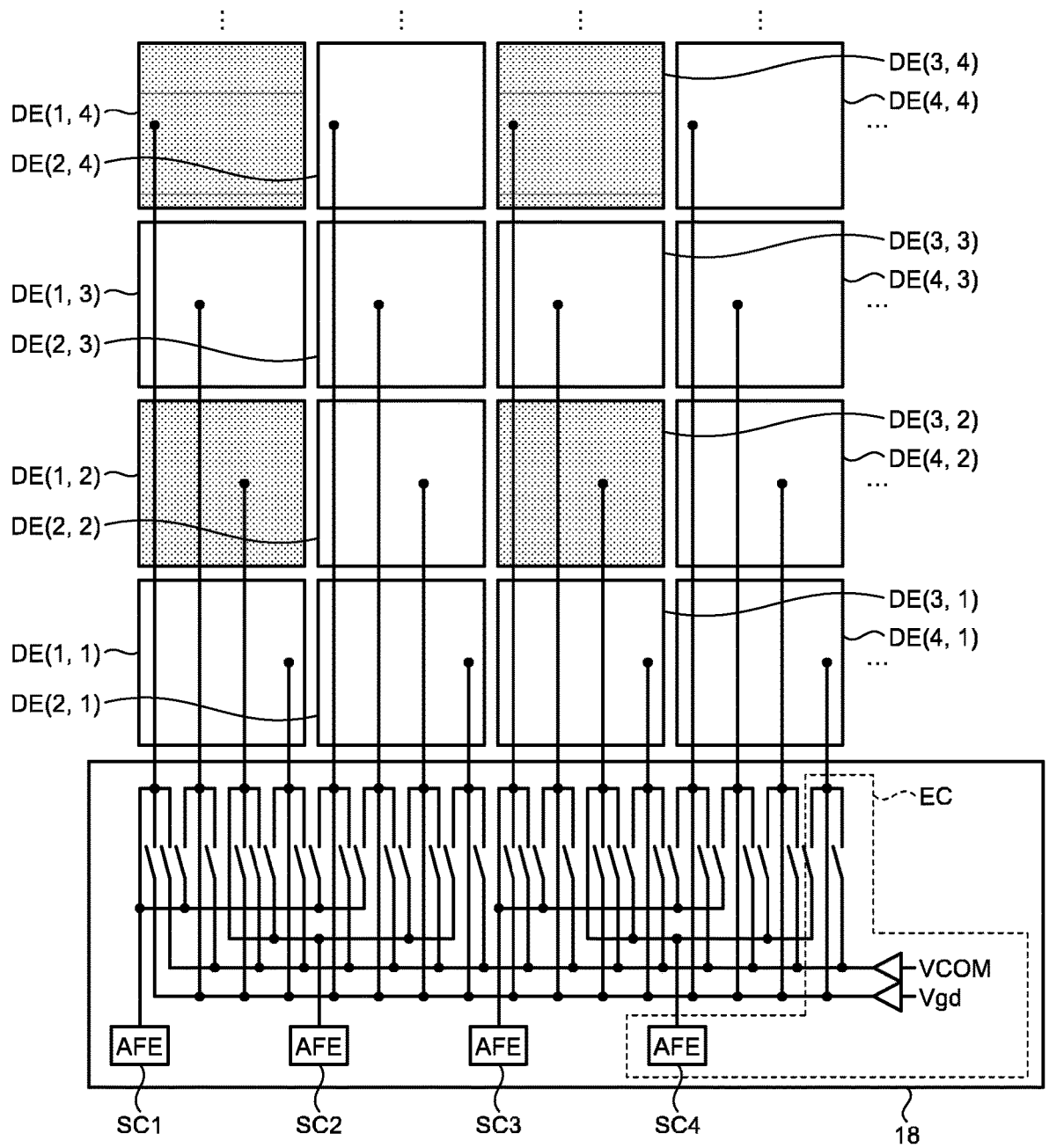
FIG. 14 is a diagram for explaining the coupling circuit.
Figure 15:
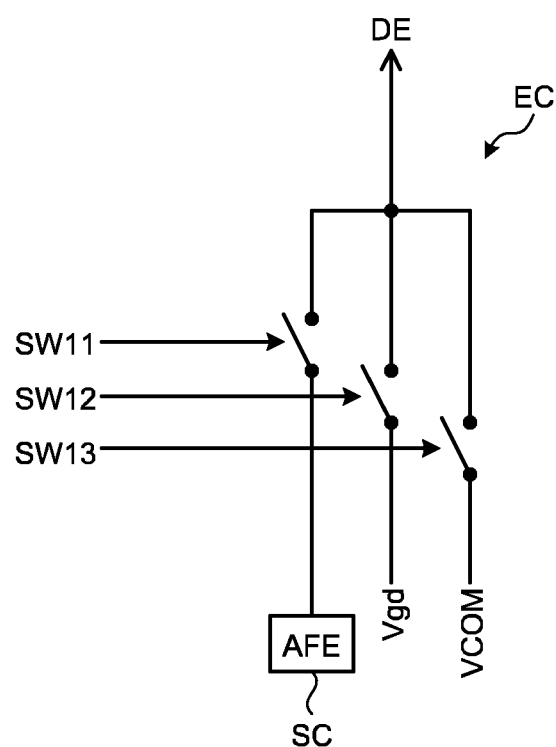
FIG. 15 is a diagram for explaining a specific configuration of a multiplexer illustrated in FIG. 13.

FIG. 14 is a diagram for explaining the coupling circuit. FIG. 15 is a diagram for explaining a specific configuration of the multiplexer illustrated in FIG. 13. As illustrated in FIG. 14, the coupling circuit 18 includes a combination of a plurality of selection circuits EC serving as the multiplexer Mu illustrated in FIG. 13.

As illustrated in FIG. 15, one selection circuit EC includes switches SW11, SW12, and SW13. The switches SW11, SW12, and SW13 are n-channel MOS TFTs, for example, and provided to the first substrate 21.

Opening and closing of the switches SW11, SW12, and SW13 allow any one of supply wiring for the drive signals Vcomdc for display, supply wiring for the guard signals Vgd, and the analog front end SC to be coupled to one detection electrode DE in a time-division manner.

In FIG. 14, the detection electrode DE(1, 2) is coupled to the analog front end SC2. The detection electrode DE(1, 4) is coupled to the analog front end SC1. The detection electrode DE(3, 2) is coupled to the analog front end SC4. The detection electrode DE(3, 4) is coupled to the analog front end SC3.

In FIG. 14, the detection electrodes DE(1, 1), DE(1, 3), DE(2, 1), DE(2, 2), DE(2, 3), DE(2, 4), DE(3, 1), DE(3, 3), DE(4, 1), DE(4, 2), DE(4, 3), and DE(4, 4) are coupled to the supply wiring for the guard signals Vgd. The guard signals Vgd have the same waveform as that of the detection drive signals Vself supplied to the detection electrodes DE(1, 2), DE(1, 4), DE(3, 2), and DE(3, 4) and synchronized with the drive signals Vself. This mechanism can prevent generation of capacitance between the detection electrodes DE(1, 2), DE(1, 4), DE(3, 2), and DE(3, 4) and the detection electrodes DE(1, 1), DE(1, 3), DE(2, 1), DE(2, 2), DE(2, 3), DE(2, 4), DE(3, 1), DE(3, 3), DE(4, 1), DE(4, 2), DE(4, 3), and DE(4, 4), thereby increasing detection sensitivity for a target object.

According to the first embodiment, the number of the analog front ends SC is 48, and the number of the detection electrodes DE is 192. The number of the detection electrodes DE is larger than that of the analog front ends SC. The multiplexer Mu is coupled to one detection electrode DE via one wire 51. The multiplexer Mu sequentially electrically couples the wires 51 one by one to one analog front end SC in a time-division manner.

Figure 16A:
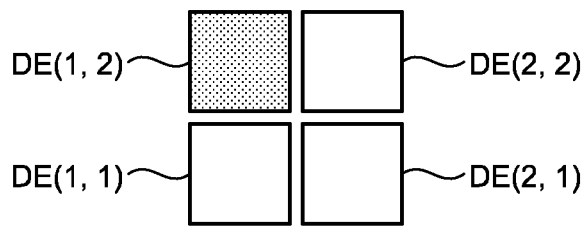
FIGS. 16A to 16D are diagrams for explaining a state where the detection electrode supplied with a detection drive signal is sequentially switched.

FIGS. 16A to 16D are diagrams for explaining a state where the detection electrode supplied with the detection drive signal is sequentially switched. As illustrated in FIG. 16A, the detection electrode DE(1, 2) is supplied with the detection drive signal Vself and coupled to the analog front end SC2 (refer to FIG. 14) by the operations of the selection circuits EC illustrated in FIGS. 14 and 15. The detection electrodes DE(1, 1), DE(2, 1), and DE(2,2) are supplied with the guard signals Vgd.

Figure 16B:
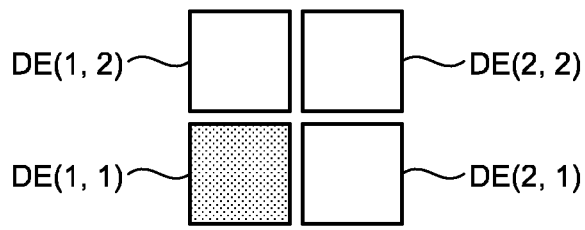

As illustrated in FIG. 16B, the detection electrode DE(1, 1) is supplied with the detection drive signal Vself and coupled to the analog front end SC2 (refer to FIG. 14) by the operations of the selection circuits EC illustrated in FIGS. 14 and 15. The detection electrodes DE(1, 2), DE(2, 1), and DE(2, 2) are supplied with the guard signals Vgd.

Figure 16C:
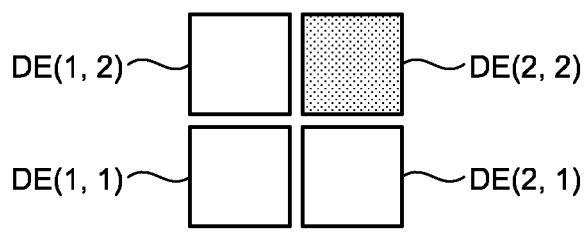

As illustrated in FIG. 16C, the detection electrode DE(2, 2) is supplied with the detection drive signal Vself and coupled to the analog front end SC2 (refer to FIG. 14) by the operations of the selection circuits EC illustrated in FIGS. 14 and 15. The detection electrodes DE(1, 1), DE(1, 2), and DE(2, 1) are supplied with the guard signals Vgd.

Figure 16D:
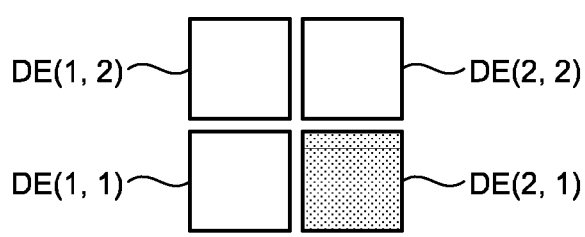

As illustrated in FIG. 16D, the detection electrode DE(2, 1) is supplied with the detection drive signal Vself and coupled to the analog front end SC2 (refer to FIG. 14) by the operations of the selection circuits EC illustrated in FIGS. 14 and 15. The detection electrodes DE(1, 1), DE(1, 2), and DE(2, 2) are supplied with the guard signals Vgd.

As described above, the detection circuit 40 can detect self-capacitance of the detection electrodes DE(1, 1), DE(1, 2), DE(2, 1), and DE(2, 2) via one analog front end SC2. While the coupling configuration of the detection electrodes DE(1, 1), DE(1, 2), DE(2, 1), and DE(2, 2) have been described as an example, the other detection electrodes DE have the same coupling configuration. As a result, the coupling circuit 18 can be downsized.

Figure 18:
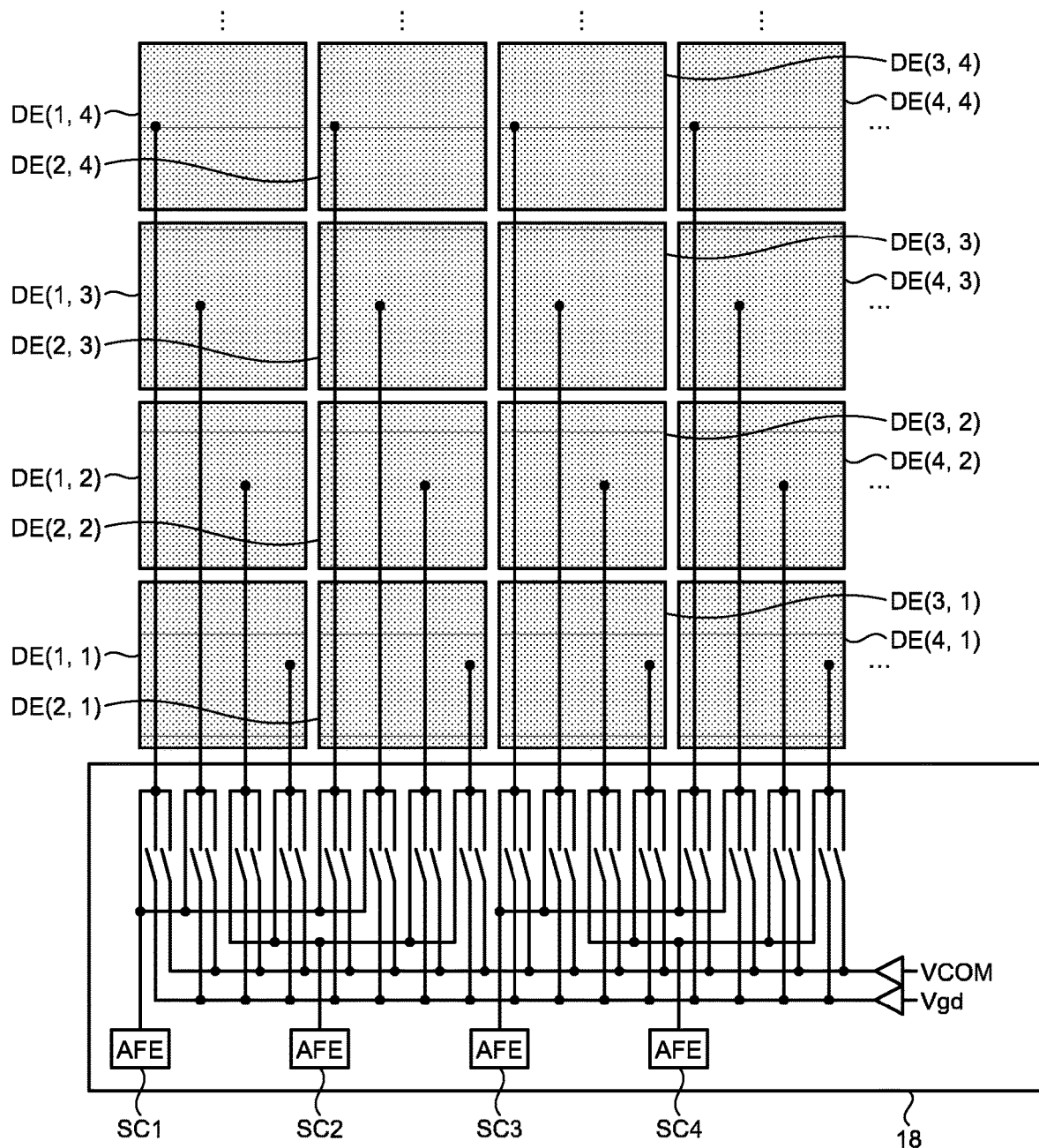
FIG. 18 is a diagram for explaining the coupling circuit in which a plurality of detection electrodes are coupled to one analog front end (AFE)
Figure 19:
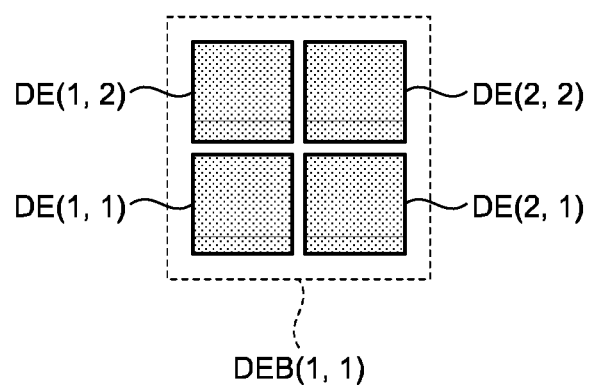
FIG. 19 is a diagram for explaining a detection electrode block.
Figure 20:
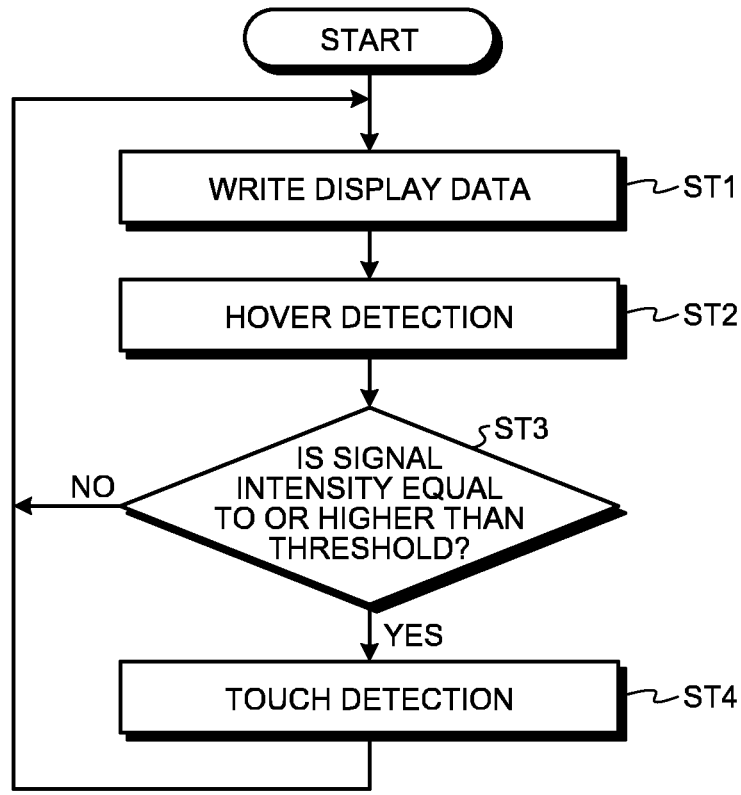
FIG. 20 is a flowchart for the exemplary operation performed by the display device according to the first embodiment.
Figure 21:
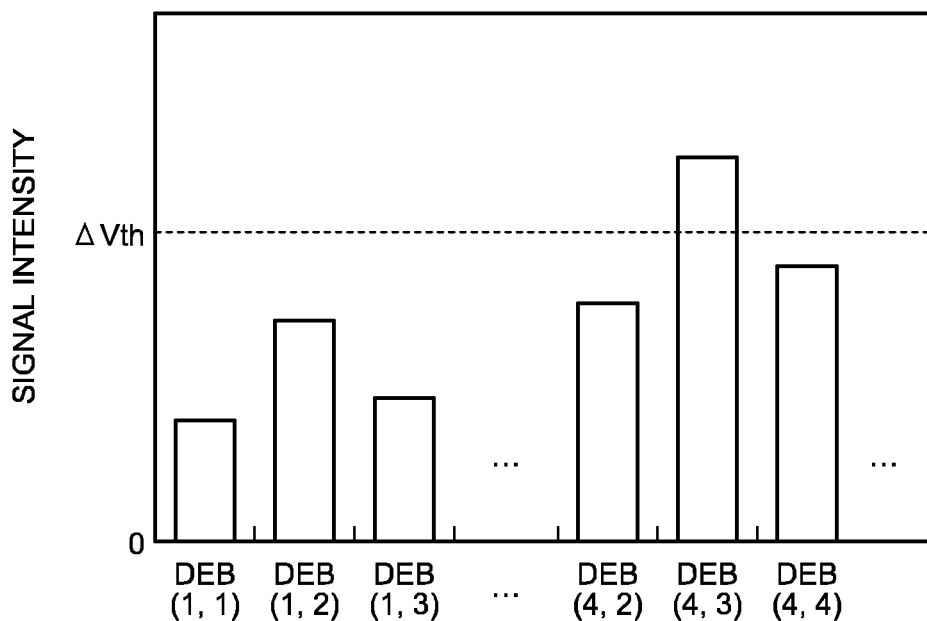
FIG. 21 is a graph schematically illustrating a relation between the detection electrode blocks and signal intensities.

The following describes an exemplary operation according to the present embodiment with reference to FIG. 1 and FIGS. 13 to 21. FIG. 17 is a timing waveform chart for an exemplary operation performed by the display device according to the first embodiment. FIG. 18 is a diagram for explaining the coupling circuit in which a plurality of detection electrodes are coupled to one analog front end. FIG. 19 is a diagram for explaining the detection electrode block. FIG. 20 is a flowchart for the exemplary operation performed by the display device according to the first embodiment. FIG. 21 is a graph schematically illustrating a relation between the detection electrode blocks and signal intensities. The exemplary operation illustrated in FIGS. 17 to 21 is given by way of example only and may be appropriately modified.

As illustrated in FIG. 17, display periods Pd and detection periods Pt are provided such that each of the display periods Pd and each of the detection periods Pt are alternately arranged in a time-division manner. The detection period Pt includes a hover detection period Pts and a touch detection period Ptm. The execution order of the display period Pd, the hover detection period Pts, and the touch detection period Ptm is given by way of example only and may be appropriately modified. For example, one detection period Pt may include only one of the hover detection period Pts and the touch detection period Ptm. The display device 1 may perform touch detection on one detection surface in one touch detection period Ptm or a plurality of touch detection periods Ptm in a divided manner. The display device 1 may display an image of one frame in one display period Pd. Alternatively, within a period for displaying an image of one frame, a plurality of display periods Pd and a plurality of detection periods Pt may be provided such that each of the display periods Pd and each of the detection periods Pt are alternately arranged.

As illustrated in FIG. 20, the control circuit 11 writes display data first (Step ST1). Specifically, similarly to the display operation described above, the source driver 13 supplies the pixel signals Vpix to the sub-pixels SPix corresponding to gate lines GCL1, GCL2, and GCL3 via signal lines SGL1 SGL2, and SGL3. The sub-pixels SPix perform display on a one horizontal line-by-one horizontal line basis in accordance with the supplied pixel signals Vpix. As illustrated in FIG. 17, the drive circuit 14 supplies the drive signals Vcomdc for display to the detection electrodes DE in the display period Pd. The drive signals Vcomdc for display are supplied to all the detection electrodes DE via the switch SW13 illustrated in FIG. 15 in the coupling circuit 18. The detection electrodes DE serve as common electrodes that supply a common potential.

Subsequently, the control circuit 11 performs hover detection (Step ST2). Specifically, as illustrated in FIG. 17, the control circuit 11 supplies the control signal Vsc1 to the coupling circuit 18 and supplies the control signal Vsc2 to the coupling circuit 18 in the hover detection period Pts. The control signals Vsc1 and Vsc2 turn on the switch SW11 (refer to FIG. 15) and turn off the switches SW12 and SW13 (refer to FIG. 15). Consequently, as illustrated in FIG. 13, four detection electrodes DE disposed side by side in the first direction Dx and the second direction Dy are electrically coupled to one another to serve as one detection electrode block DEB.

As illustrated in FIG. 18, for example, the detection electrodes DE(1, 1), DE(1, 1), DE(2, 1), and DE(2, 2) are coupled to the same analog front end SC2 in the coupling circuit 18. When viewed from the detection circuit 40 illustrated in FIG. 2, the detection electrodes DE(1, 1), DE(1, 2), DE(2, 1), and DE(2, 2) serve as one detection electrode block DEB(1, 1) as illustrated in FIG. 19. In other words, the detection electrodes DE(1, 1), DE(1, 2), DE(2, 1), and DE(2, 2) electrically coupled to the respective wires 51 capable of being simultaneously coupled to one analog front end SC include at least two detection electrodes DE disposed side by side in the first direction Dx or the second direction Dy intersecting the first direction Dx on the first substrate 21.

As illustrated in FIG. 13, a plurality of detection electrode blocks DEB are arrayed in a matrix (row-column configuration). Detection electrode blocks DEB(1, 1), ..., and DEB(1, N), for example, are arrayed in the second direction Dy. Detection electrode blocks DEB(1, 1), ..., and DEB(M, 1) are arrayed in the first direction Dx. Similarly, detection electrode blocks DEB(M, 1), ..., and DEB(M, N) are arrayed in the second direction Dy. The detection electrode blocks DEB(1, 1), ..., and DEB(M, N) are simply referred to as the detection electrode blocks DEB when they need not be distinguished from one another. In the first embodiment, M is 6, and N is 8, for example. However, M and N are not limited thereto and may take any desired values.

The number of the detection electrode blocks DEB according to the first embodiment is 48. The detection electrode blocks DEB are each electrically coupled to any one of the analog front ends SC1 to SC48 in a one-to-one correspondence by the multiplexer Mu.

The drive circuit 14 supplies the drive signals Vself to the detection electrode blocks DEB. The display device 1 thus can detect a target object in the non-contact state for each detection electrode block DEB. The detection circuit 40, for example, can detect the distance D1 between the detection surface DS and the target object in the direction perpendicular to the detection surface DS, in accordance with the detection signals Vdet supplied from the respective detection electrode blocks DEB. The detection circuit 40 can also detect the position R1 of the target object in accordance with the detection signals Vdet supplied from the respective detection electrode blocks DEB. The drive circuit 14 supplies the guard signals Vgd to the outer edge wiring DE-G (refer to FIG. 8) in the hover detection period Pts.

Subsequently, the detection circuit 40 determines whether the detection signals Vdet supplied from the respective detection electrode blocks DEB are equal to or higher than a predetermined threshold ΔVth (Step ST3). As illustrated in FIG. 21, the detection circuit 40 calculates the signal intensities of the detection signals Vdet supplied from the respective detection electrode blocks DEB and compares them with the predetermined threshold ΔVth.

If the signal intensity of any one of the detection signals Vdet is equal to or higher than the threshold ΔVth (Yes at Step ST3), the control circuit 11 performs touch detection (Step ST4). If the signal intensity of the detection signal Vdet is equal to or higher than the threshold ΔVth, the detection circuit 40 determines that a target object is in the contact state. In the example illustrated in FIG. 21, the signal intensity of the detection signal Vdet supplied from the detection electrode block DEB(4, 3) is equal to or higher than the threshold ΔVth. The signal intensities of the detection signals Vdet supplied from the other detection electrode blocks DEB are lower than the threshold ΔVth. In this case, the detection circuit 40 determines that a target object is in the contact state at a position corresponding to the detection electrode block DEB(4, 3). The control circuit 11 switches from hover detection to touch detection based on the information supplied from the detection circuit 40.

Specifically, as illustrated in FIG. 17, the control circuit 11 supplies the control signal Vsc1 to the coupling circuit 18 and supplies the control signal Vsc2 to the coupling circuit 18 in the touch detection period Ptm. The control signals Vsc1 and Vsc2 cause the switches SW11, SW12, and SW13 (refer to FIG. 15) to operate. As a result, as illustrated in FIGS. 16A to 16D, the detection electrode DE supplied with the detection drive signal Vself is sequentially switched.

The drive circuit 14 sequentially supplies the drive signals Vself to the detection electrodes DE. The detection signals Vdet corresponding to capacitance changes in the detection electrodes DE are supplied to the detection circuit 40 via the analog front ends SC. The display device 1 thus can detect a target object in the contact state in units of a plurality of detection electrodes DE.

In the touch detection period Ptm, when the detection operation on one detection surface is completed, that is, when the control circuit 11 has sequentially supplied the drive signals Vself to all the detection electrodes DE to perform touch detection, the control circuit 11 terminates touch detection and returns to writing of display data (Step ST1).

If the signal intensities of all the detection signals Vdet are lower than the threshold ΔVth (No at Step ST3), the control circuit 11 does not perform touch detection and returns to writing of display data (Step ST1). In this case, in the detection period Pt illustrated in FIG. 17, the control circuit 11 performs only the processing of the hover detection period Pts and does not perform the processing of the touch detection period Ptm. In other words, only the hover detection period Pts is present in one detection period Pt.

The signal lines SGL are preferably in a floating state in the hover detection period Pts and the touch detection period Ptm. This mechanism can reduce capacitance between the detection electrodes DE and the signal lines SGL. The gate lines GCL may be in a floating state in the hover detection period Pts.

As described above, the detection device according to the first embodiment includes the first substrate 21, the detection electrodes DE, the drive circuit 14, the analog front ends SC, and the multiplexer Mu. The detection electrodes DE are provided in the sensor region 30 of the first substrate 21. The drive circuit 14 supplies the drive signals Vself to the detection electrodes DE. The analog front ends SC receive, from the detection electrodes DE, the detection signals Vdet corresponding to capacitance changes in the detection electrodes DE caused when the drive signals Vself are supplied to the detection electrodes DE. The multiplexer Mu is coupled to one detection electrode DE via one wire 51, and the number of wires 51 simultaneously electrically coupled to one analog front end SC can be changed.

The first embodiment can use the detection electrodes DE in both of the two detection modes, that is, in the touch detection mode and the hover detection mode by the self-capacitance method. Furthermore, in hover detection, the first embodiment changes the number of detection electrodes DE combined into one unit depending on the distance between the detection electrodes DE and the target object CQ. Consequently, the first embodiment can perform hover detection desirably.

With the configuration described above, the detection device according to the first embodiment electrically combines and couples a plurality of detection electrodes DE to one analog front end SC, thereby causing them to serve as one detection electrode block DEB if the distance between the detection electrodes DE and the target object CQ is large. This mechanism increases an apparent size of the detection electrode DE, thereby increasing detection sensitivity for the target object CQ. An increase in the size of the detection electrode DE, however, increases the area of one detection electrode DE in the detection surface DS, thereby decreasing detection sensitivity. By reducing the number of detection electrodes DE coupled to one analog front end SC, the detection device can increase accuracy in positional coordinates of the target object CQ in the present state. As described above, the detection device according to the first embodiment can perform touch detection and hover detection desirably.

Second Embodiment

Figure 22:
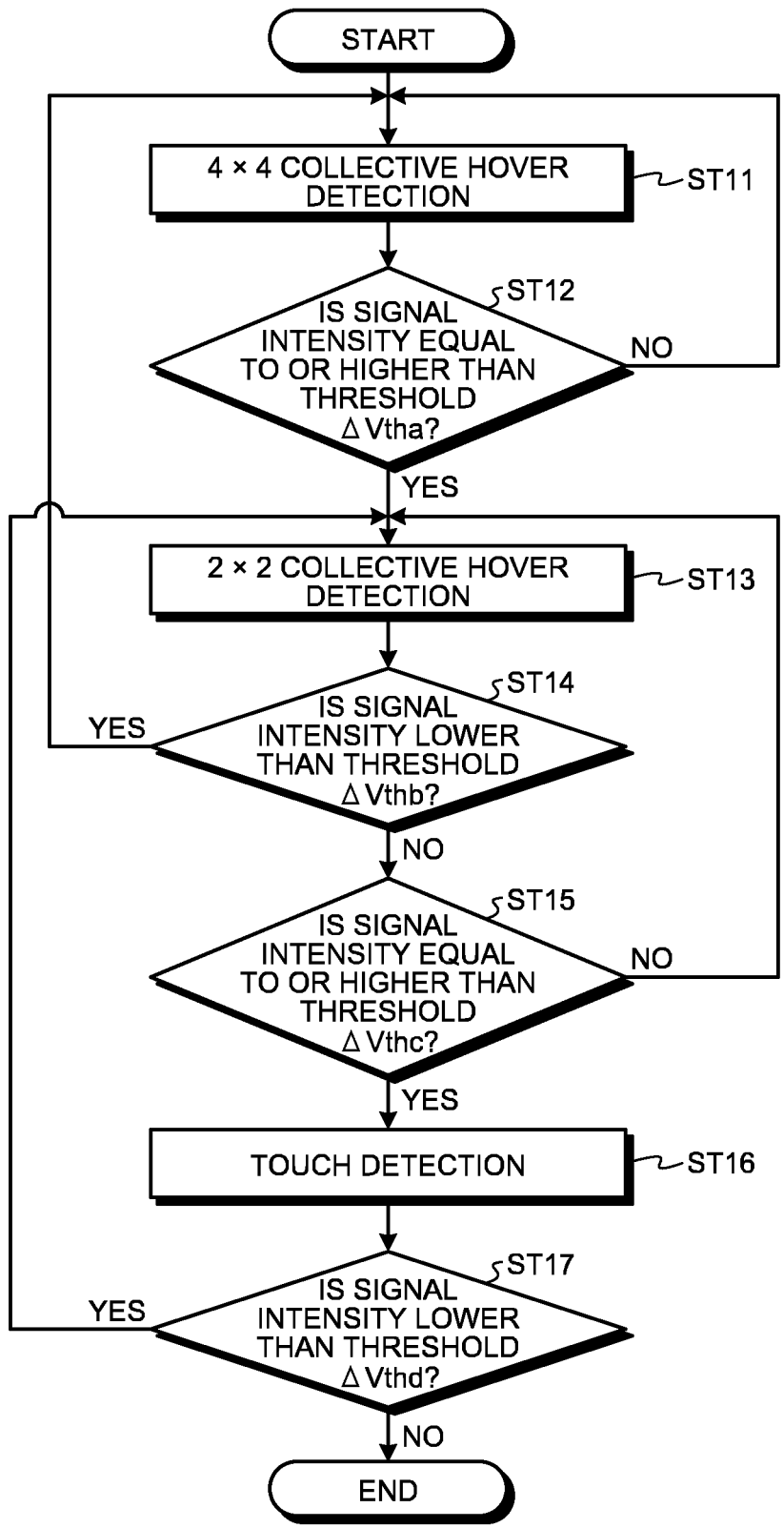
FIG. 22 is a flowchart for an exemplary operation performed by the display device according to a second embodiment of the present disclosure.
Figure 23:
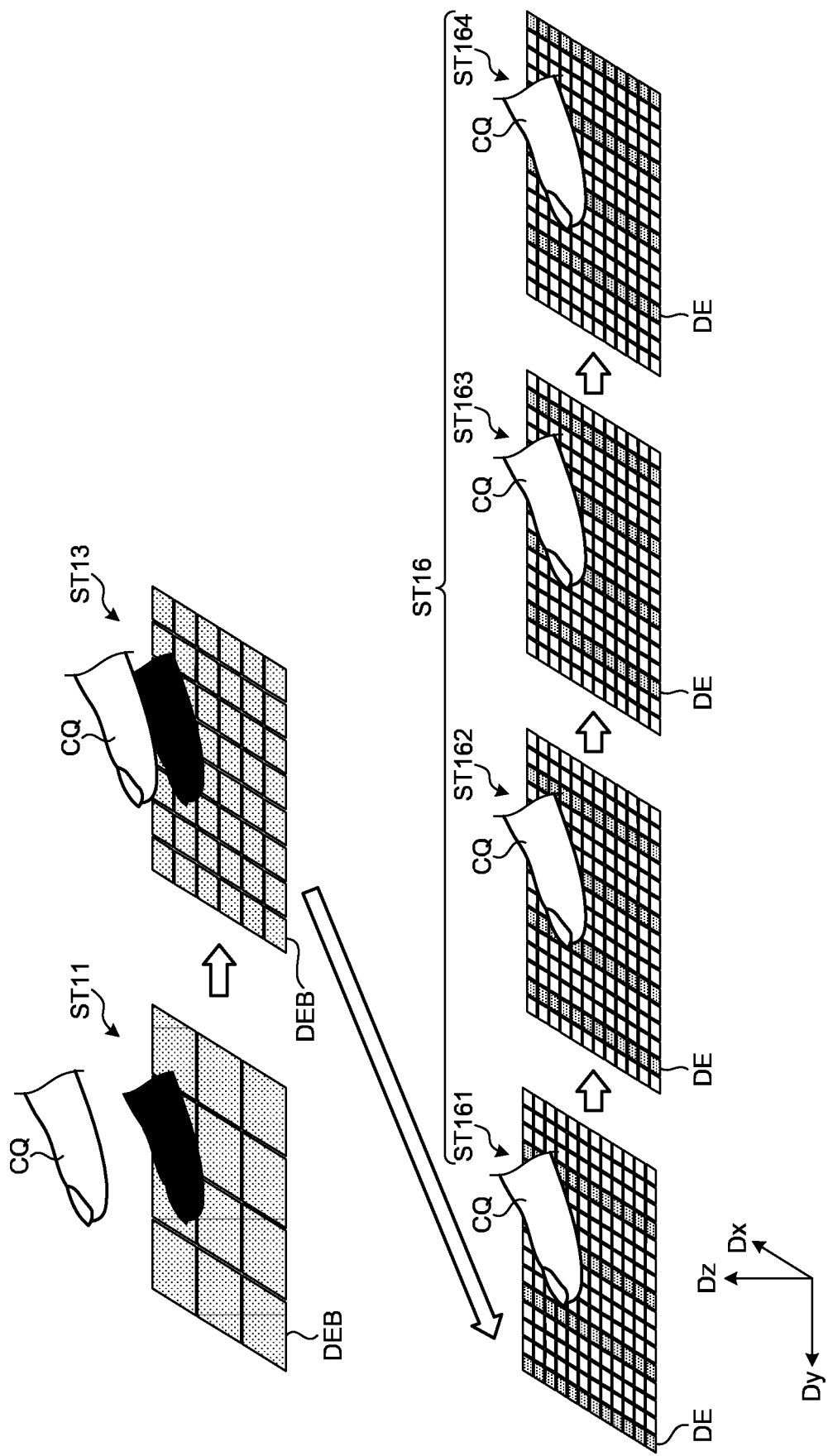
FIG. 23 is a diagram for schematically explaining changes in the state of the detection electrodes coupled to the analog front ends.

FIG. 22 is a flowchart for an exemplary operation performed by the display device according to a second embodiment of the present disclosure. FIG. 23 is a diagram for schematically explaining changes in the state of the detection electrodes coupled to the analog front ends. Components described in the first embodiment are denoted by like reference numerals, and explanation thereof is omitted.

The exemplary operation described in the first embodiment is given by way of example only and may be appropriately modified. The display device, for example, may perform hover detection while changing the number of detection electrodes DE serving as one detection electrode block DEB in a plurality of hover detection periods Pts. The control circuit 11 can change a resolution in hover detection by changing the number of detection electrodes DE included in one detection electrode block DEB depending on the distance D1 between the detection surface DS and a target object.

Also in FIG. 22, the display periods Pd and the detection periods Pt provided such that each of the display periods Pd and each of the detection periods Pt are alternately arranged in a time-division manner. Detailed explanation of the display period Pd is omitted because it is the same as that described in the first embodiment. In the detection period Pt according to the second embodiment, the detection electrodes are electrically combined into units of 4×4 detection electrodes by the coupling circuit 18 to serve as the detection electrode blocks DEB. The control circuit 11 performs hover detection (Step ST11).

As illustrated in FIG. 23, the size of the detection electrode block DEB is large at step ST11. This configuration facilitates detecting the target object CQ even if the distance between the target object CQ and the detection electrode blocks DEB is large.

Figure 24:
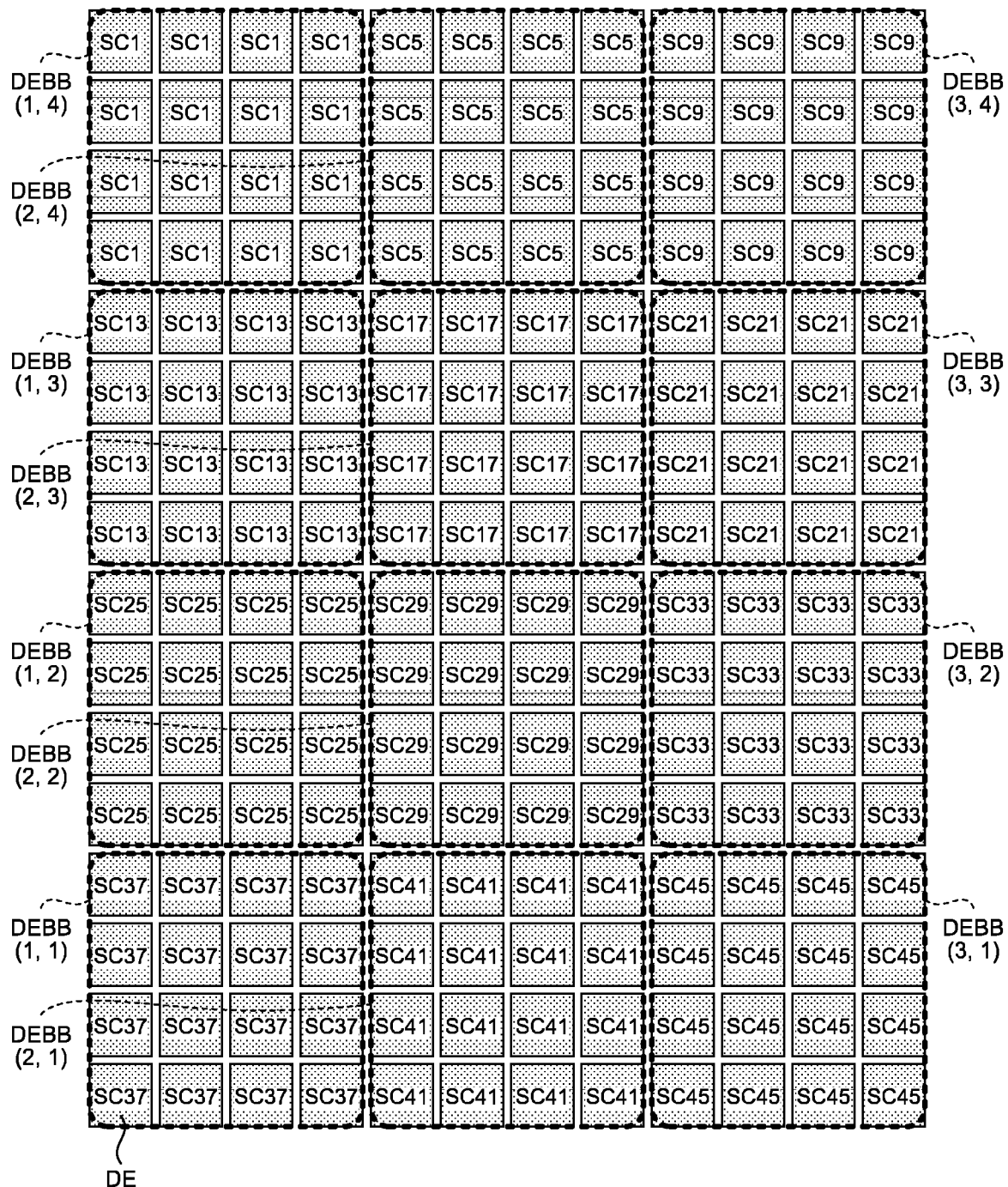
FIG. 24 is a diagram for explaining the analog front ends coupled to the respective detection electrode blocks in a case where the detection electrodes are electrically combined into units of 4×4 detection electrodes to serve as the detection electrode blocks.

FIG. 24 is a diagram for explaining the analog front ends coupled to the respective detection electrode blocks in a case where the detection electrodes are electrically combined into units of 4×4 detection electrodes to serve as the detection electrode blocks. In FIG. 24, 12×16 detection electrodes DE are electrically combined into units of 4×4 detection electrodes DE to serve as the detection electrode blocks DEB. As a result, 3×4 detection electrode blocks DEB are arrayed in a matrix (row-column configuration).

In FIG. 24, the detection electrode blocks DEB include detection electrode blocks DEBB(1, 1), DEBB(1, 2), DEBB(1, 3), DEBB(1, 4), DEBB(2, 1), DEBB(2, 2), DEBB(2, 3), DEBB(2, 4), DEBB(3, 1), DEBB(3, 2), DEBB(3, 3), and DEBB(3, 4).

As illustrated in FIG. 13, the coupling circuit 18 according to the second embodiment also includes the multiplexer Mu and the analog front ends SC1, . . . , and SC48. The detection electrodes DE included in the detection electrode block DEBB(1, 1) are electrically coupled to the analog front end SC37. The detection electrodes DE included in the detection electrode block DEBB(1, 2) are electrically coupled to the analog front end SC25. The detection electrodes DE included in the detection electrode block DEBB(1, 3) are electrically coupled to the analog front end SC13. The detection electrodes DE included in the detection electrode block DEBB(1, 4) are electrically coupled to the analog front end SC1.

The detection electrodes DE included in the detection electrode block DEBB(2, 1) are electrically coupled to the analog front end SC41. The detection electrodes DE included in the detection electrode block DEBB(2, 2) are electrically coupled to the analog front end SC29. The detection electrodes DE included in the detection electrode block DEBB(2, 3) are electrically coupled to the analog front end SC17. The detection electrodes DE included in the detection electrode block DEBB(2, 4) are electrically coupled to the analog front end SC5.

The detection electrodes DE included in the detection electrode block DEBB(3, 1) are electrically coupled to the analog front end SC45. The detection electrodes DE included in the detection electrode block DEBB(3, 2) are electrically coupled to the analog front end SC33. The detection electrodes DE included in the detection electrode block DEBB(3, 3) are electrically coupled to the analog front end SC21. The detection electrodes DE included in the detection electrode block DEBB(3, 4) are electrically coupled to the analog front end SC9.

As illustrated in FIG. 23, at Step ST11, the detection circuit 40 detects self-capacitance in accordance with the detection signals Vdet supplied from the detection electrode blocks DEBB(1, 1), DEBB(1, 2), DEBB(1, 3), DEBB(1, 4), DEBB(2, 1), DEBB(2, 2), DEBB(2, 3), DEBB(2, 4), DEBB(3, 1), DEBB(3, 2), DEBB(3, 3), and DEBB(3, 4) via the 12 analog front ends SC out of the 48 analog front ends SC. The detection circuit 40 thus determines which of the detection electrode blocks DEBB corresponds to the position of the target object CQ.

Subsequently, the detection circuit 40 compares the intensities of the supplied detection signals Vdet with a predetermined threshold ΔVtha and determines whether the signal intensities are equal to or higher than the predetermined threshold ΔVtha (Step ST12).

If the signal intensity of any one of the detection signals Vdet is lower than the threshold ΔVtha (No at Step ST12), the control circuit 11 returns to the processing at Step ST11. If the signal intensity of any one of the detection signals Vdet is equal to or higher than the threshold ΔVtha (Yes at Step ST12), the detection electrodes are electrically combined into units of 2×2 detection electrodes by the coupling circuit 18. As illustrated in FIG. 23, the 2×2 detection electrodes serve as one detection electrode block DEB smaller than the detection electrode block DEB obtained at Step ST11. The control circuit 11 then performs hover detection (Step ST13).

Figure 25:
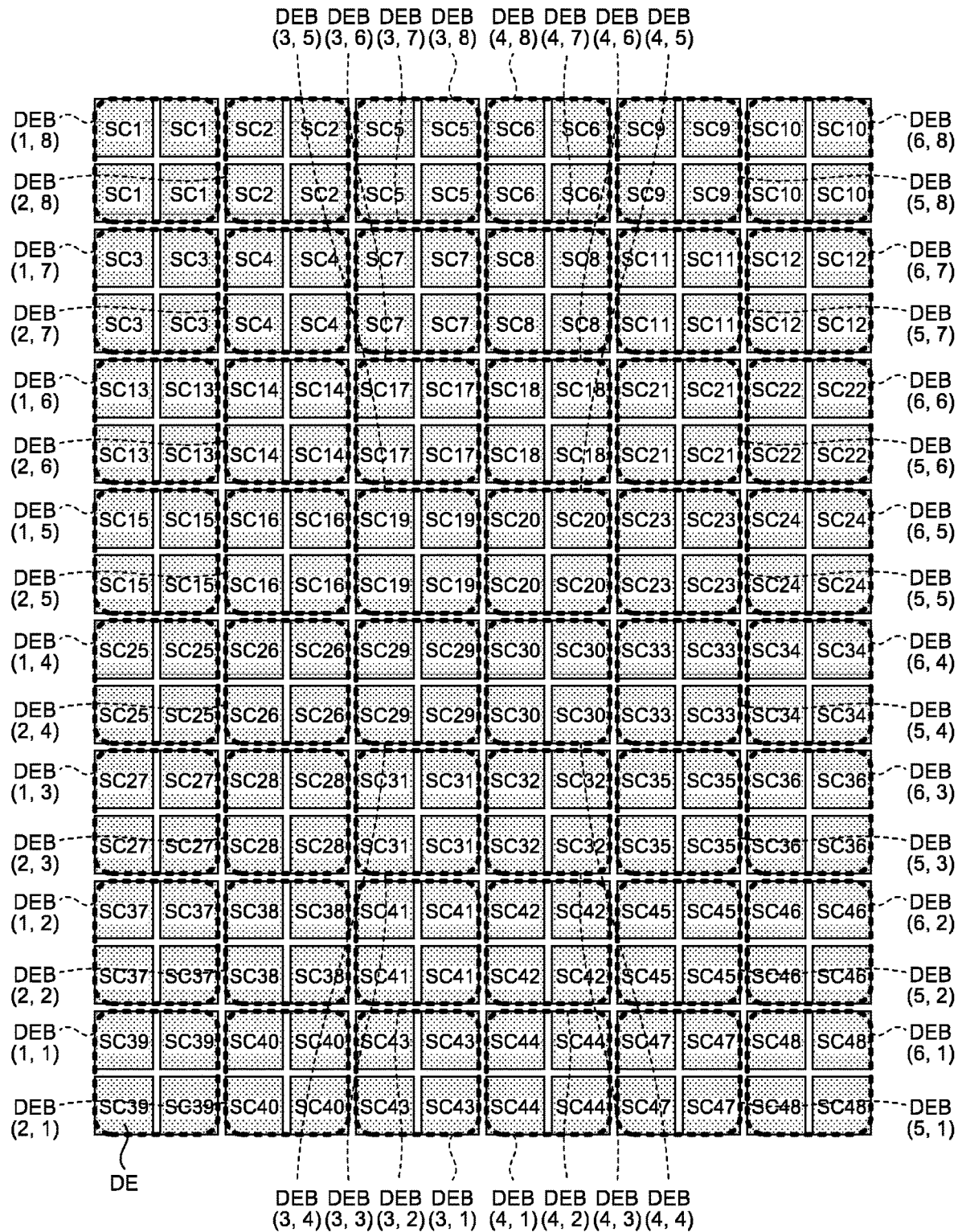
FIG. 25 is a diagram for explaining the analog front ends coupled to the respective detection electrode blocks in a case where the detection electrodes are electrically combined into units of 2×2 detection electrodes to serve as the detection electrode blocks.

FIG. 25 is a diagram for explaining the analog front ends coupled to the respective detection electrode blocks in a case where the detection electrodes are electrically combined into units of 2×2 detection electrodes to serve as the detection electrode blocks. In FIG. 25, 12×16 detection electrodes DE are electrically combined into units of 2×2 detection electrodes DE to serve as the detection electrode blocks DEB. As a result, 6×8 detection electrode blocks DEB are arrayed in a matrix (row-column configuration).

The detection electrodes DE included in the detection electrode block DEB(1, 1) are electrically coupled to the analog front end SC39. The detection electrodes DE included in the detection electrode block DEB(1, 2) are electrically coupled to the analog front end SC37. Similarly, the detection electrodes DE included in the other detection electrode blocks DEB are electrically coupled to the analog front ends SC denoted by the reference numerals written in the detection electrodes DE in FIG. 25.

At Step ST13, the detection circuit 40 detects self-capacitance in accordance with the detection signals Vdet supplied from the detection electrode blocks DEB via 48 analog front ends SC out of the 48 analog front ends SC, as illustrated in FIG. 25. The detection circuit 40 thus determines which detection electrode block DEB out of the detection electrode blocks DEB corresponds to the position of the target object CQ.

Subsequently, the detection circuit 40 determines whether the detection signals Vdet supplied from the respective detection electrode blocks DEB illustrated in FIG. 25 are lower than a predetermined threshold ΔVthb (Step ST14). If the detection signals Vdet supplied from the respective detection electrode blocks DEB illustrated in FIG. 25 are lower than the predetermined threshold ΔVthb (Yes at Step ST14), the detection circuit 40 returns to the processing at Step ST11. If the detection signals Vdet supplied from the respective detection electrode blocks DEB illustrated in FIG. 25 are lower than the predetermined threshold ΔVthb, the distance between the target object CQ and the detection electrodes DE is assumed to be large. The larger the distance between the target object CQ and the detection electrodes DE, the larger the number of wires 51, via which the control circuit 11 transmits the control signals to the coupling circuit 18, and which are simultaneously electrically coupled to one analog front end SC. This processing increases detection sensitivity, thereby increasing a possibility of detecting the target object CQ.

If the detection signals Vdet supplied from the respective detection electrode blocks DEB illustrated in FIG. 25 are equal to or higher than the predetermined threshold ΔVthb (No at Step ST14), the detection circuit 40 performs the processing at Step ST15.

Subsequently, the detection circuit 40 determines whether the detection signals Vdet supplied from the respective detection electrode blocks DEB illustrated in FIG. 25 are equal to or higher than a predetermined threshold ΔVthc that is larger than the predetermined threshold ΔVthb (Step ST15). If the detection signals Vdet supplied from the respective detection electrode blocks DEB illustrated in FIG. 25 are lower than the predetermined threshold ΔVthc (No at Step ST15), the detection circuit 40 returns to the processing at Step ST13.

If the detection circuit 40 determines that the detection signals Vdet supplied from the respective detection electrode blocks DEB illustrated in FIG. 25 are equal to or higher than the predetermined threshold ΔVthc (Yes at Step ST15), the control circuit 11 performs touch detection (Step ST16). If the detection signals Vdet supplied from the respective detection electrode blocks DEB illustrated in FIG. 25 are equal to or higher than the predetermined threshold ΔVthc (Yes at Step ST15), the distance between the target object CQ and the detection electrodes DE is assumed to be small. The smaller the distance between the target object CQ and the detection electrodes DE, the smaller the number of wires 51, via which the control circuit 11 transmits the control signals to the coupling circuit 18, and which are simultaneously electrically coupled to one analog front end SC.

At Step ST16, similarly to the first embodiment, the coupling circuit 18 sequentially switches the detection electrodes DE supplied with the detection drive signals Vself. As illustrated in FIG. 23, the coupling circuit 18 according to the second embodiment selects and couples the detection electrodes DE included in one row to the analog front ends SC and sequentially shifts the detection electrodes DE included in one row from Step ST161 to Step ST164. While the coupling circuit 18 sequentially shifts row by row the detection electrodes DE included in one row in the present disclosure, it may sequentially shift column by column the detection electrodes DE included in one column.

Figure 26A:
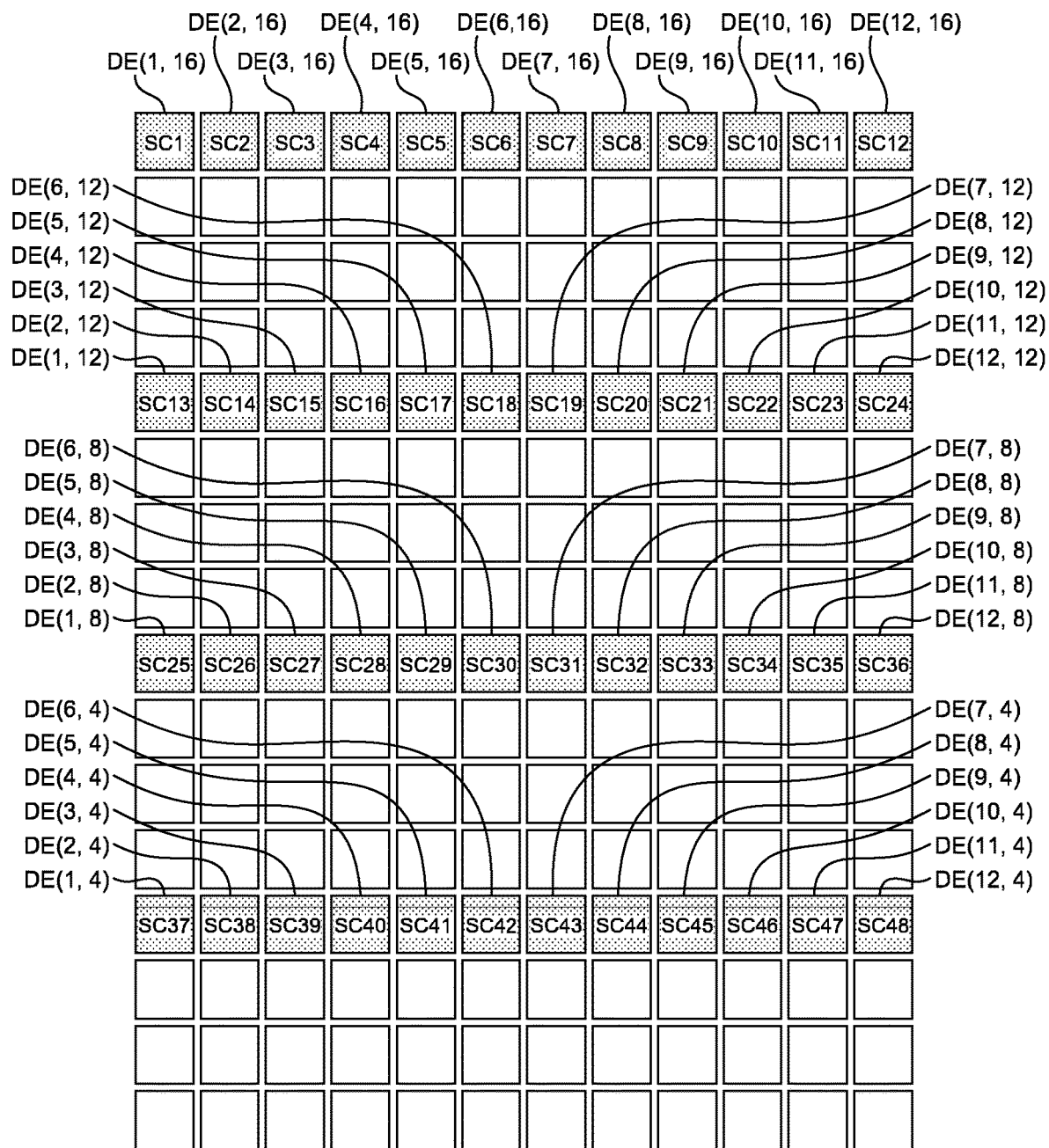
FIGS. 26A to 26D are diagrams for explaining a state where the detection electrodes supplied with the detection drive signals are sequentially switched.

FIGS. 26A to 26D are diagrams for explaining a state where the detection electrodes supplied with the detection drive signals are sequentially switched. As illustrated in FIG. 26A, the coupling circuit 18 selects the detection electrodes DE in the fourth, the eighth, the twelfth, and the sixteenth rows. The coupling circuit 18 couples the detection electrodes DE in the fourth, the eighth, the twelfth, and the sixteenth rows to the analog front ends SC denoted by the reference numerals written in the respective detection electrodes DE in FIG. 26A (refer to Step ST161 in FIG. 23).

Figure 26B:
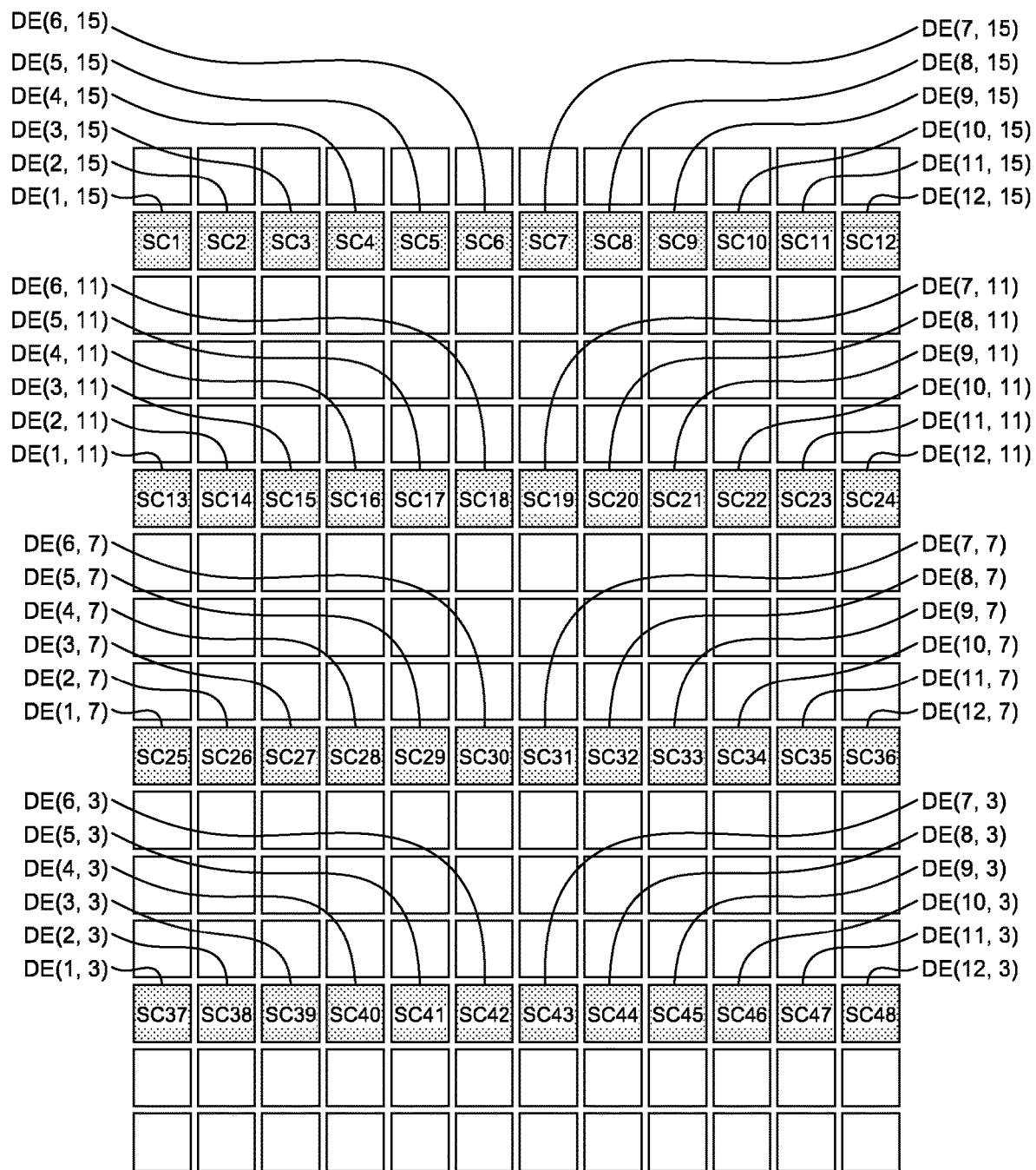

As illustrated in FIG. 26B, the coupling circuit 18 selects the detection electrodes DE in the third, the seventh, the eleventh, and the fifteenth rows. The coupling circuit 18 couples the detection electrodes DE in the third, the seventh, the eleventh, and the fifteenth rows to the analog front ends SC denoted by the reference numerals written in the respective detection electrodes DE in FIG. 26B (refer to Step ST162 in FIG. 23).

Figure 26C:
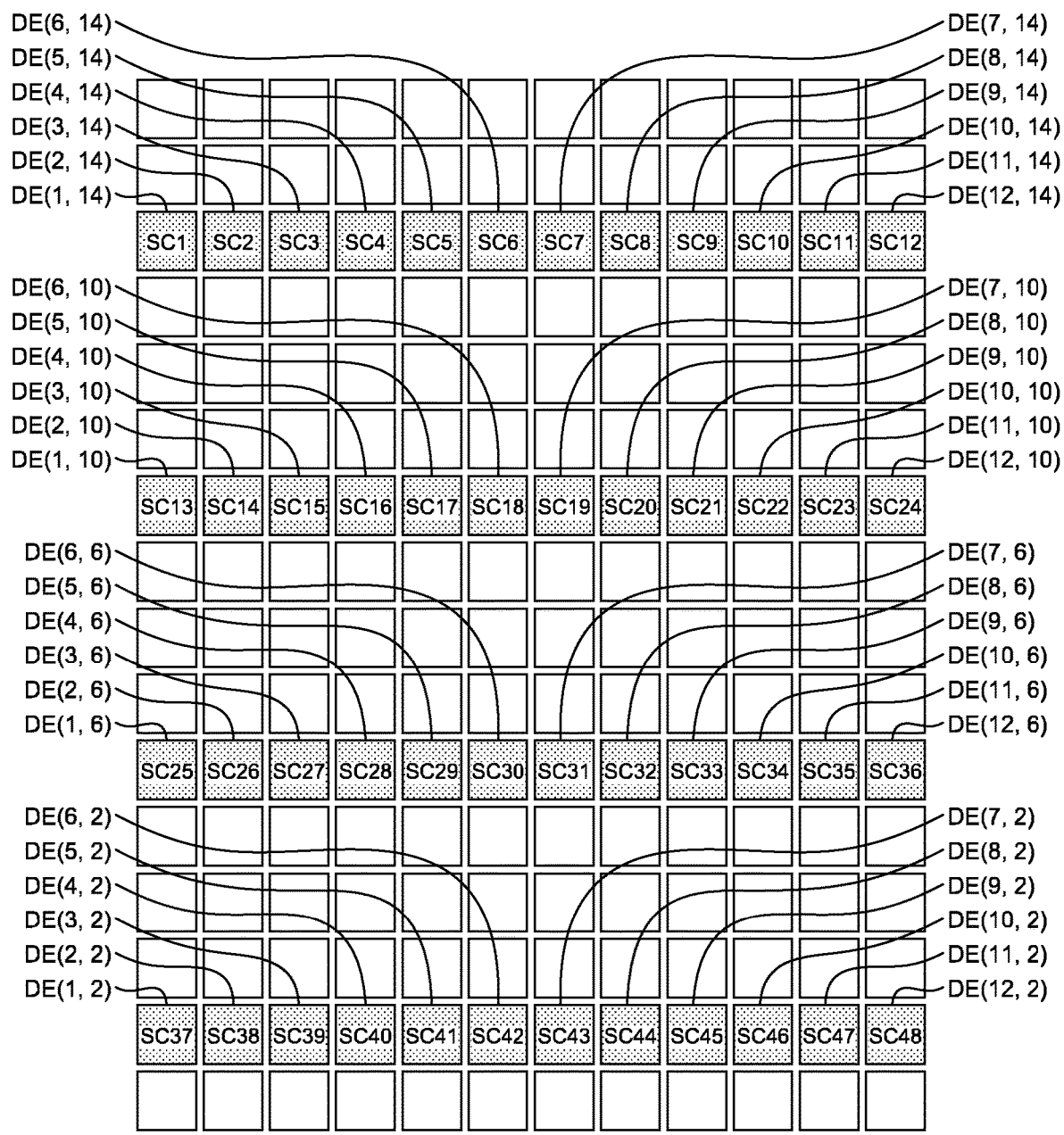

As illustrated in FIG. 26C, the coupling circuit 18 selects the detection electrodes DE in the second, the sixth, the tenth, and the fourteenth rows. The coupling circuit 18 couples the detection electrodes DE in the second, the sixth, the tenth, and the fourteenth rows to the analog front ends SC denoted by the reference numerals written in the respective detection electrodes DE in FIG. 26C (refer to Step ST163 in FIG. 23).

Figure 26D:
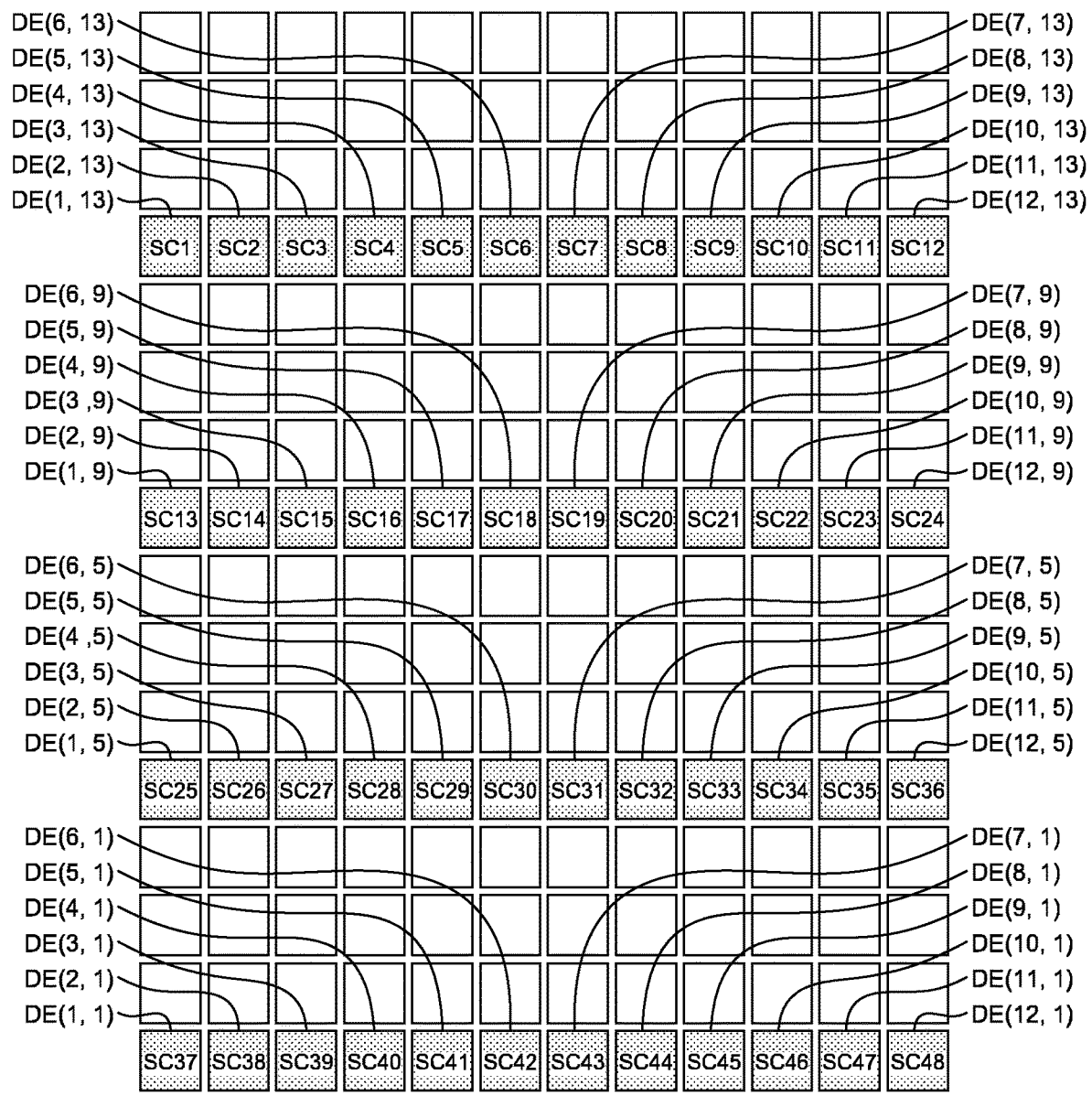

As illustrated in FIG. 26D, the coupling circuit 18 selects the detection electrodes DE in the first, the fifth, the ninth, and the thirteenth rows. The coupling circuit 18 couples the detection electrodes DE in the first, the fifth, the ninth, and the thirteenth rows to the analog front ends SC denoted by the reference numerals written in the respective detection electrodes DE in FIG. 26D (refer to Step ST164 in FIG. 23).

In FIGS. 26A to 26D, the detection electrodes DE without any reference numeral of an analog front end SC are coupled to no analog front end SC.

As described above, the detection electrodes DE included in one row are sequentially shifted. Consequently, the detection circuit 40 can obtain the signal intensities of the detection signals Vdet of all the detection electrodes DE even if the number of the analog front ends SC is smaller than that of all the detection electrodes DE.

Subsequently, the detection circuit 40 determines whether the detection signals Vdet supplied from the detection electrode blocks DEB illustrated in FIGS. 26A to 26D are lower than a predetermined threshold ΔVthd (Step ST17). If the detection signals Vdet supplied from the detection electrode blocks DEB illustrated in FIGS. 26A to 26D are lower than the predetermined threshold ΔVthd (Yes at Step ST17), the detection circuit 40 returns to the processing at Step ST13. This processing increases detection sensitivity, thereby increasing a possibility of detecting the target object CQ.

If the detection circuit 40 determines that the detection signals Vdet supplied from the detection electrode blocks DEB illustrated in FIGS. 26A to 26D are equal to or higher than the predetermined threshold ΔVthd (No at Step ST17), the detection circuit 40 extracts the coordinates of the target object CQ and then terminates the processing.

Third Embodiment

Figure 27:
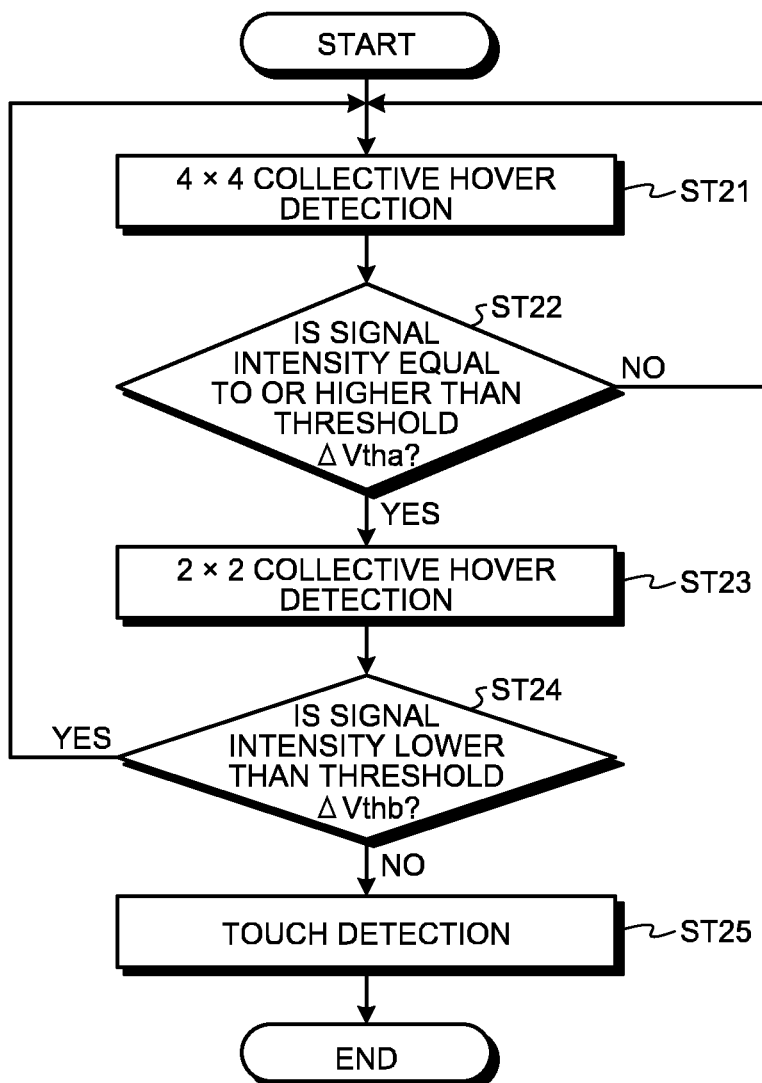
FIG. 27 is a flowchart for an exemplary operation performed by the display device according to a third embodiment of the present disclosure.
Figure 28:
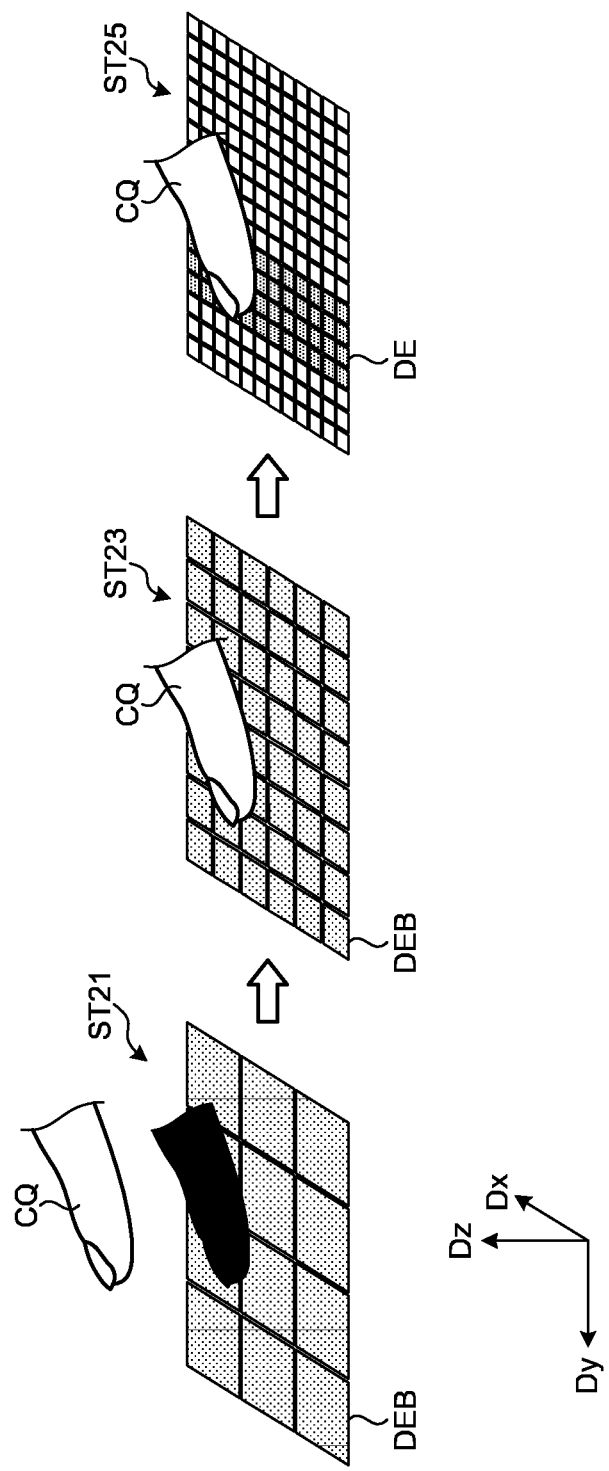
FIG. 28 is a diagram for schematically explaining changes in the state of the detection electrodes coupled to the analog front ends.

FIG. 27 is a flowchart for an exemplary operation performed by the display device according to a third embodiment of the present disclosure. FIG. 28 is a diagram for schematically explaining changes in the state of the detection electrodes coupled to the analog front ends. Components described in the first and the second embodiments are denoted by like reference numerals, and explanation thereof is omitted.

Also in FIG. 27, the display periods Pd and the detection periods Pt are provided such that each of the display periods Pd and each of the detection periods Pt are alternately arranged in a time-division manner. Detailed explanation of the display period Pd is omitted because it is the same as that described in the first embodiment. In the detection period Pt according to the third embodiment, the detection electrodes are electrically combined into units of 4×4 detection electrodes by the coupling circuit 18 to serve as the detection electrode blocks DEB. The control circuit 11 performs hover detection (Step ST21). Detailed explanation of the processing at Step ST21 is omitted because it is the same as the processing at Step ST11.

Subsequently, the detection circuit 40 calculates the intensities of the supplied detection signals Vdet, compares the intensities of the detection signals Vdet with the predetermined threshold ΔVtha, and determines whether the signal intensities are equal to or higher than the predetermined threshold ΔVtha (Step ST22).

If the signal intensity of any one of the detection signals Vdet is lower than the threshold ΔVtha (No at Step ST22), the control circuit 11 returns to the processing at Step ST21. If the signal intensity of any one of the detection signals Vdet is equal to or higher than the threshold ΔVtha (Yes at Step ST22), the detection electrodes are electrically combined into units of 2×2 detection electrodes by the coupling circuit 18. As illustrated in FIG. 28, the 2×2 detection electrodes serve as one detection electrode block DEB smaller than the detection electrode block DEB obtained at Step ST21. The control circuit 11 then performs hover detection (Step ST23).

Subsequently, the detection circuit 40 determines whether the detection signals Vdet supplied from the respective detection electrode blocks DEB illustrated in FIG. 28 are lower than the predetermined threshold ΔVthb (Step ST24). If the detection signals Vdet supplied from the respective detection electrode blocks DEB illustrated in FIG. 28 are lower than the predetermined threshold ΔVthb (Yes at Step ST24), the detection circuit 40 returns to the processing at Step ST21. This processing increases detection sensitivity, thereby increasing a possibility of detecting the target object CQ.

If the detection signals Vdet supplied from the respective detection electrode blocks DEB illustrated in FIG. 28 are equal to or higher than the predetermined threshold ΔVthb (No at Step ST24), the detection circuit 40 performs the processing at Step ST25.

If the detection circuit 40 determines that the detection signals Vdet supplied from the respective detection electrode blocks DEB illustrated in FIG. 28 are equal to or higher than the predetermined threshold ΔVthb (No at Step ST24), the control circuit 11 performs touch detection (Step ST25).

As illustrated in FIG. 28, the third embodiment performs touch detection on the detection electrode block DEB determined to have a signal intensity equal to or higher than the predetermined threshold ΔVthb at Step ST24 and on the detection electrodes DE around the detection electrode block DEB.

As described above, in hover detection, the control circuit 11 determines the detection electrodes DE on which touch detection is performed based on the detection electrode block DEB determined to have a signal intensity equal to or higher than the predetermined threshold ΔVthb and on a region around the detection electrode block DEB. The control circuit 11 performs touch detection on the determined detection electrodes DE and the detection electrodes DE adjacent to the determined detection electrodes DE.

Consequently, the third embodiment need not detect capacitance of all the detection electrodes DE and can shorten the detection period Pt. Alternatively, the third embodiment may increase the number of times of detection performed on a certain detection electrode DE to be a detection target in the detection period Pt, thereby increasing detection accuracy.

Figure 29:
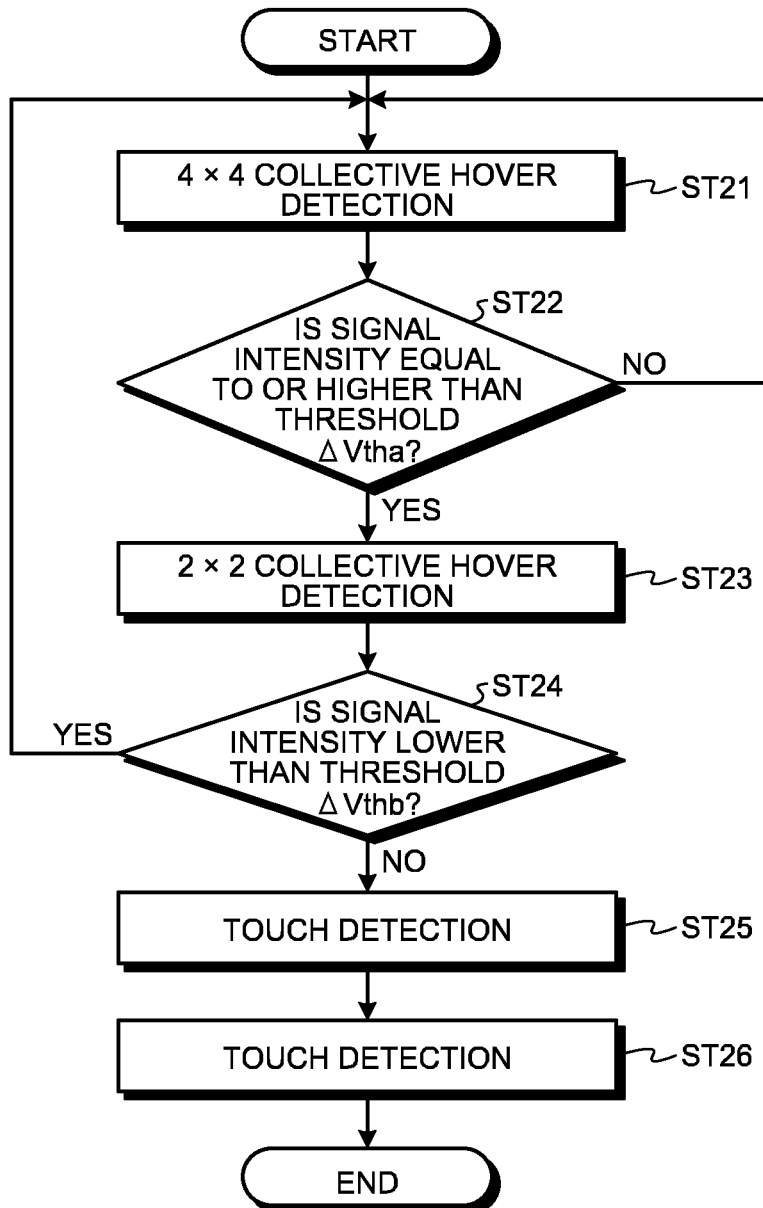
FIG. 29 is a flowchart for an exemplary operation performed by the display device according to a modification of the third embodiment.
Figure 30:
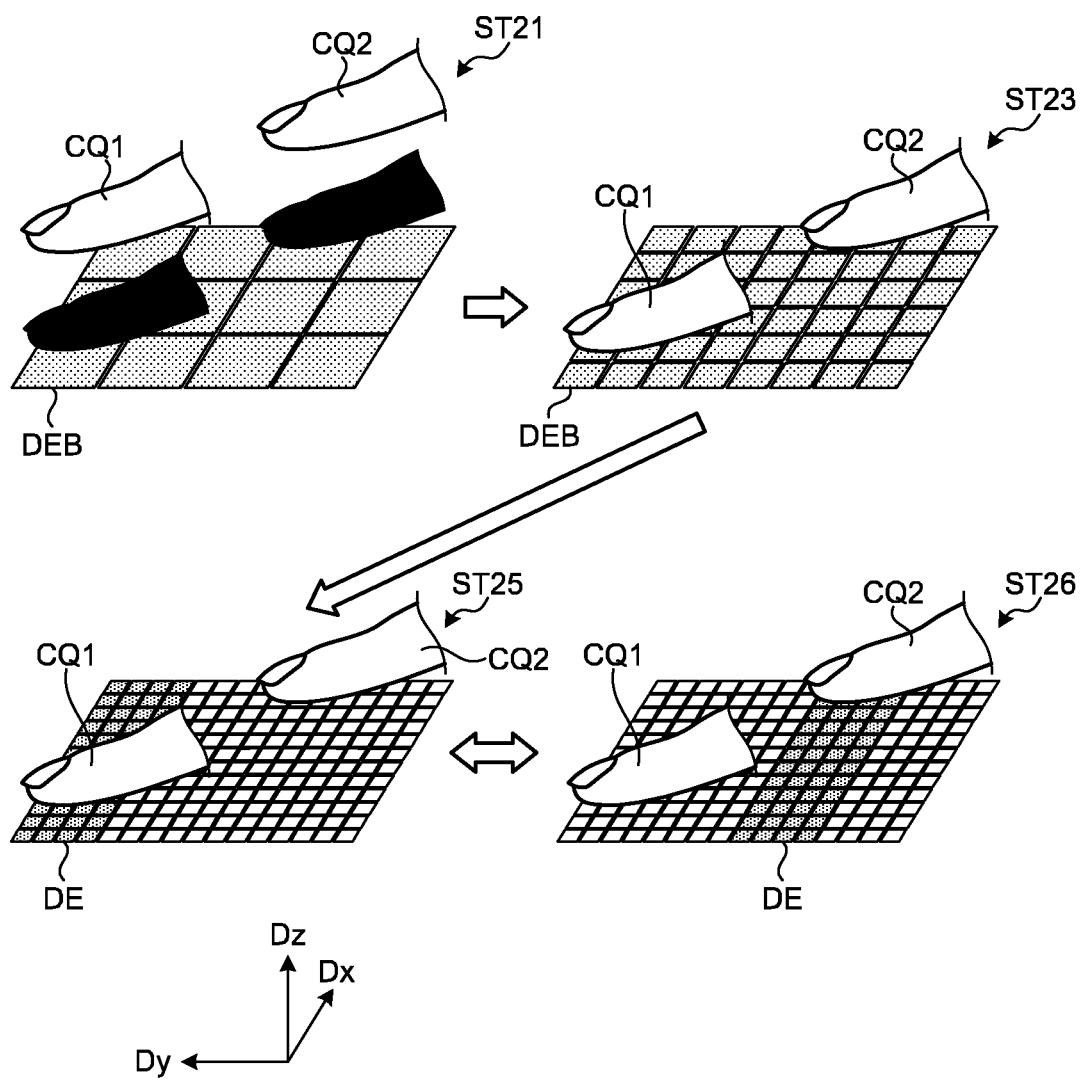
FIG. 30 is a diagram for schematically explaining changes in the state of the detection electrodes coupled to the analog front ends according to the modification of the third embodiment.

FIG. 29 is a flowchart for an exemplary operation performed by the display device according to a modification of the third embodiment. FIG. 30 is a diagram for schematically explaining changes in the state of the detection electrodes coupled to the analog front ends according to the modification of the third embodiment. Components described in the third embodiment are denoted by like reference numerals, and explanation thereof is omitted.

The modification of the third embodiment is different from the third embodiment in that a plurality of objects to be detected are present. The processing from Step ST21 to Step ST24 in FIG. 29 is the same as the processing according to the third embodiment. As illustrated in FIG. 30, a target object CQ1 and a target object CQ2 are in the present state.

As illustrated in FIG. 30, if the number of detection electrodes DE included in the detection electrode block DEB determined to have a signal intensity equal to or higher than the predetermined threshold $\Delta$Vthb at Step ST24 and the number of detection electrodes DE around the detection electrode block DEB exceed the number of analog front ends SC included in the coupling circuit 18, the modification of the third embodiment performs touch detection on two regions.

As illustrated in FIG. 30, the control circuit 11 performs touch detection on the detection electrode block DEB determined to have a signal intensity equal to or higher than the predetermined threshold $\Delta$Vthb, which is assumed to be caused by the target object CQ1, and on the region around the detection electrode block DEB.

Figure 31:
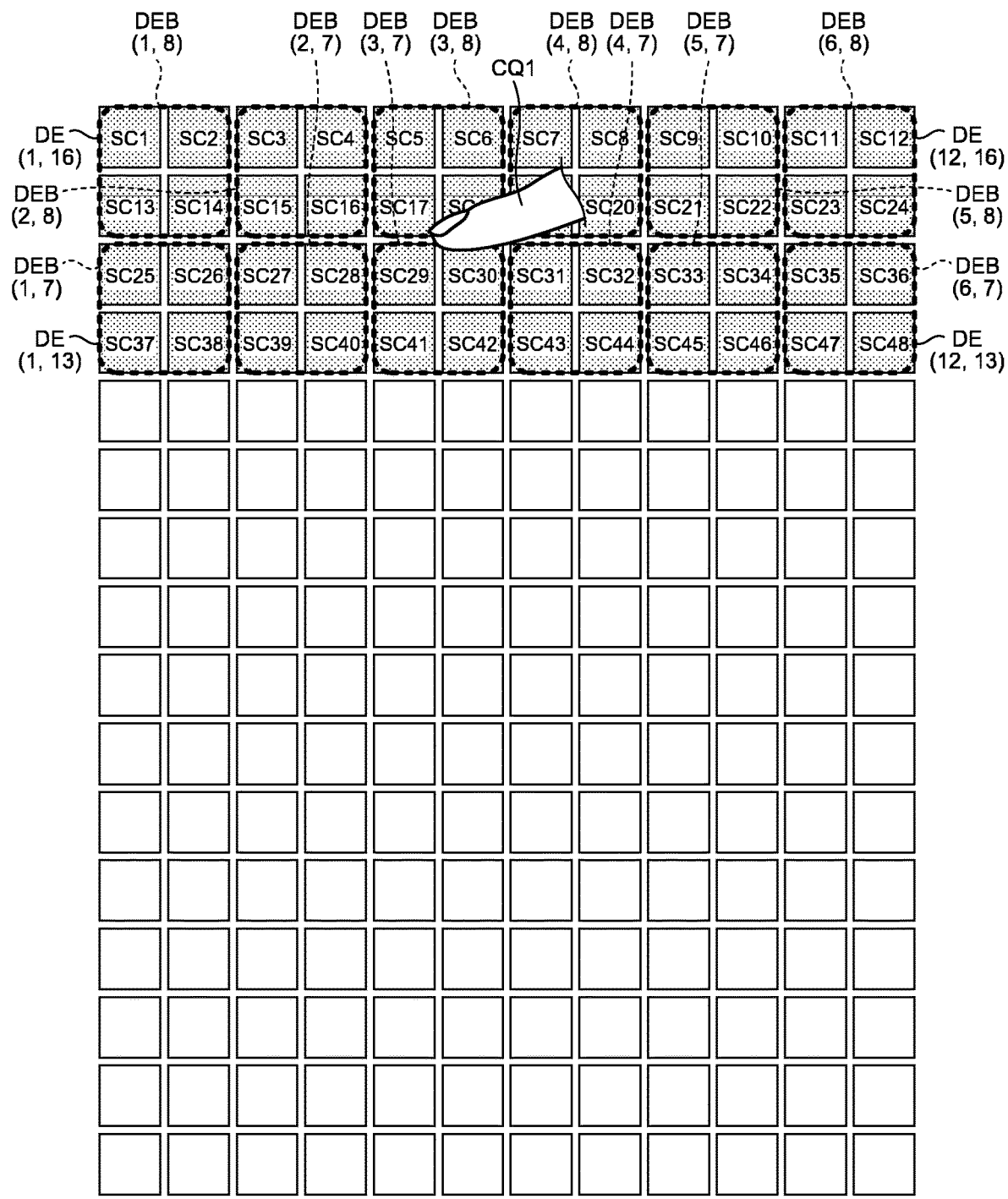
FIG. 31 is a diagram for explaining an example of a region on which touch detection is performed.

FIG. 31 is a diagram for explaining an example of the region on which touch detection is performed. As illustrated in FIG. 31, the detection electrode block determined to have a signal intensity equal to or higher than the predetermined threshold $\Delta$Vthb is the detection electrode blocks DEB(3, 7), DEB(3, 8), DEB(4, 7), and DEB(4, 8). The coupling circuit 18 couples the analog front ends SC41, SC42, SC43, SC44, SC29, SC30, SC31, SC32, SC17, SC18, SC19, SC20, SC5, SC6, SC7, and SC8 to the detection electrodes DE included in the corresponding detection electrode blocks DEB(3, 7), DEB(3, 8), DEB(4, 7), and DEB(4, 8). The detection sensitivity in coordinate extraction is lower in detecting the target object CQ1 in units of the detection electrode blocks DEB than in units of the detection electrodes DE. For this reason, it is preferable to perform touch detection also on the detection electrodes DE around the detection electrode blocks DEB(3, 7), DEB(3, 8), DEB(4, 7), and DEB(4, 8).

The coupling circuit 18 electrically couples the detection electrodes DE surrounded by the detection electrodes DE(1, 13), DE(1, 16), DE(12, 13), and DE(12, 16) to the analog front ends SC denoted by the reference numerals written in the respective detection electrodes DE in FIG. 31.

Subsequently, as illustrated in FIG. 30, the control circuit 11 performs touch detection on the detection electrode block DEB determined to have a signal intensity equal to or higher than the predetermined threshold $\Delta$Vthb and on the region around the detection electrode block DEB in another region different from that determined to be a target at Step ST25 (Step ST26).

Fourth Embodiment

Figure 32:
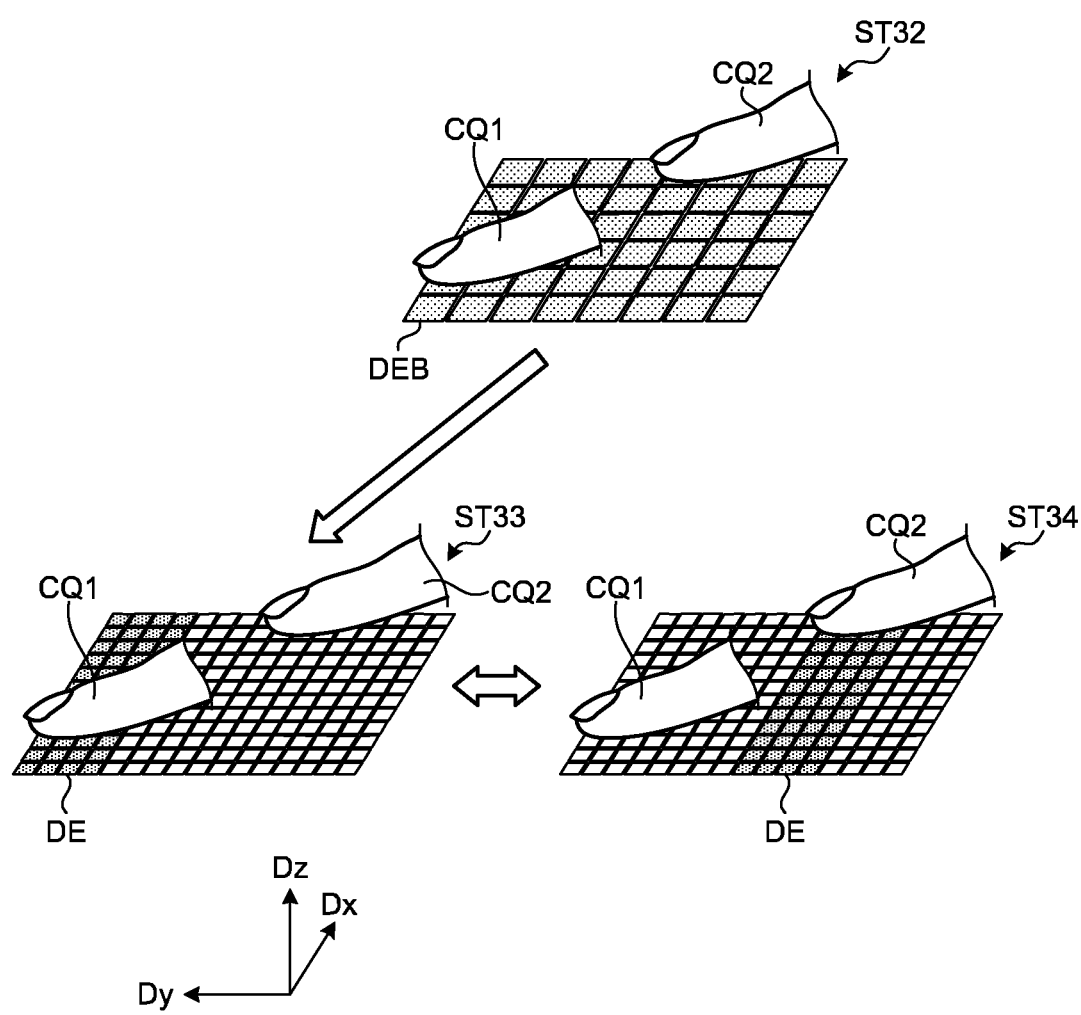
FIG. 32 is a diagram for schematically explaining changes in the state of the detection electrodes coupled to the analog front ends according to a fourth embodiment of the present disclosure.
Figure 33:
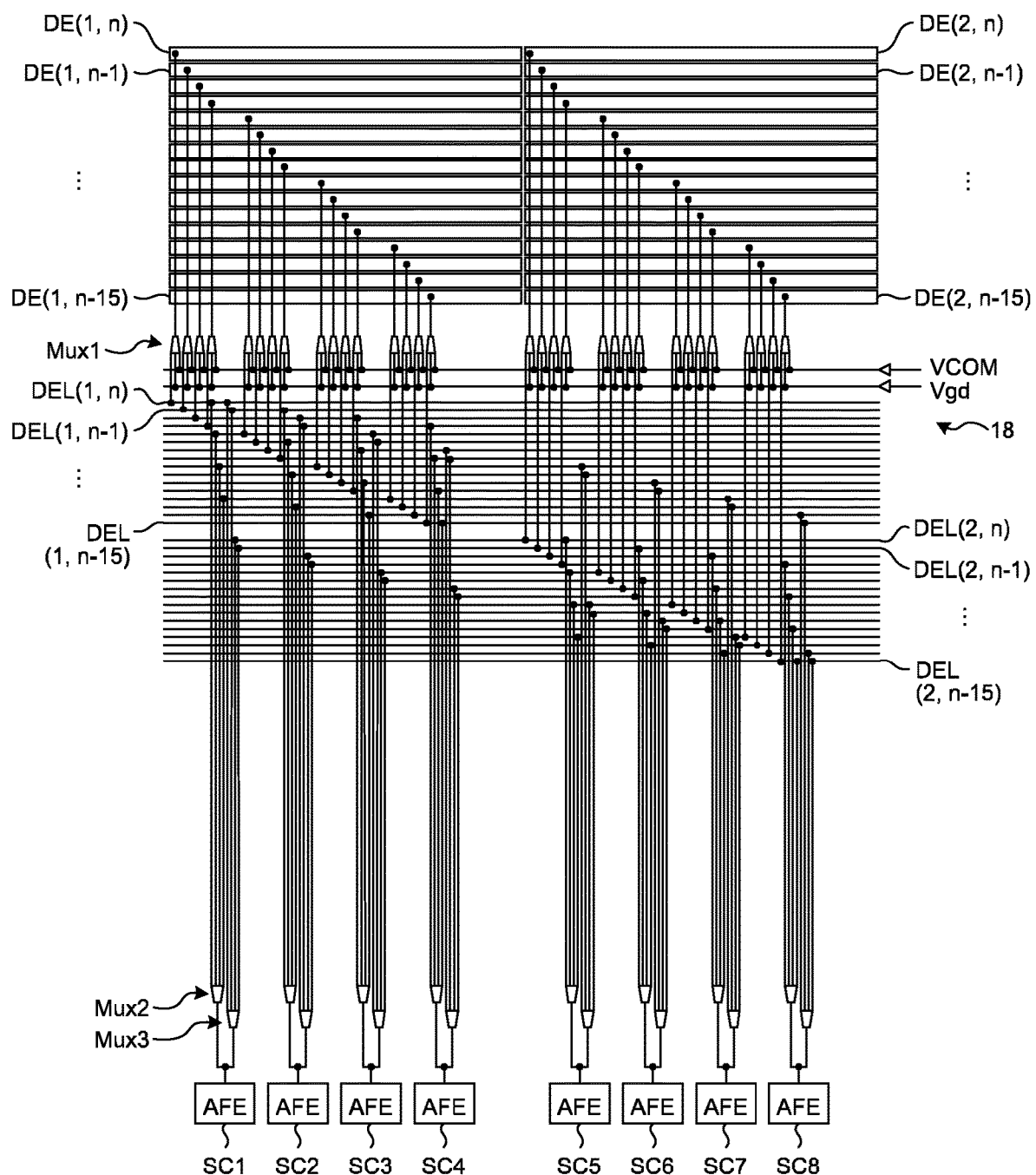
FIG. 33 is a diagram for explaining the coupling circuit according to the fourth embodiment.
Figure 34:
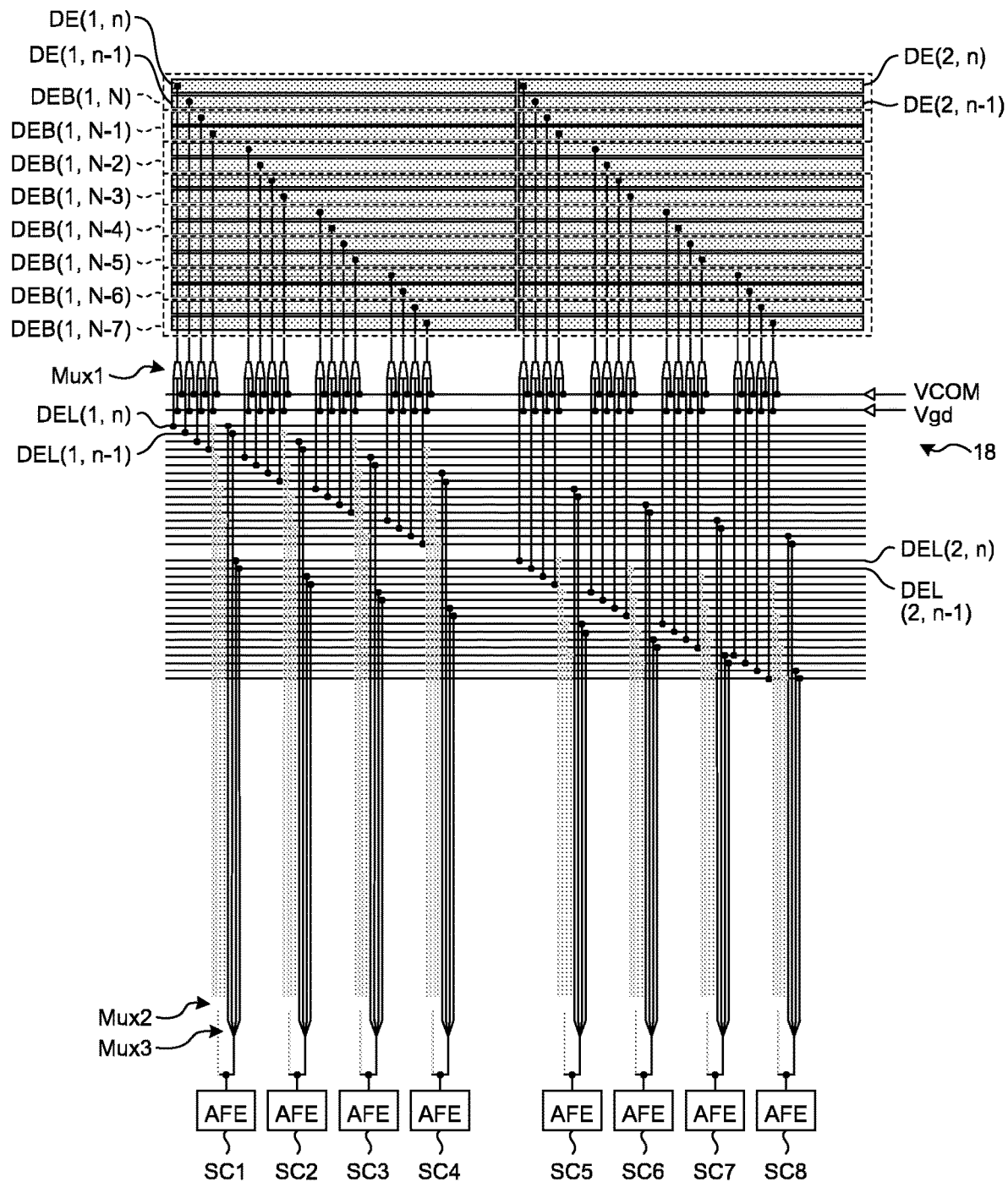
FIG. 34 is a diagram for schematically explaining a change in the coupling circuit according to the fourth embodiment in 2×2 collective hover detection.
Figure 35:
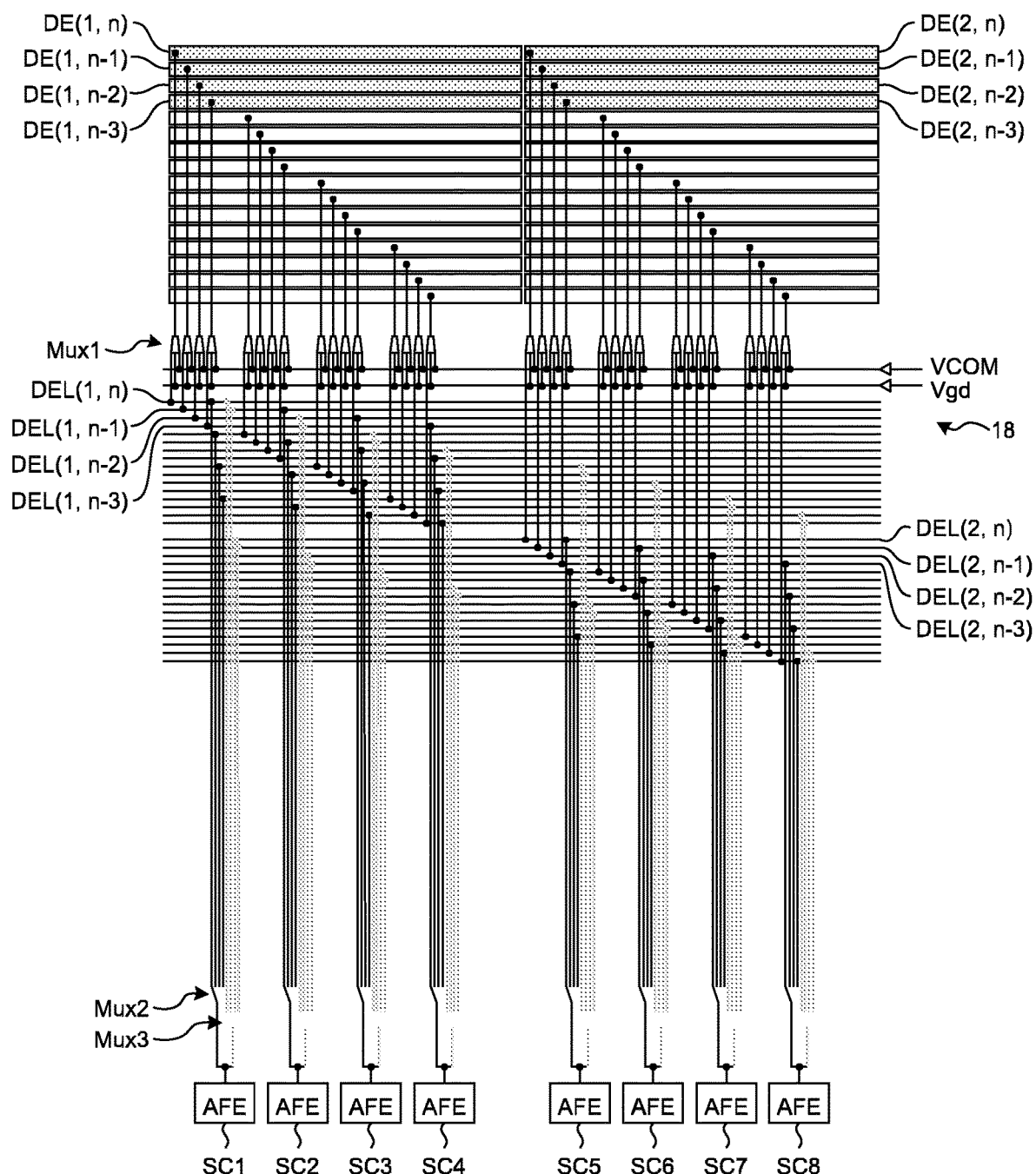
FIG. 35 is a diagram for schematically explaining a change in the state of the coupling circuit according to the fourth embodiment in a first state, in which the detection electrodes are sequentially switched.

FIG. 32 is a diagram for schematically explaining changes in the state of the detection electrodes coupled to the analog front ends according to a fourth embodiment of the present disclosure. FIG. 33 is a diagram for explaining the coupling circuit according to the fourth embodiment. FIG. 34 is a diagram for schematically explaining a change in the coupling circuit according to the fourth embodiment in 2×2 collective hover detection. FIG. 35 is a diagram for schematically explaining a change in the state of the coupling circuit according to the fourth embodiment in a first state, in which the detection electrodes are sequentially switched. Components described in the first to the third embodiments are denoted by like reference numerals, and explanation thereof is omitted. Detection electrodes DE(1, n) to DE(1, n−15) and DE(2, n) to DE(2, n−15) illustrated in FIGS. 33 to 35 exemplify part of the detection electrodes DE illustrated in FIG. 13, and the specific shape thereof is a rectangular shape as illustrated in FIG. 13.

As illustrated in FIG. 32, the coupling circuit 18 illustrated in FIG. 33 switches between a step for hover detection (Step ST32) and a step for touch detection (Step ST33 or Step ST34).

The coupling circuit 18 illustrated in FIG. 33 includes switches Mux1, Mux2, and Mux3. The coupling circuit 18 illustrated in FIG. 33 includes a relay wire DEL(1, n) coupled to the detection electrode DE(1, n) via the switch Mux1. Similarly, the detection electrodes DE(1, n−1) to DE(1, n−15) are coupled to relay wires DEL(1, n−1) to DEL(1, n−15), respectively, via the switch Mux1. The detection electrodes DE(2, n) to DE(2, n−15) are coupled to relay wires DEL(2, n) to DEL(2, n−15), respectively, via the switch Mux1. The term "relay wire DEL" is used to simply explain any one of the relay wires DEL(1, n) to DEL(1, n−15) and DEL(2, n) to DEL(2, n−15).

The switch Mux1 couples the detection electrodes DE to the supply wiring for the drive signals Vcomdc for display, the supply wiring for the guard signals Vgd, or the respective relay wires DEL coupled to the analog front ends SC. The relay wire DEL couples the switch Mux1 and the switch Mux2 and couples the switch Mux1 and the switch Mux3. Opening and closing of the switches Mux1, Mux2, and Mux3 allow any one of the supply wiring for the drive signals Vcomdc for display, the supply wiring for the guard signals Vgd, and the analog front end SC to be coupled to one detection electrode DE in a time-division manner.

At Step ST32 illustrated in FIG. 32, the switch Mux2 decouples the relay wires DEL from the analog front ends SC. As illustrated in FIG. 34, the switch Mux3 and the relay wires DEL electrically couple the detection electrodes DE disposed side by side in the first direction Dx and the second direction Dy. The switch Mux3 and the relay wires DEL thus combine 2×2 detection electrodes DE, thereby forming detection electrode blocks DEB(1, N) to DEB(1, N−7). The detection electrode blocks DEB(1, N) to DEB(1, N−7) are coupled to the analog front ends SC1 to SC7, respectively. The control circuit 11 illustrated in FIG. 1 then performs hover detection (Step ST32).

If the detection signals Vdet supplied from the respective detection electrode blocks DEB illustrated in FIG. 34 are equal to or higher than the predetermined threshold ΔVthb, the detection circuit 40 performs the processing at Step ST33.

At Step ST33, the fourth embodiment performs touch detection on the detection electrode block DEB determined to have a signal intensity equal to or higher than the predetermined threshold ΔVthb and on the detection electrodes DE around the detection electrode block DEB.

At Step ST33, for example, the detection electrode block DEB(1, N) is determined to have a signal intensity equal to or higher than the predetermined threshold ΔVthb. In this case, as illustrated in FIG. 35, the control circuit 11 performs touch detection on the detection electrodes DE(1, n), DE(1, n−1), DE(2, n), and DE(2, n−1) corresponding to the detection electrode block DEB(1, N) (Step ST33).

The switch Mux3 decouples the relay wires DEL from the analog front ends SC. The switch Mux1 electrically couples the detection electrodes DE(1, n), DE(1, n−1), DE(1, n−2), and DE(1, n−3) to the relay wires DEL(1, n), DEL(1, n−1), DEL(1, n−2), and DEL(1, n−3), respectively. The switch Mux1 couples the other detection electrodes DE to the supply wiring for the guard signals Vgd.

The switch Mux2 couples the analog front end SC1 to the relay wire DEL(1, n) and couples the analog front end SC5 to the relay wire DEL(2, n). The switch Mux2 then couples the analog front end SC1 to the relay wire DEL(1, n−1) and couples the analog front end SC5 to the relay wire DEL(2, n−1). The switch Mux2 then couples the analog front end SC1 to the relay wire DEL(1, n−2) and couples the analog front end SC5 to the relay wire DEL(2, n−2). The switch Mux2 then couples the analog front end SC1 to the relay wire DEL(1, n−3) and couples the analog front end SC5 to the relay wire DEL(2, n−3). With this processing, the detection electrodes DE disposed side by side in the first direction Dx are simultaneously selected and coupled to the analog front ends SC. With the operations of the switch Mux2, the detection electrodes DE coupled to the analog front ends SC are sequentially switched in the second direction Dy.

After the processing at Step ST33 illustrated in FIG. 32, the control circuit 11 performs touch detection on another detection electrode block DEB determined to have a signal intensity equal to or higher than the predetermined threshold ΔVthb at Step ST32 and on the detection electrodes DE around the detection electrode block DEB (Step ST34). Detailed explanation of the processing at Step ST34 is omitted because it is the same as the processing at Step ST33 except that the positions of the detection electrodes DE coupled to the analog front ends SC in the second direction Dy are different.

Fifth Embodiment

Figure 36:
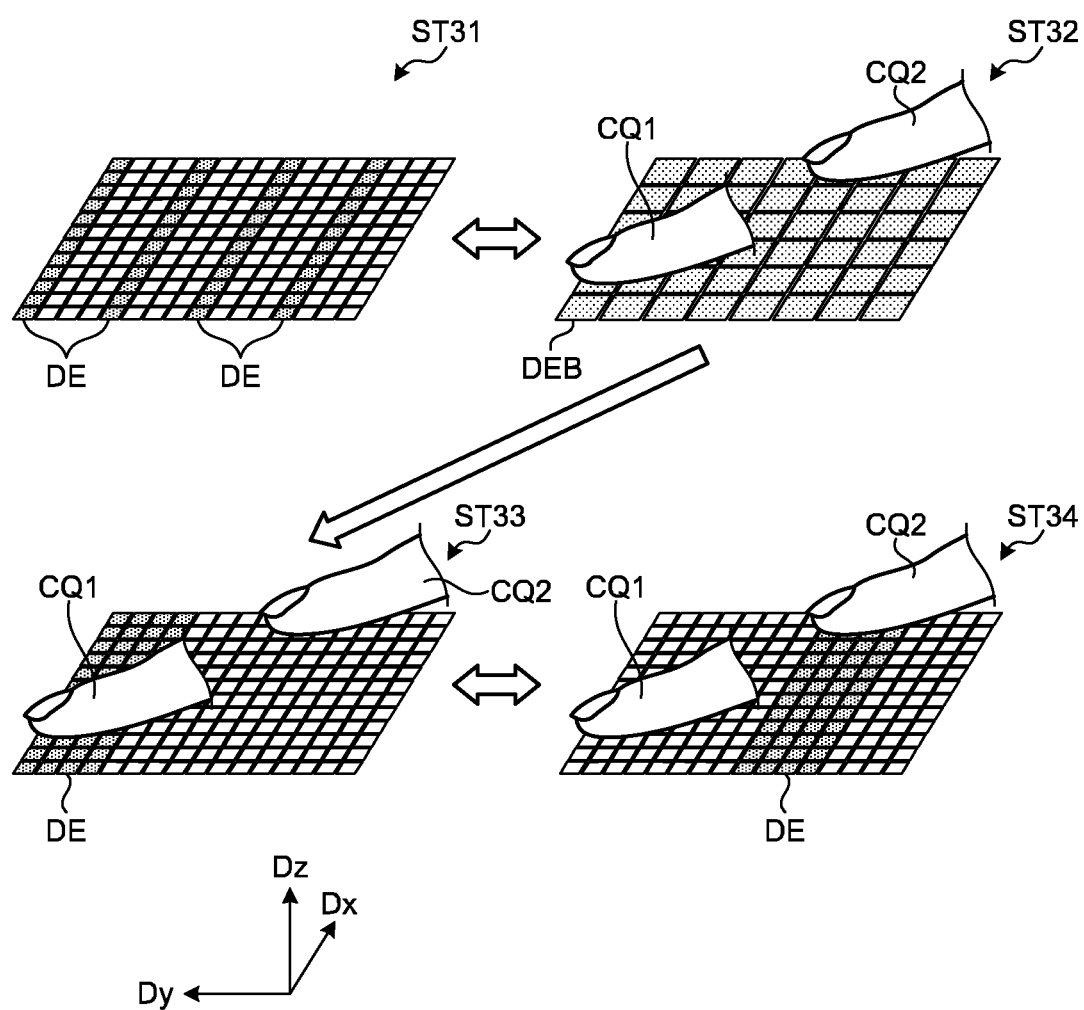
FIG. 36 is a diagram for schematically explaining changes in the state of the detection electrodes coupled to the analog front ends according to a fifth embodiment of the present disclosure.
Figure 37:
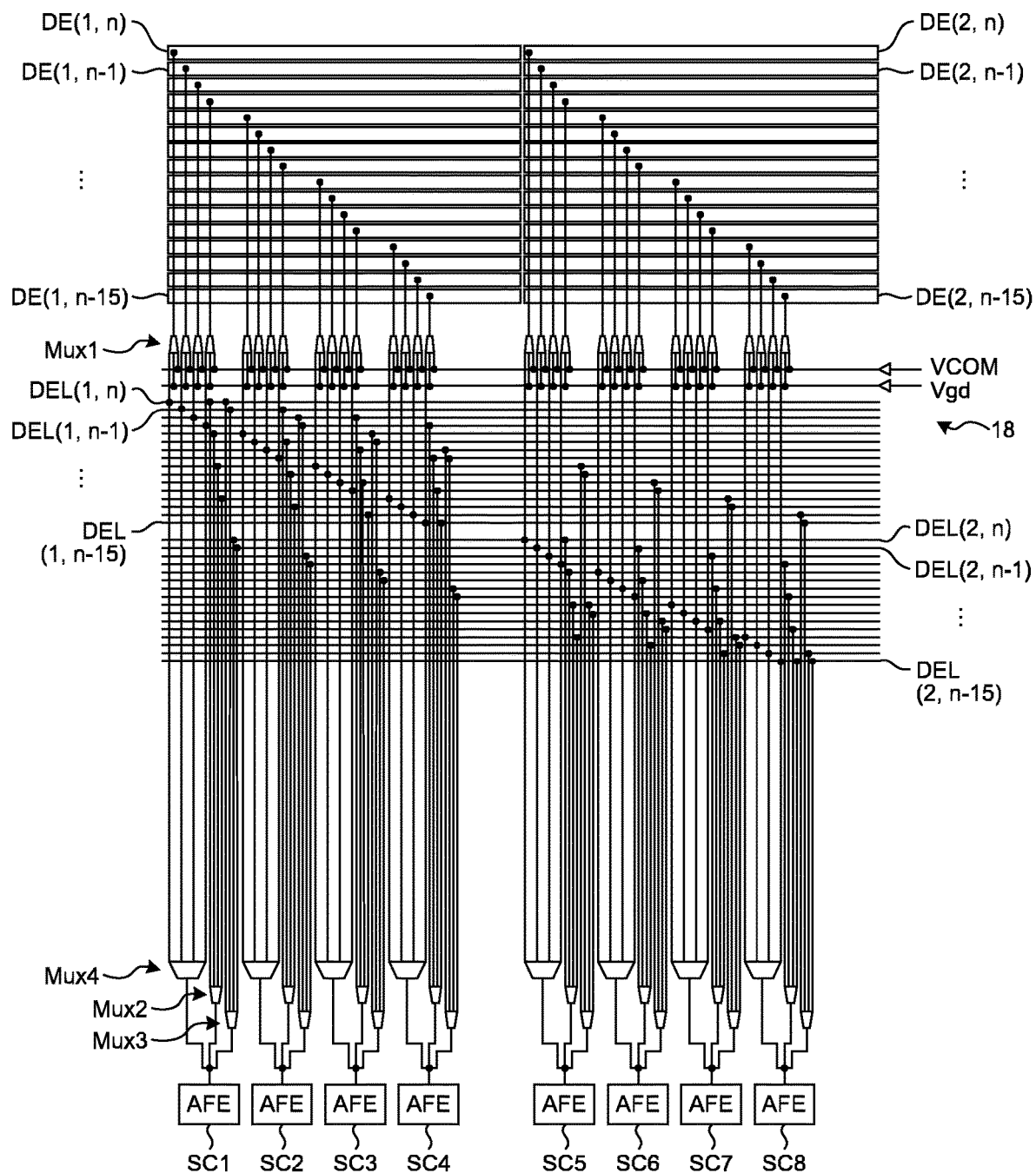
FIG. 37 is a diagram for explaining the coupling circuit according to the fifth embodiment.
Figure 38:
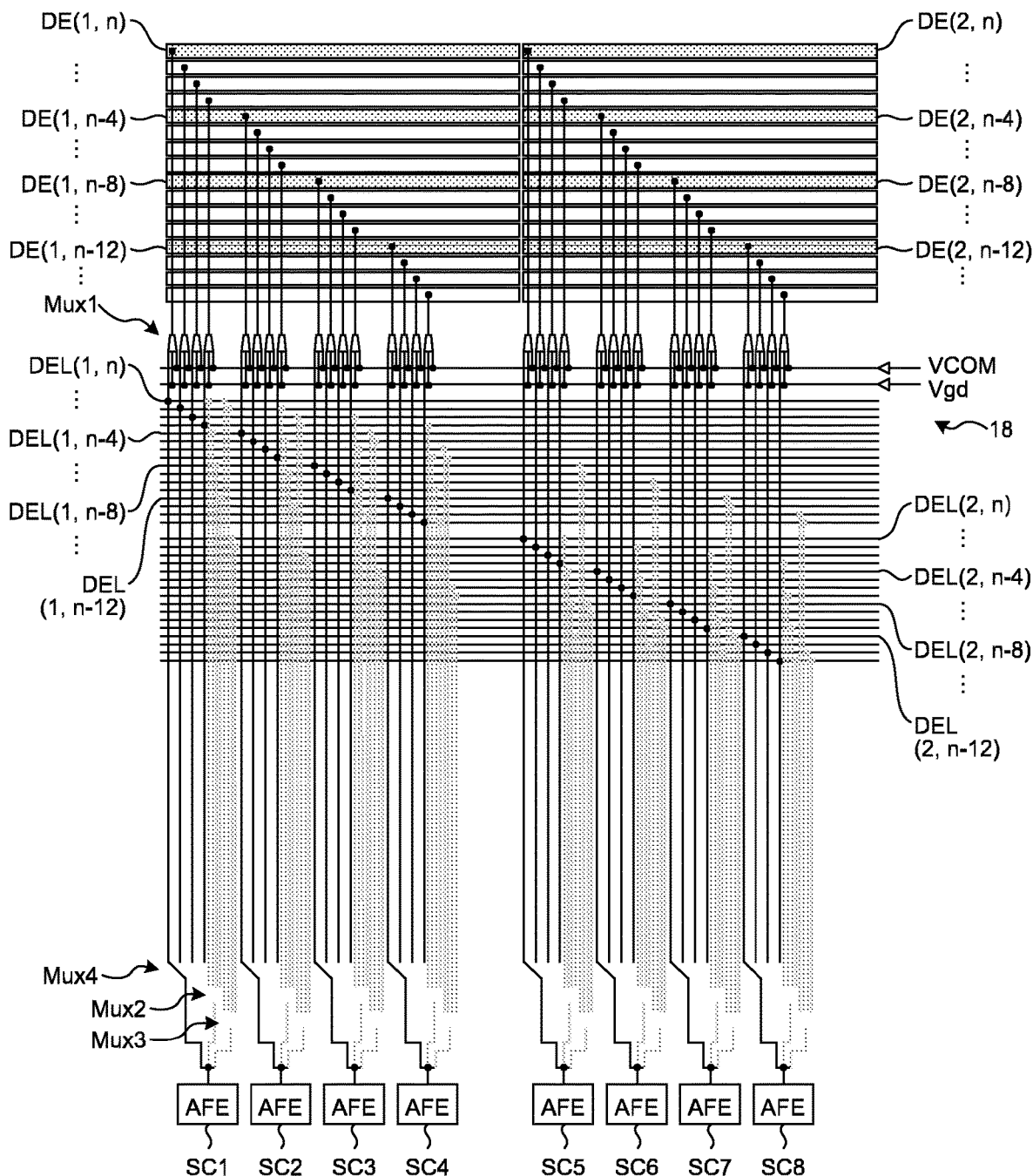
FIG. 38 is a diagram for schematically explaining a change in the state of the coupling circuit according to the fifth embodiment in a second state, in which the detection electrodes are sequentially switched.
Figure 39:
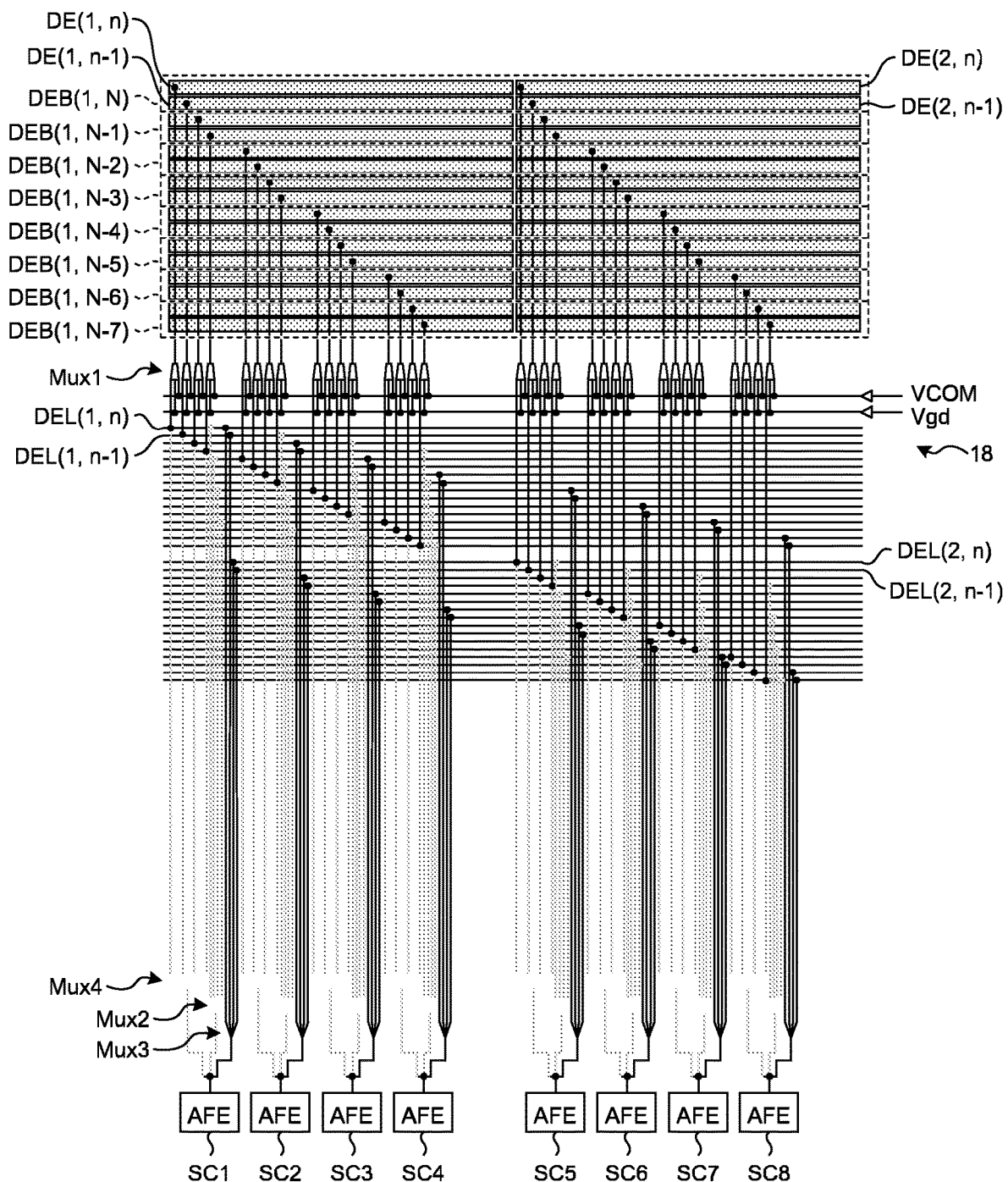
FIG. 39 is a diagram for schematically explaining a change in the coupling circuit according to the fifth embodiment in 2×2 collective hover detection.
Figure 40:
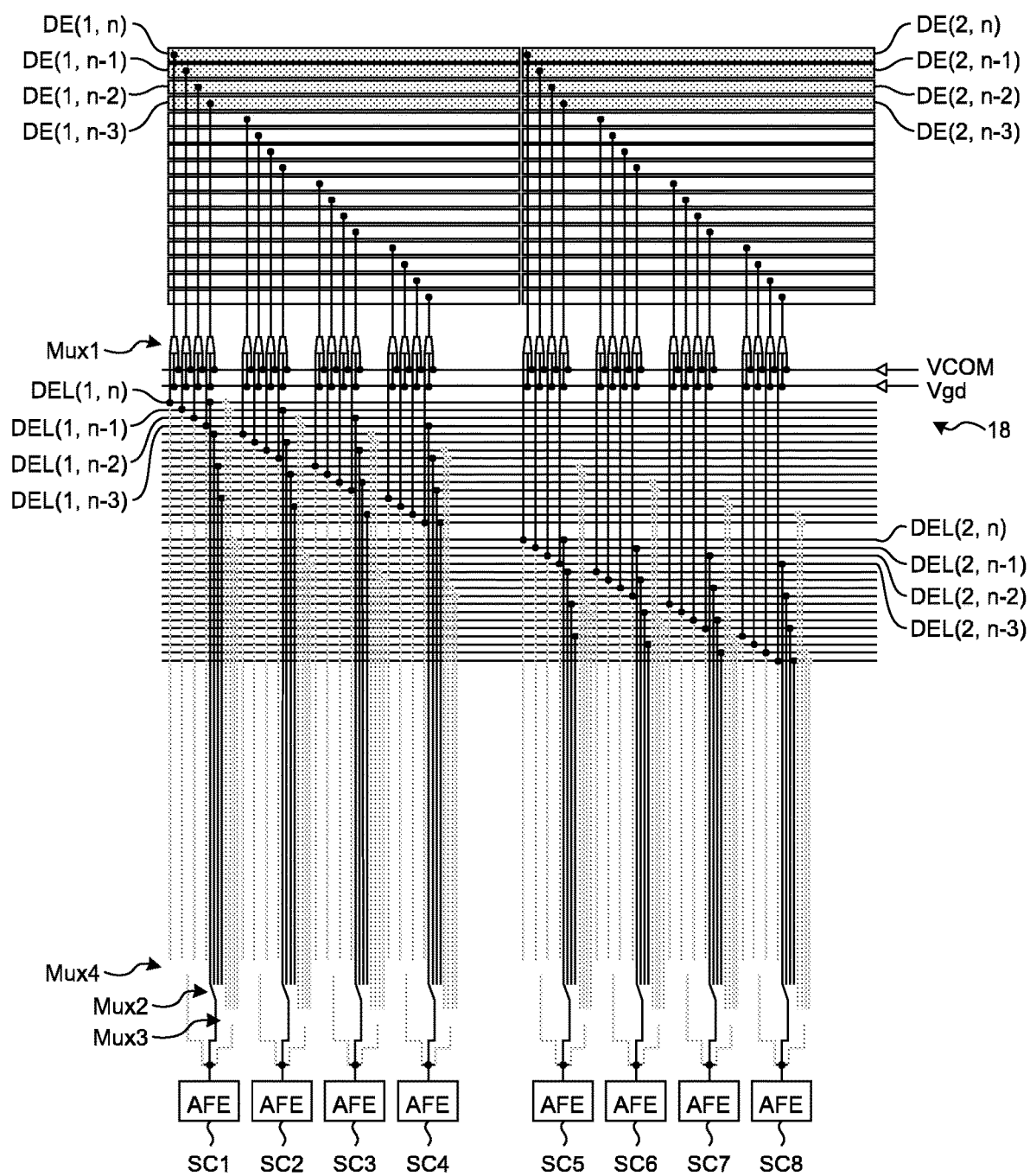
FIG. 40 is a diagram for schematically explaining a change in the state of the coupling circuit according to the fifth embodiment in the first state, in which the detection electrodes are sequentially switched.

FIG. 36 is a diagram for schematically explaining changes in the state of the detection electrodes coupled to the analog front ends according to a fifth embodiment of the present disclosure. FIG. 37 is a diagram for explaining the coupling circuit according to the fifth embodiment. FIG. 38 is a diagram for schematically explaining a change in the state of the coupling circuit according to the fifth embodiment in a second state, in which the detection electrodes are sequentially switched. FIG. 39 is a diagram for schematically explaining a change in the coupling circuit according to the fifth embodiment in 2×2 collective hover detection. FIG. 40 is a diagram for schematically explaining a change in the state of the coupling circuit according to the fifth embodiment in the first state, in which the detection electrodes are sequentially switched. Components described in the first to the fourth embodiments are denoted by like reference numerals, and explanation thereof is omitted.

As illustrated in FIG. 36, the coupling circuit 18 illustrated in FIG. 37 switches between the step for touch detection (Step ST31) and the step for hover detection (Step ST32). Similarly to the fourth embodiment, the coupling circuit 18 switches between the step for hover detection (Step ST32) and the step for touch detection (Step ST33 or Step ST34).

The coupling circuit 18 illustrated in FIG. 37 includes switches Mux1, Mux2, Mux3, and Mux4. The relay wire DEL couples the switch Mux1 and the switch Mux2 to each other, couples the switch Mux1 and the switch Mux3 to each other, and couples the switch Mux1 and the switch Mux3 to each other. Opening and closing of the switches Mux1, Mux2, Mux3, and Mux4 allow any one of the supply wiring for the drive signals Vcomdc for display, the supply wiring for the guard signals Vgd, and the analog front end SC to be coupled to one detection electrode DE in a time-division manner.

At Step ST31 illustrated in FIG. 36, as illustrated in FIG. 38, the switches Mux2 and Mux3 decouple the relay wires DEL from the analog front ends SC. The switch Mux1 electrically couples the detection electrodes DE(1, n), DE(1, n−4), DE(1, n−8), and DE(1, n−12) to the relay wires DEL(1, n), DEL(1, n−4), DEL(1, n−8), and DEL(1, n−12), respectively. The switch Mux1 couples the other detection electrodes DE to the supply wiring for the guard signals Vgd.

The switch Mux4 electrically couples the analog front end SC1 to the relay wire DEL(1, n). Similarly, the analog front end SC2 is electrically coupled to the relay wire DEL(1, n−4). The analog front end SC3 is electrically coupled to the relay wire DEL(1, n−8). The analog front end SC4 is electrically coupled to the relay wire DEL(1, n−12). The analog front end SC5 is electrically coupled to the relay wire DEL(2, n). The analog front end SC6 is electrically coupled to the relay wire DEL(2, n−4). The analog front end SC7 is electrically coupled to the relay wire DEL(2, n−8). The analog front end SC8 is electrically coupled to the relay wire DEL(2, n−12). As a result, as illustrated in FIG. 26A, the coupling circuit 18 selects the detection electrodes DE in the fourth, the eighth, the twelfth, and the sixteenth rows. The coupling circuit 18 couples the detection electrodes DE in the fourth, the eighth, the twelfth, and the sixteenth rows to the analog front ends SC denoted by the reference numerals written in the respective detection electrodes DE in FIG. 26A.

The switch Mux4 sequentially switches the relay wire DEL to be electrically coupled to the corresponding analog front end SC, whereby the coupling circuit 18 selects the detection electrodes DE in the third, the seventh, the eleventh, and the fifteenth rows as illustrated in FIG. 26B. The coupling circuit 18 couples the detection electrodes DE in the third, the seventh, the eleventh, and the fifteenth rows to the analog front ends SC denoted by the reference numerals written in the respective detection electrodes DE in FIG. 26B.

Subsequently, the switch Mux4 sequentially switches the relay wire DEL to be electrically coupled to the corresponding analog front end SC, whereby the coupling circuit 18 selects the detection electrodes DE in the second, the sixth, the tenth, and the fourteenth rows as illustrated in FIG. 26C. The coupling circuit 18 couples the detection electrodes DE in the second, the sixth, the tenth, and the fourteenth rows to the analog front ends SC denoted by the reference numerals written in the respective detection electrodes DE in FIG. 26C.

Subsequently, the switch Mux4 sequentially switches the relay wire DEL to be electrically coupled to the corresponding analog front end SC, whereby the coupling circuit 18 selects the detection electrodes DE in the first, the fifth, the ninth, and the thirteenth rows as illustrated in FIG. 26D. The coupling circuit 18 couples the detection electrodes DE in the first, the fifth, the ninth, and the thirteenth rows to the analog front ends SC denoted by the reference numerals written in the respective detection electrodes DE in FIG. 26D.

As illustrated in FIGS. 36, 26A, 26B, 26C, and 26D, at Step ST31, the detection device according to the fifth embodiment can sequentially perform touch detection on the whole surface even if the number of the detection electrodes DE is larger than the number of the analog front ends SC.

At Step ST32 illustrated in FIG. 36, the switches Mux2 and Mux4 decouple the relay wires DEL from the analog front ends SC. As illustrated in FIG. 39, the switch Mux3 and the relay wires DEL electrically couple the detection electrodes DE disposed side by side in the first direction Dx and the second direction Dy to one another. The switch Mux3 and the relay wires DEL thus combine 2×2 detection electrodes DE, thereby forming the detection electrode blocks DEB(1, N) to DEB(1, N–7). The detection electrode blocks DEB(1, N) to DEB(1, N–7) are coupled to the analog front ends SC1 to SC7, respectively. The control circuit 11 illustrated in FIG. 1 then performs hover detection (Step ST32).

If the detection signals Vdet supplied from the respective detection electrode blocks DEB illustrated in FIG. 39 are equal to or higher than the predetermined threshold ΔVthb, the detection circuit 40 performs the processing at Step ST33.

At Step ST33, the fifth embodiment performs touch detection on the detection electrode block DEB determined to have a signal intensity equal to or higher than the predetermined threshold ΔVthb and on the detection electrodes DE around the detection electrode block DEB.

At Step ST33, for example, the detection electrode block DEB(1, N) is determined to have a signal intensity equal to or higher than the predetermined threshold ΔVthb. In this case, as illustrated in FIG. 40, the control circuit 11 performs touch detection on the detection electrodes DE(1, n), DE(1, n–1), DE(2, n), and DE(2, n–1) corresponding to the detection electrode block DEB(1, N) (Step ST33).

The switches Mux3 and Mux4 decouple the relay wires DEL from the analog front ends SC. The switch Mux2 couples the analog front end SC1 to the relay wire DEL(1, n) and couples the analog front end SC5 to the relay wire DEL(2, n). The switch Mux2 then couples the analog front end SC1 to the relay wire DEL(1, n–1) and couples the analog front end SC5 to the relay wire DEL(2, n–1). The switch Mux2 then couples the analog front end SC1 to the relay wire DEL(1, n–2) and couples the analog front end SC5 to the relay wire DEL(2, n–2). The switch Mux2 then couples the analog front end SC1 to the relay wire DEL(1, n–3) and couples the analog front end SC5 to the relay wire DEL(2, n–3). With this processing, the detection electrodes DE disposed side by side in the first direction Dx are simultaneously selected and coupled to the analog front ends SC. With the operations of the switch Mux2, the detection electrodes DE coupled to the analog front ends SC are sequentially switched in the second direction Dy.

After the processing at Step ST33 illustrated in FIG. 32, the control circuit 11 performs touch detection on another detection electrode block DEB determined to have a signal intensity equal to or higher than the predetermined threshold ΔVthb at Step S32 and on the detection electrodes DE around the detection electrode block DEB (Step ST34). Detailed explanation of the processing at Step ST34 is omitted because it is the same as the processing at Step ST33 except that the positions of the detection electrodes DE coupled to the analog front ends SC in the second direction Dy are different.

Sixth Embodiment

Figure 41:
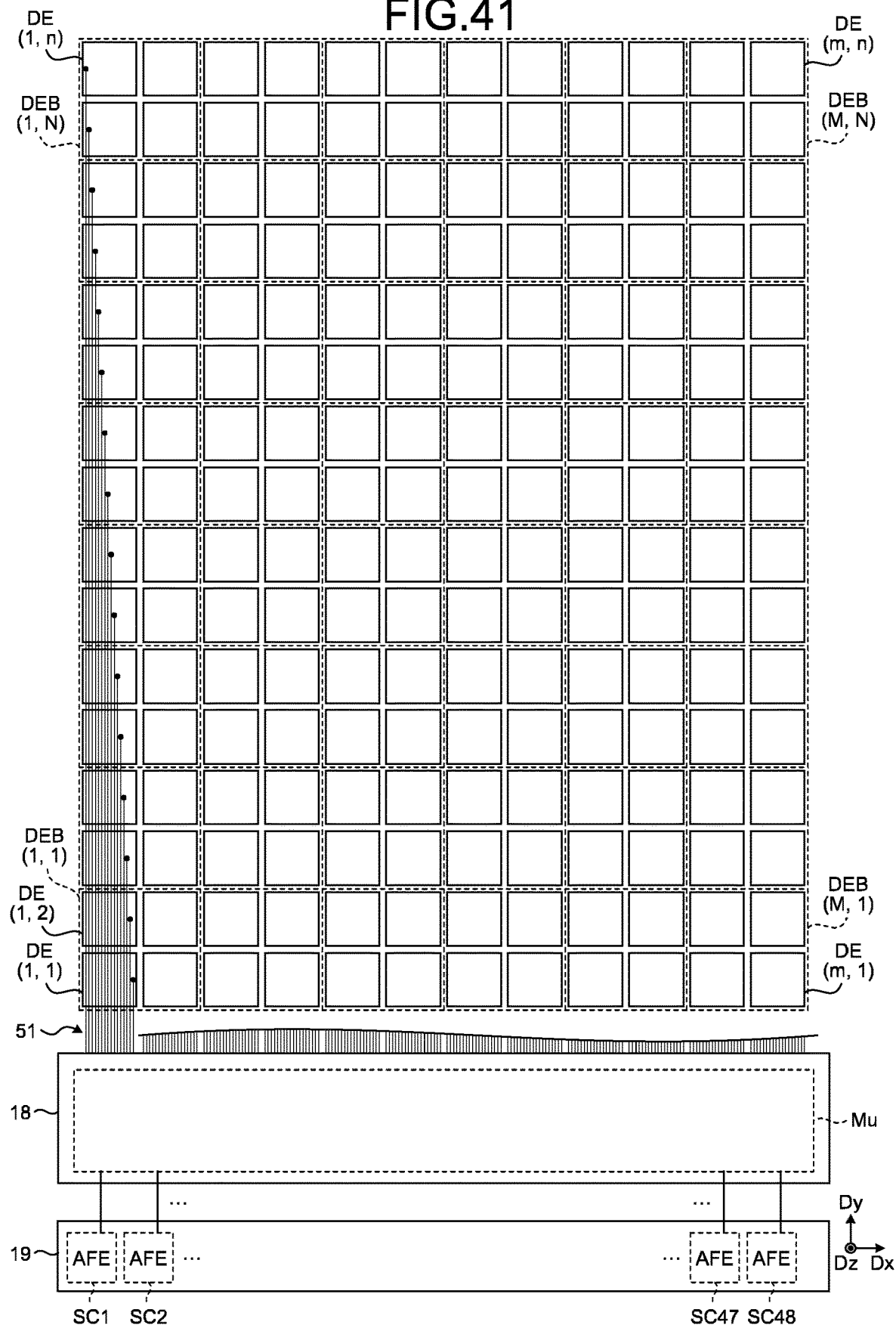
FIG. 41 is a plan view schematically illustrating a relation between the detection electrodes and the coupling circuit according to a sixth embodiment of the present disclosure.

FIG. 41 is a plan view schematically illustrating a relation between the detection electrodes and the coupling circuit according to a sixth embodiment of the present disclosure. Components described in the first embodiment are denoted by like reference numerals, and explanation thereof is omitted.

The coupling circuit 18 according to the sixth embodiment includes the multiplexer Mu but does not include the analog front ends SC. The analog front ends SC are included in the integrated circuit 19, and are provided separately from the multiplexer Mu. This configuration reduces the number of circuits, such as TFTs, included in the coupling circuit 18 on the first substrate 21, thereby reducing the area of the coupling circuit 18. As a result, the peripheral region 10b can be effectively used as a space for other elements or downsized to serve as a smaller frame.

While exemplary embodiments have been described, the embodiments are not intended to limit the present disclosure. The contents disclosed in the embodiments are given by way of example only, and various changes may be made without departing from the spirit of the present disclosure. Appropriate changes made without departing from the spirit of the present disclosure naturally fall within the scope of the disclosure.

The shape, the position, and the number of the detection electrodes DE and the pixel electrodes 22, for example, are given by way of example only and may be appropriately modified.

The display device according to the present aspect may have the following aspects, for example.
(1) A detection device comprising:
  a substrate;
  a plurality of detection electrodes arrayed in a row-column configuration in a first direction and a second direction intersecting the first direction in a sensor region of the substrate;
  a drive circuit configured to supply a plurality of drive signals to the detection electrodes;
  a plurality of wires electrically coupled to the respective detection electrodes;
  a plurality of analog front ends each configured to receive, from at least one of the detection electrodes, at least one detection signal corresponding to a capacitance change in the at least one of the detection electrodes caused when the drive signals are supplied; and
  a multiplexer coupled to one of the detection electrodes via one of the wires and capable of changing the number of the wires simultaneously electrically coupled to one of the analog front ends, wherein
    the wires extend in the second direction, and
    the wires are disposed side by side in the first direction.

(2) The detection device according to (1), further comprising a control circuit configured to control the multiplexer, wherein, the control circuit changes the number of the detection electrodes simultaneously electrically coupled to one of the analog front ends depending on a distance between a target object and the detection electrodes in a third direction intersecting the first direction and the second direction.

(3) The detection device according to (1), wherein the multiplexer is disposed on the substrate provided with the detection electrodes, and is positioned outside the sensor region.

(4) The detection device according to (3), wherein the analog front ends are included in an integrated circuit and provided separately from the multiplexer.

(5) The detection device according to any one of (1) to (4), wherein the analog front ends are disposed on the substrate provided with the detection electrodes, and is positioned outside the sensor region.

(6) The detection device according to any one of (1) to (5), wherein the number of the detection electrodes is larger than the number of the analog front ends.

(7) The detection device according to any one of (1) to (6), wherein the detection electrodes electrically coupled to the respective wires capable of being simultaneously coupled to one of the analog front ends include at least two of the detection electrodes disposed side by side in the first direction or the second direction.

(8) The detection device according to any one of (1) to (7), wherein the multiplexer sequentially electrically couples the wires one by one to one of the analog front ends in a time-division manner.

(9) The detection device according to any one of (1) to (8), further comprising a control circuit configured to control the multiplexer in either one of a first detection mode and a second detection mode, the first mode being a mode in which the number of the wires simultaneously electrically coupled to one of the analog front ends is one, and the second detection mode being a mode in which the number of the wires simultaneously electrically coupled to one of the analog front ends is more than one.

(10) The detection device according to (9), wherein the control circuit, in accordance with a control signal, makes the number of the wires simultaneously electrically coupled to one of the analog front ends larger, as a distance between a target object and the detection electrodes becomes larger.

(11) The detection device according to (9), further comprising:

a detection circuit configured to process the at least one detection signal via the analog front ends, wherein the control circuit changes the number of the wires simultaneously electrically coupled to one of the analog front ends to decrease the number of the wires when the at least one detection signal detected by the detection circuit is larger than a first threshold.

(12) The detection device according to (11), wherein the control circuit changes the number of the wires simultaneously electrically coupled to one of the analog front ends to increase the number of the wires when the at least one detection signal detected by the detection circuit is smaller than a second threshold that is smaller than the first threshold.

(13) The detection device according to (9), wherein the control circuit, in the second detection mode, determines a first detection electrode on which the first detection mode is to be performed, and performs the first detection mode on the first detection electrode and a second detection electrode adjacent to the first detection electrode.

(14) The detection device according to any one of (9) to (13), wherein the detection electrodes disposed side by side in the first direction are coupled to the respective analog front ends in the first detection mode.

(15) A display device comprising:

the detection device according to any one of (1) to (14); and a display panel including a display region, wherein the detection electrodes are provided in a region overlapping the display region.

(16) The display device according to (15), wherein a display period and a detection period are alternately arranged in a time-division manner, and all the detection electrodes are supplied with a common potential in the display period.

What is claimed is:

1. A display device comprising:
a display panel including a display region; and
a detection device,
wherein
the detection device comprises:
a substrate;
a plurality of detection electrodes arrayed in a row-column configuration in a first direction and a second direction intersecting the first direction in a sensor region of the substrate, the detection electrodes being provided in a region overlapping the display region;
a drive circuit configured to supply a plurality of drive signals to the detection electrodes;
a plurality of wires electrically coupled to the respective detection electrodes, extending in the second direction, and disposed side by side in the first direction;
a plurality of analog front ends each configured to receive, from at least one of the detection electrodes, at least one detection signal corresponding to a capacitance change in the at least one of the detection electrodes caused when the drive signals are supplied;
a multiplexer coupled to one of the detection electrodes via one of the wires and capable of changing the number of the wires simultaneously electrically coupled to one of the analog front ends; and
a control circuit configured to control the multiplexer, and
the control circuit changes the number of the detection electrodes simultaneously electrically coupled to one of the analog front ends depending on a distance between a target object and the detection electrodes in a third direction intersecting the first direction and the second direction.

2. The display device according to claim 1, wherein
a display period and a detection period are alternately arranged in a time-division manner, and
all the detection electrodes are supplied with a common potential in the display period.

3. The display device according to claim 1, wherein the multiplexer is disposed on the substrate provided with the detection electrodes, and is positioned outside the sensor region.

4. The display device according to claim 3, wherein the analog front ends are included in an integrated circuit and provided separately from the multiplexer.

5. The display device according to claim 1, wherein the analog front ends are disposed on the substrate provided with the detection electrodes, and is positioned outside the sensor region.

6. The display device according to claim 1, wherein the number of the detection electrodes is larger than the number of the analog front ends.

7. The display device according to claim 1, wherein the detection electrodes electrically coupled to the respective wires capable of being simultaneously coupled to one of the analog front ends include at least two of the detection electrodes disposed side by side in the first direction or the second direction.

8. The display according to claim 1, wherein the multiplexer sequentially electrically couples the wires one by one to one of the analog front ends in a time-division manner.

9. A display device comprising:
a display panel including a display region; and
a detection device,
wherein
the detection device comprises:
  a substrate;
  a plurality of detection electrodes arrayed in a row-column configuration in a first direction and a second direction intersecting the first direction in a sensor region of the substrate, the detection electrodes being provided in a region overlapping the display region;
  a drive circuit configured to supply a plurality of drive signals to the detection electrodes;
  a plurality of wires electrically coupled to the respective detection electrodes, extending in the second direction, and disposed side by side in the first direction;
  a plurality of analog front ends each configured to receive, from at least one of the detection electrodes, at least one detection signal corresponding to a capacitance change in the at least one of the detection electrodes caused when the drive signals are supplied;
  a multiplexer coupled to one of the detection electrodes via one of the wires and capable of changing the number of the wires simultaneously electrically coupled to one of the analog front ends: and
  a control circuit configured to control the multiplexer in either one of a first detection mode and a second detection mode, the first mode being a mode in which the number of the wires simultaneously electrically coupled to one of the analog front ends is one, and the second detection mode being a mode in which the number of the wires simultaneously electrically coupled to one of the analog front ends is more than one.

10. The display device according to claim 9, wherein the control circuit, in accordance with a control signal, makes the number of the wires simultaneously electrically coupled to one of the analog front ends larger, as a distance between a target object and the detection electrodes becomes larger.

11. The display device according to claim 9, wherein
the detection device further comprises a detection circuit configured to process the at least one detection signal via the analog front ends, and
the control circuit changes the number of the wires simultaneously electrically coupled to one of the analog front ends to decrease the number of the wires when the at least one detection signal detected by the detection circuit is larger than a first threshold.

12. The display device according to claim 11, wherein
the control circuit changes the number of the wires simultaneously electrically coupled to one of the analog front ends to increase the number of the wires when the at least one detection signal detected by the detection circuit is smaller than a second threshold that is smaller than the first threshold.

13. The display device according to claim 9, wherein
the control circuit, in the second detection mode, determines a first detection electrode on which the first detection mode is to be performed, and performs the first detection mode on the first detection electrode and a second detection electrode adjacent to the first detection electrode.

14. The display device according to claim 9, wherein the detection electrodes disposed side by side in the first direction are coupled to the respective analog front ends in the first detection mode.

15. The display device according to claim 9, wherein
a display period and a detection period are alternately arranged in a time-division manner, and
all the detection electrodes are supplied with a common potential in the display period.

* * * * *